(12) United States Patent
Sim et al.

(10) Patent No.: US 8,895,393 B2
(45) Date of Patent: Nov. 25, 2014

(54) MEMORY DEVICES INCLUDING VERTICAL PILLARS AND METHODS OF MANUFACTURING AND OPERATING THE SAME

(71) Applicant: Samsung Electronics Co., Ltd., Suwon-si (KR)

(72) Inventors: Jae-Sung Sim, Yongin-si (KR); Jung-Dal Choi, Suwon (KR)

(73) Assignee: Samsung Electronics Co., Ltd., Samsung-ro, Yeongtong-gu, Suwon-si Gyeonggi-do (KR)

( * ) Notice: Subject to any disclaimer, the term of this patent is extended or adjusted under 35 U.S.C. 154(b) by 0 days.

(21) Appl. No.: 13/892,756

(22) Filed: May 13, 2013

(65) Prior Publication Data

US 2013/0242654 A1    Sep. 19, 2013

Related U.S. Application Data

(63) Continuation of application No. 12/471,975, filed on May 26, 2009, now Pat. No. 8,441,059.

(30) Foreign Application Priority Data

Jun. 11, 2008   (KR) .................. 10-2008-0054707

(51) Int. Cl.

| H01L 21/336 | (2006.01) |
|---|---|
| G11C 16/26 | (2006.01) |
| H01L 21/8234 | (2006.01) |
| G11C 16/04 | (2006.01) |
| H01L 27/115 | (2006.01) |
| G11C 16/14 | (2006.01) |
| H01L 29/788 | (2006.01) |

(52) U.S. Cl.
CPC ........ *H01L 21/823481* (2013.01); *G11C 16/26* (2013.01); *G11C 16/0408* (2013.01); *H01L 27/11551* (2013.01); *H01L 27/11526* (2013.01);

*G11C 16/14* (2013.01); *H01L 29/7881* (2013.01); *H01L 27/11556* (2013.01)
USPC ...................... 438/268; 438/593; 257/E21.21

(58) Field of Classification Search
CPC ............ H01L 21/8232; H01L 27/1052; H01L 21/8239
See application file for complete search history.

(56) References Cited

U.S. PATENT DOCUMENTS

| 5,473,563 A | 12/1995 | Suh et al. |
|---|---|---|
| 6,858,906 B2 | 2/2005 | Lee et al. |

(Continued)

FOREIGN PATENT DOCUMENTS

| CN | 101055875 | 10/2007 |
|---|---|---|
| JP | 10093083 | 4/1998 |

(Continued)

OTHER PUBLICATIONS

H. Tanaka et al., Bit Cost Scalable Technology with Punch and Plug Process for Ultra High Density Flash Memory, Symposium on VLSI Technology Digest of Technical Papers, pp. 14-15 (2007).

(Continued)

*Primary Examiner* — Cheung Lee
(74) *Attorney, Agent, or Firm* — Muir Patent Consulting, PLLC

(57) ABSTRACT

In a semiconductor device and a method of forming such a device, the semiconductor device comprises a substrate of semiconductor material extending in a horizontal direction. A plurality of interlayer dielectric layers is provided on the substrate. A plurality of gate patterns is provided, each gate pattern between a neighboring lower interlayer dielectric layer and a neighboring upper interlayer dielectric layer. A vertical channel of semiconductor material extends in a vertical direction through the plurality of interlayer dielectric layers and the plurality of gate patterns, a gate insulating layer between each gate pattern and the vertical channel that insulates the gate pattern from the vertical channel, the vertical channel being in contact with the substrate at a contact region that comprises a semiconducting region.

59 Claims, 56 Drawing Sheets

(56) References Cited

U.S. PATENT DOCUMENTS

| | | |
|---|---|---|
| 7,253,467 B2 | 8/2007 | Lee et al. |
| 7,539,056 B2 | 5/2009 | Katsumata et al. |
| 7,936,004 B2 | 5/2011 | Kito et al. |
| 2006/0044872 A1 | 3/2006 | Nazarian |
| 2006/0091556 A1 | 5/2006 | Shigeoka |
| 2006/0180851 A1 | 8/2006 | Lee et al. |
| 2007/0158736 A1 | 7/2007 | Arai et al. |
| 2007/0205445 A1 | 9/2007 | Park et al. |
| 2007/0252201 A1 | 11/2007 | Kito et al. |
| 2008/0179659 A1 | 7/2008 | Enda et al. |
| 2009/0310425 A1 | 12/2009 | Sim et al. |
| 2011/0284947 A1 | 11/2011 | Kito et al. |
| 2011/0287597 A1 | 11/2011 | Kito et al. |

FOREIGN PATENT DOCUMENTS

| | | |
|---|---|---|
| JP | 2006128390 | 5/2006 |
| JP | 2007180389 | 7/2007 |

OTHER PUBLICATIONS

Fukuzumi et al., Optimal Integration and Characteristics of Vertical Array Devices for Ultra-High Density, Bit-Cost Scalable Flash Memory, IEDM Technical Digest, pp. 449-452 (2007).

"Memory Devices Including Vertical Pillars and Methods of Manufacturing and Operating the Same" Specification, Drawings, Claims and Prosecution History, of U.S. Appl. No. 12/471,975, filed May 26, 2009, by Sim Jae-Sung, et al.

MEMORY DEVICES INCLUDING VERTICAL PILLARS AND METHODS OF MANUFACTURING AND OPERATING THE SAME

RELATED APPLICATIONS

This application is a continuation of U.S. application Ser. No. 12/471,975, filed on May 26, 2009, which claims priority under 35 U.S.C. 119 to Korean Patent Application No. 10-2008-0054707, filed on Jun. 11, 2008, the contents of which are incorporated herein by reference in their entirety.

BACKGROUND

With the continued emphasis on highly integrated electronic devices, there is an ongoing need for semiconductor memory devices that operate at higher speeds and lower power and that have increased device density. To accomplish this, devices with aggressive scaling and multiple-layered devices with transistor cells arranged in horizontal and vertical arrays have been under development.

In one approach, planar memory cells, for example NAND memory cells, are formed in a conventional horizontal array. Multiple horizontal arrays are then stacked in a vertical direction. Limitations associated with this approach include poor reliability in the resulting device, since critical lithography steps are required for each layer in achieving the minimum feature size. In addition, in this configuration, the size of the driver transistors for driving the control gates is a function of the number of layers; therefore, the driver transistors are scaled as a multiple of the number of layers. This can lead to integration issues and heat removal concerns.

In another approach, multiple-layered memory devices with vertically oriented channels have been under development. In one configuration, a plurality of gate layers are formed on a substrate, and a vertical channel penetrates the plurality of gate layers. In each vertical channel, a lower gate layer is configured to operate as a lower select gate, a plurality of middle gate layers are configured to operate as control gates, and an upper gate layer is configured to operate as an upper select gate. The control gates can include charge storage layers adjacent the vertical channel, so the devices can operate as non-volatile memory devices. Upper select gates neighboring each other in a first horizontal direction are connected to operate as row select lines for the device. Vertical channels neighboring each other are connected in a second horizontal direction to operate as bit lines for the device.

Others attempting the vertically oriented channel approach have met with limited success. In one configuration, a bottom portion of the vertical channel is connected to a common source diffusion layer that is formed in the substrate. The common source diffusion layer is doped to have an n+ doping, and the underlying substrate has a p type doping. Accordingly, a p-n junction is formed between the common source diffusion layer and the underlying substrate. The vertical channel is isolated by the n+ region in the substrate; Therefore, it is difficult to control the potential of the vertical channel through any electrode and it is necessary to apply a negative voltage level on the control gates to erase the memory cells. Such a negative voltage level can require a more complicated device power supply circuit, increasing device cost. Further, application of a negative voltage level is inconsistent with the power arrangement of conventional NAND memory devices, hindering straightforward replacement of conventional NAND devices by the vertically oriented channel memory devices. Furthermore, when an erase operation takes place, the erase operation requiring the injection of holes into the charge storage layers of the control gates adjacent the vertical channel, any holes in the vertical channel are depleted by the injection into the charge storage layers. With the depletion of holes, the potential of the vertical channel is reduced, which makes the erase operation less effective in time.

In order to prevent hole depletion in the vertical channels, hole injection by a gate-induced-drain-leakage (GIDL) operation has been proposed, in order to maintain the potential of the vertical channels at a suitable level. However, vertical channel potential control through GIDL effect is not straightforward or can be unstable compared with direct body biasing, because it can be affected easily by the junction profiles, which can result in the erased Vth distribution degradation. In addition, the GIDL effect is likely to incorporate hot hole injection into the lower select transistor or edge cell in the vertical channel strings, which can deteriorate endurance reliability characteristics of the resulting device.

SUMMARY

Embodiments of the present invention are directed to vertical-type semiconductor memory devices and methods of forming the same. In particular, in certain embodiments, a bottom portion of a semiconductor vertical channel is directly connected to the underlying substrate at a contact region that comprises a semiconducting material. In certain embodiments, an inversion layer is formed in the contact region to cause the contact region to be conductive by applying a suitable voltage to a lower-most gate of the vertical channel. The inversion layer in turn operates as a common source line for the resulting device. In the absence of a diffusion region between the vertical channel and the substrate, a positive erase voltage can be used in the resulting device to perform an erase operation, eliminating the need for additional power circuitry for generating negative voltages. Also, since positive erase voltages can be used for an erase operation, the resulting devices are consistent with conventional horizontally configured NAND memory devices; allowing for more straightforward replacement of such conventional devices by the devices of the present invention.

In one aspect, a semiconductor device comprises: a substrate of semiconductor material extending in a horizontal direction; a plurality of interlayer dielectric layers on the substrate; a plurality of gate patterns, each gate pattern between a neighboring lower interlayer dielectric layer and a neighboring upper interlayer dielectric layer; and a vertical channel of semiconductor material extending in a vertical direction through the plurality of interlayer dielectric layers and the plurality of gate patterns, a gate insulating layer between each gate pattern and the vertical channel that insulates the gate pattern from the vertical channel, the vertical channel being in contact with the substrate at a contact region that comprises a semiconducting region.

In one embodiment, the contact region comprises an upper surface of the substrate and a lower portion of the vertical channel, and wherein the upper surface of the substrate and at least sidewalls of the lower portion of the vertical channel comprise a semiconducting region.

In another embodiment, the contact region is conductive upon the application of a voltage that creates an inversion region in the contact region.

In another embodiment, the semiconductor device comprises a semiconductor memory device and wherein: an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate comprise control gates of memory cell transistors of a common string of the semiconductor device; and further comprises: a lower-most interlayer dielectric layer of the plurality of interlayer dielectric layers between the lower select gate and the substrate, the lower-most interlayer dielectric layer being of a first thickness and wherein the interlayer dielectric layers between the control gates are of a second thickness, wherein the first thickness is less than the second thickness; and wherein the first thickness is selected so that a voltage applied to the lower select gate creates an inversion layer in the contact region that causes the contact region to conduct.

In another embodiment, the semiconductor material of the vertical channel is selected from the group consisting of a single-crystal semiconductor material and a polycrystalline semiconductor material.

In another embodiment, the semiconductor material of the substrate is selected from the group consisting of a single-crystal semiconductor material and a polycrystalline semiconductor material.

In another embodiment, the gate insulating layer includes a charge storage layer and wherein the semiconductor device comprises a non-volatile memory device.

In another embodiment: an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate comprise control gates of memory cell transistors of a common string of the semiconductor device; control gates of memory cell transistors sharing a same layer of the device arranged in a horizontal direction of the semiconductor device are connected to provide word lines of the semiconductor device; memory cell transistors of a common string of the semiconductor device are coupled together in series by the vertical channel; upper-most gate patterns sharing a same layer of the device arranged in a first horizontal direction of the semiconductor device are connected to provide upper select gates of upper select transistors; upper portions of vertical channels arranged in a second horizontal direction of the semiconductor device are connected to provide bit lines of the semiconductor device; and the semiconductor device comprises a semiconductor memory device.

In another aspect, a memory system comprises: a memory controller that generates command and address signals; and a memory module comprising a plurality of memory devices, the memory module receiving the command and address signals and in response storing and retrieving data to and from at least one of the memory devices. Each memory device comprises: a substrate of semiconductor material extending in a horizontal direction; a plurality of interlayer dielectric layers on the substrate; a plurality of gate patterns, each gate pattern between a neighboring lower interlayer dielectric layer and a neighboring upper interlayer dielectric layer; and a vertical channel of semiconductor material extending in a vertical direction through the plurality of interlayer dielectric layers and the plurality of gate patterns, a gate insulating layer between each gate pattern and the vertical channel that insulates the gate pattern from the vertical channel, the vertical channel being in contact with the substrate at a contact region that comprises a semiconducting region.

In one embodiment, the contact region comprises an upper surface of the substrate and a lower portion of the vertical channel, and wherein the upper surface of the substrate and at least sidewalls of the lower portion of the vertical channel comprise a semiconducting region.

In another embodiment, the contact region is conductive upon the application of a voltage that creates an inversion region in the contact region.

In another embodiment: an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate comprise control gates of memory cell transistors of a common string of the semiconductor device; and the system further comprises: a gate insulating layer between the lower select gate and the substrate, the gate insulating layer being of a first thickness and wherein the interlayer dielectric layers between the control gates are of a second thickness, wherein the first thickness is less than the second thickness; and wherein the first thickness is selected so that a voltage applied to the lower select gate creates an inversion layer in the contact region that causes the contact region to conduct.

In another embodiment, the gate insulating layer includes a charge storage layer and wherein the memory device comprises a non-volatile memory device.

In another embodiment: an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate comprise control gates of memory cell transistors of a common string of the semiconductor device; control gates of memory cell transistors sharing a same layer of the device arranged in a horizontal direction of the semiconductor device are connected to provide word lines of the semiconductor device; memory cell transistors of a common string of the semiconductor device are coupled together in series by the vertical channel; upper-most gate patterns sharing a same layer of the device arranged in a first horizontal direction of the semiconductor device are connected to provide upper select gates of upper select transistors; and upper portions of vertical channels arranged in a second horizontal direction of the semiconductor device are connected to provide bit lines of the semiconductor device.

In another aspect, a method of fabricating a semiconductor device comprises: providing a substrate of semiconductor material extending in a horizontal direction; providing a plurality of interlayer dielectric layers on the substrate; providing a plurality of gate patterns, each gate pattern between a neighboring lower interlayer dielectric layer and a neighboring upper interlayer dielectric layer; providing a vertical channel of semiconductor material extending in a vertical direction through the plurality of interlayer dielectric layers and the plurality of gate patterns; and providing a gate insulating layer between each gate pattern and the vertical channel that insulates the gate pattern from the vertical channel, wherein the vertical channel is in contact with the substrate at a contact region that comprises a semiconducting region.

In one embodiment, the contact region comprises an upper surface of the substrate and a lower portion of the vertical channel, and wherein the upper surface of the substrate and at least sidewalls of the lower portion of the vertical channel comprise a semiconducting region.

In another embodiment, the contact region is conductive upon the application of a voltage that creates an inversion region in the contact region.

In another embodiment, the semiconductor device comprises a semiconductor memory device and wherein: an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate comprise control gates of memory cell transistors of a common string of the semiconductor device; and the method further comprises: providing a lower-most interlayer dielectric layer of the plurality of interlayer dielectric layers between the lower select gate and the substrate, the lower-most interlayer dielectric layer being of a first thickness and wherein the interlayer dielectric layers between the control gates are of a second thickness, wherein the first thickness is less than the second thickness; and wherein the first thickness is selected so that a voltage applied to the lower select gate creates an inversion layer in the contact region that causes the contact region to conduct.

In another embodiment, the gate insulating layer includes a charge storage layer and wherein the semiconductor device comprises a non-volatile memory device.

In another aspect, a method of performing an erase operation on a semiconductor memory device is provided, the semiconductor memory device comprising: a substrate of semiconductor material extending in a horizontal direction; a plurality of interlayer dielectric layers on the substrate; a plurality of gate patterns, each gate pattern between a neighboring lower interlayer dielectric layer and a neighboring upper interlayer dielectric layer; and a vertical channel of semiconductor material extending in a vertical direction through the plurality of interlayer dielectric layers and the plurality of gate patterns, a gate insulating layer between each gate pattern and the vertical channel that insulates the gate pattern from the vertical channel, the vertical channel being in contact with the substrate at a contact region that comprises a semiconductor material, wherein: an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate comprise control gates of memory cell transistors of a common string of the semiconductor device; control gates of memory cell transistors sharing a same layer of the device arranged in a horizontal direction of the semiconductor device are connected to provide word lines of the semiconductor device; memory cell transistors of a common string of the semiconductor device are coupled together in series by the vertical channel; upper-most gate patterns sharing a same layer of the device arranged in a first horizontal direction of the semiconductor device are connected to provide upper select gates of upper select transistors; and upper portions of vertical channels arranged in a second horizontal direction of the semiconductor device are connected to provide bit lines of the semiconductor device. The erase operation comprises: placing the lower select gate and the upper select gate of the common string in a floating state; applying a ground or positive voltage to the word lines; and applying a positive erase voltage to the semiconductor substrate.

In one embodiment, the contact region comprises an upper surface of the substrate and a lower portion of the vertical channel, and wherein the upper surface of the substrate and at least sidewalls of the lower portion of the vertical channel comprise a semiconducting region.

In another embodiment, the contact region is conductive upon the application of a voltage that creates an inversion region in the contact region.

In another embodiment, the method further comprises: providing a lower-most interlayer dielectric layer of the plurality of interlayer dielectric layers between the lower select gate and the substrate, the lower-most interlayer dielectric layer being of a first thickness and wherein the interlayer dielectric layers between the control gates are of a second thickness, wherein the first thickness is less than the second thickness; and wherein the first thickness is selected so that a voltage applied to the lower select gate creates an inversion layer in the contact region that causes the contact region to conduct.

In another aspect, a method of performing a read operation on a semiconductor memory device is provided, the semiconductor memory device comprising: a substrate of semiconductor material extending in a horizontal direction; a plurality of interlayer dielectric layers on the substrate; a plurality of gate patterns, each gate pattern between a neighboring lower interlayer dielectric layer and a neighboring upper interlayer dielectric layer; a vertical channel of semiconductor material extending in a vertical direction through the plurality of interlayer dielectric layers and the plurality of gate patterns, a gate insulating layer between each gate pattern and the vertical channel that insulates the gate pattern from the vertical channel, the vertical channel being in contact with the substrate at a contact region that comprises a semiconducting region; wherein: an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate comprise control gates of memory cell transistors of a common string of the semiconductor device; control gates of memory cell transistors sharing a same layer of the device arranged in a horizontal direction of the semiconductor device are connected to provide word lines of the semiconductor device; memory cell transistors of a common string of the semiconductor device are coupled together in series by the vertical channel; upper-most gate patterns sharing a same layer of the device arranged in a first horizontal direction of the semiconductor device are connected to provide upper select gates of upper select transistors; and upper portions of vertical channels arranged in a second horizontal direction of the semiconductor device are connected to provide bit lines of the semiconductor device. The read operation comprises: applying a ground voltage to the semiconductor substrate; applying a read voltage to control gates of unselected memory cell transistors of the common string; applying a read voltage to gates of selected upper select transistors of the common string; applying a criterion voltage to control gates of selected memory cell transistors of the common string; and applying a read voltage to the lower select gate of the lower select transistor of the common string and of neighboring strings to thereby create an conductive inversion layer at an upper region of the semiconductor substrate and at a lower region of at least sidewalls of the vertical channel in the contact region, the inversion layer operating as a conductive common source line for the semiconductor memory device during the read operation.

In one embodiment, the contact region comprises the upper region of the substrate and a lower portion of the vertical channel, and wherein the upper surface of the substrate and at least sidewalls of the lower portion of the vertical channel comprise a semiconducting region.

In another embodiment, the method further comprises: providing a lower-most interlayer dielectric layer of the plurality of interlayer dielectric layers between the lower select gate and the substrate, the lower-most interlayer dielectric layer being of a first thickness and wherein the interlayer dielectric layers between the control gates are of a second thickness, wherein the first thickness is less than the second thickness; and wherein the first thickness is selected so that a voltage applied to the lower select gate creates an inversion layer in the contact region that causes the contact region to conduct.

BRIEF DESCRIPTION OF THE DRAWINGS

The foregoing and other objects, features and advantages of the embodiments of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF EMBODIMENTS

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1:
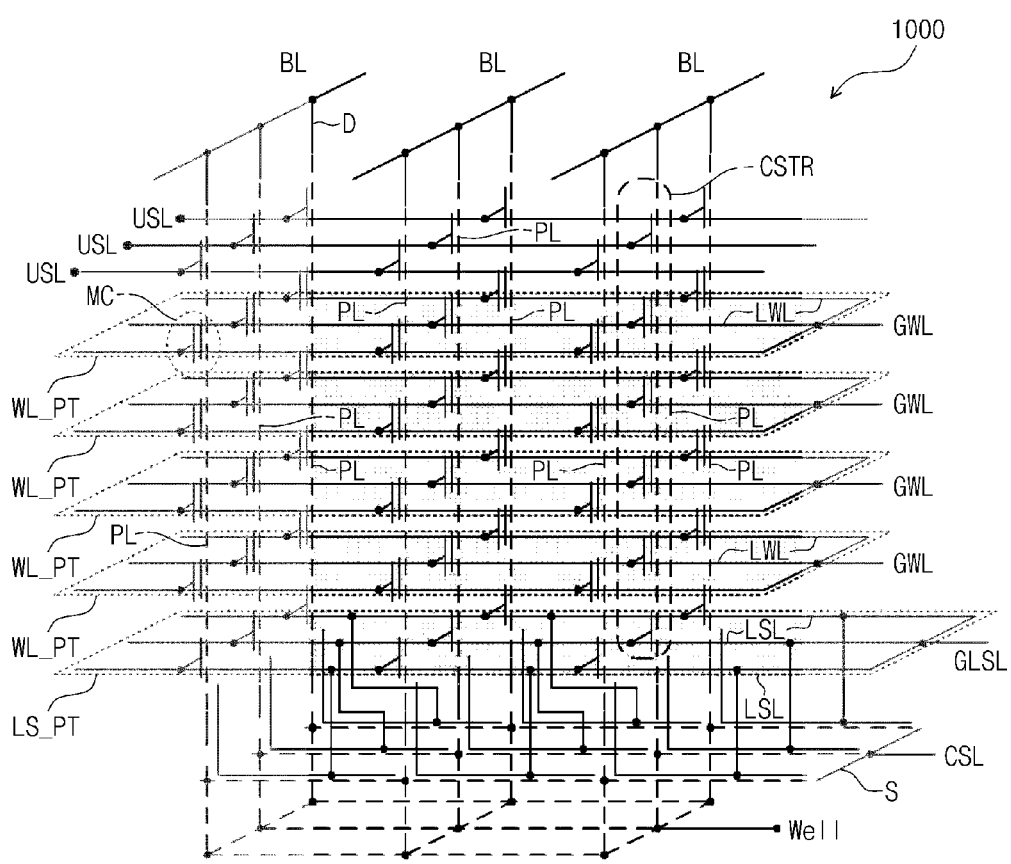
FIG. 1 is a perspective schematic view of a vertical-channel memory device, in accordance with an embodiment of the present invention.

FIG. 1 is a perspective schematic view of a vertical-channel memory device, in accordance with an embodiment of the present invention.

Referring to FIG. 1, in this example, a three-dimensional memory device 1000 includes a plurality of vertical channels, or pillars, represented by dashed lines PL. The pillars PL extend in a vertical direction, and transistors formed along a common pillar PL combine to form a cell string CSTR. An upper-most transistor of a cell string CSTR is referred to as an upper select transistor and a lower-most select transistor of a cell string is referred to as a lower select transistor. Transistors between the upper select transistor and the lower select transistor of a cell string CSTR comprise memory cell MC transistors of the cell string CSTR.

The tops of the pillars PL arranged in a first horizontal direction are connected to each other along bit lines BL. The bottoms of the pillars PL are connected to each other along a common source line CSL. The bottoms of the pillars are also directly connected to the substrate well Well.

Gates of the upper select transistors arranged along a second horizontal direction are connected to each other along upper select lines USL. Gates of the lower select transistors are connected to each other along a lower select plate LS_PT to provide a lower global select line GLSL. Gates of the memory cell transistors MC sharing a common vertical row are connected to each other along word line plates WL_PT to provide global word lines GWL. Global word lines GWL of different rows are independent.

Figure 2:
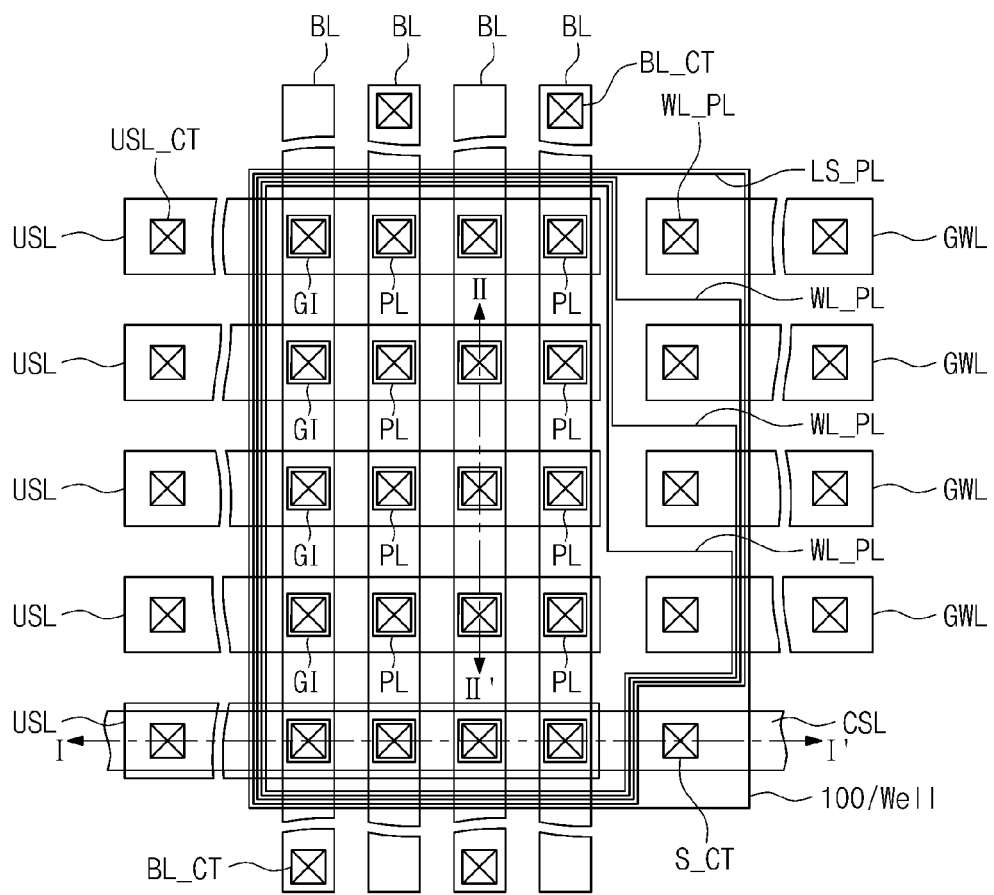
FIG. 2 is top layout view of a vertical-channel memory device, in accordance with an embodiment of the present invention.

FIG. 2 is top layout view of a vertical-channel memory device, in accordance with an embodiment of the present invention. In this view, it can be seen that gate insulator films GI can be provided to surround the vertical pillars PL along their vertical length, to insulate the vertical pillars PL from the upper select lines USL, the word line plates WL_PT and the lower select plate LS_PT. It can also be seen in this view that the bit lines BL are accessed via bit line contacts BL_CT, the word line plates WL_PT are accessed via word line contacts WL_CT, the upper select lines USL are accessed via upper select line contacts USL_CT, and the common source line CSL which is also coupled to the well 100/Well at source region S, is accessed via a source contact S_CT.

Figure 3:
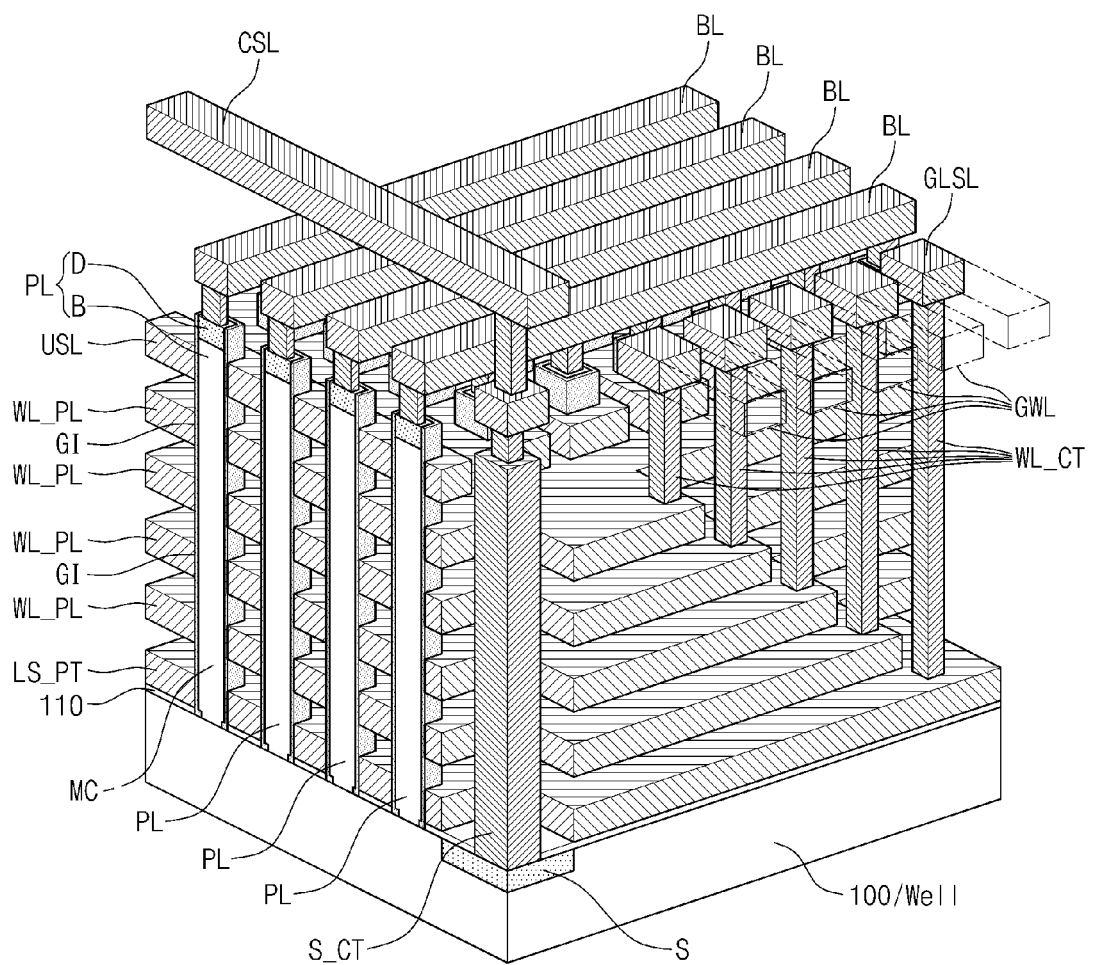
FIG. 3 is a cross-sectional perspective view of a vertical channel memory device, in accordance with an embodiment of the present invention.

FIG. 3 is a cross-sectional perspective view of a vertical channel memory device, in accordance with an embodiment of the present invention. Referring to FIG. 3, in this embodiment, a substrate 100 of semiconductor material is provided. In various embodiments, the substrate 100 can comprise polycrystalline or single-crystal semiconductor material, in a bulk or SOI configuration. The substrate 100 extends in a horizontal direction. A lower gate insulator layer 110 is on the substrate 100. A plurality of interlayer dielectric layers 210 (see FIG. 4) are provided on the lower gate insulator layer 110. The word line plates WL_PT and the upper select lines USL are provided, each being between a neighboring lower interlayer dielectric layer 211, 212, 213, 214, 215, . . . and a neighboring upper interlayer dielectric layer 211, 212, 213, 214, 215, . . . . The lower select plate LS_PT is provided between the lower-most interlayer dielectric layer 211 and the lower gate insulator 110.

Vertical pillars PL of semiconductor material extend in a vertical direction through the plurality of interlayer dielectric layers 210 and the lower select plate LS_PT, the word line plates WL_PT, and the upper select lines USL, so that the vertical pillars PL are at least partially surrounded in a horizontal direction by the lower select plate LS_PT, the word line plates WL_PT, and the upper select lines USL. For example, the word line plates WL_PT each surround, or encompass, the perimeter of the walls of the vertical pillars PL. The same holds true for the lower select plates LS_PT and the upper select lines USL. The gate insulator films GI are is provided between each of the lower select plate LS_PT, the word line plates WL_PT, and the upper select lines USL and the vertical pillars PL. It can also be seen in this view that each vertical pillar PL comprises a body region B along most of its length and a drain region D at a top portion thereof, in contact with the corresponding bit line BL.

Figure 4:
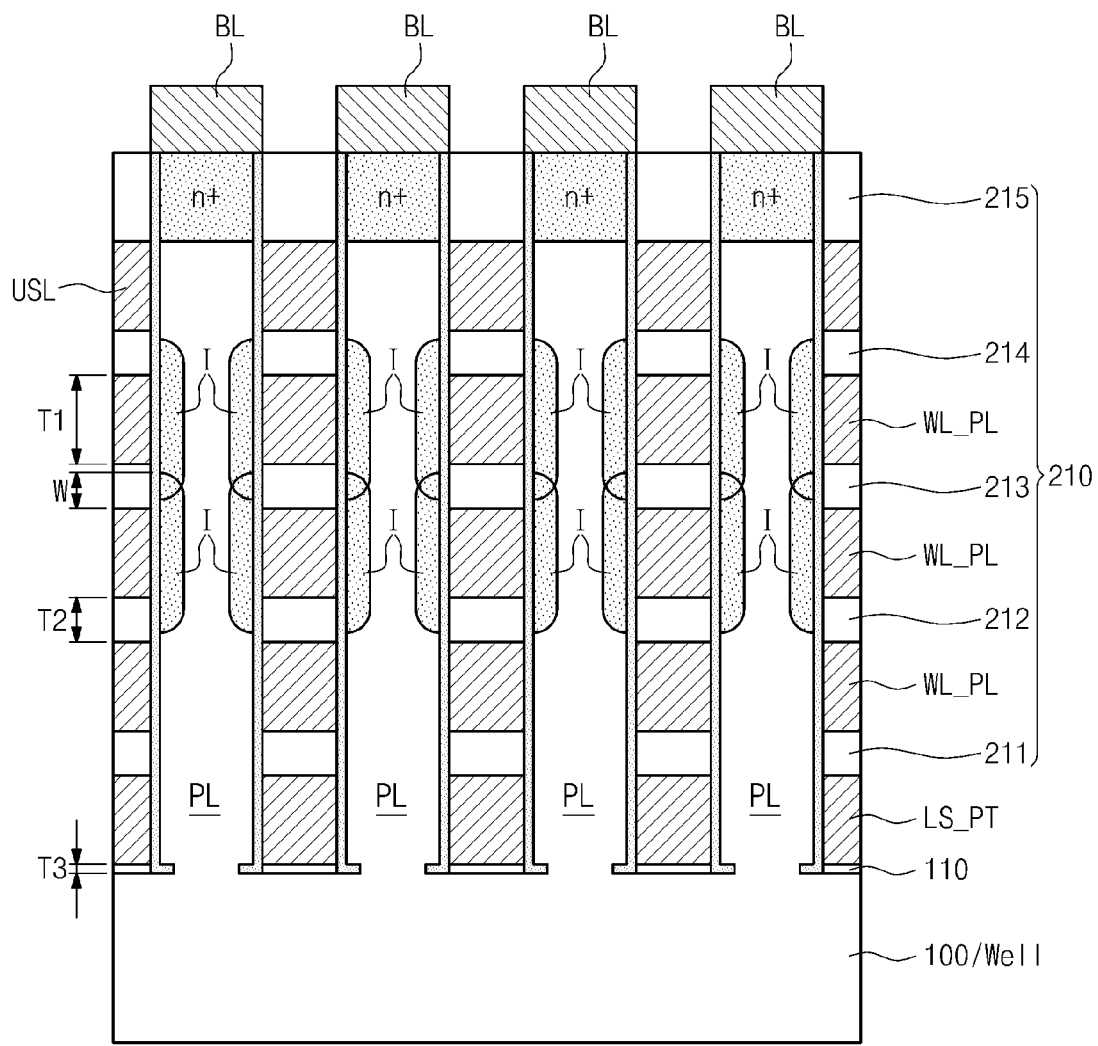
FIGS. 4 and 5 are cross-sectional views of the vertical channel memory device of FIG. 3, taken along section line I-I' of FIG. 2, in accordance with an embodiment of the present invention.
Figure 5:
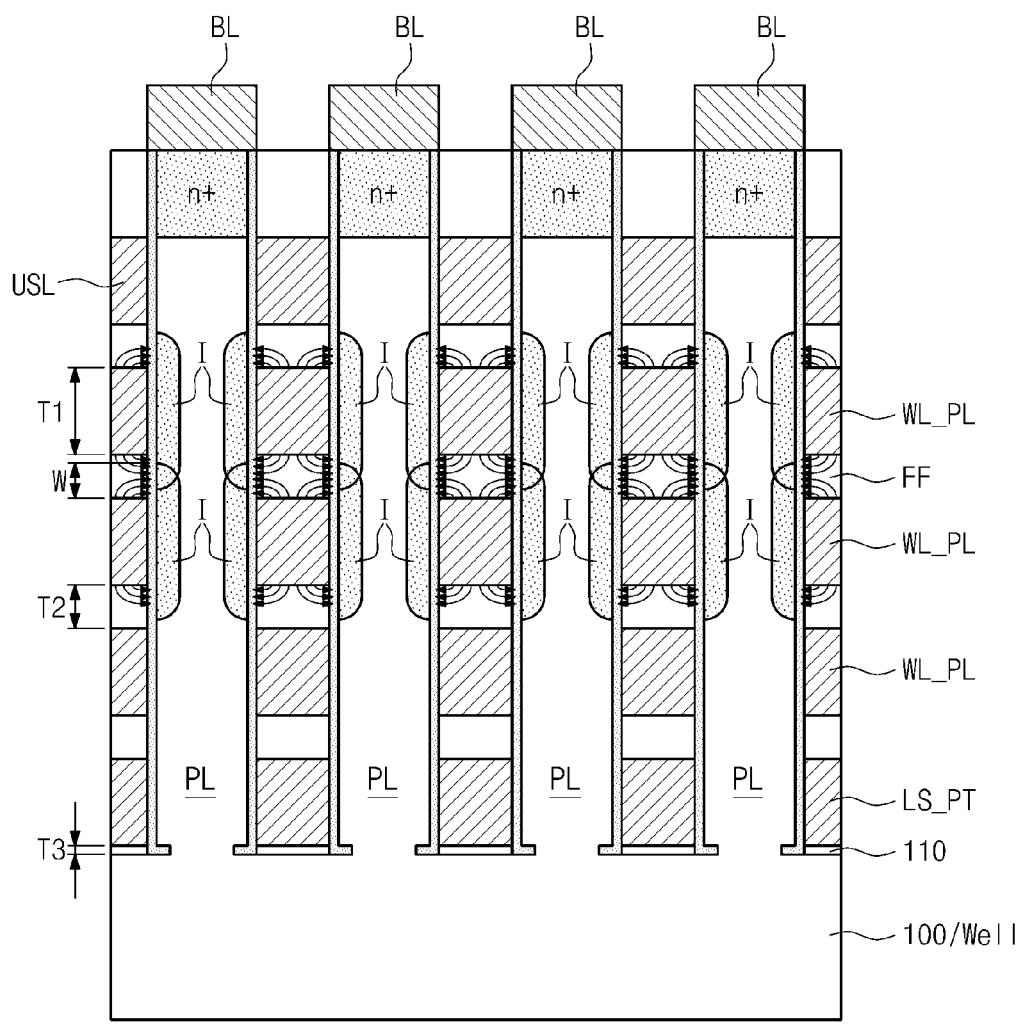

FIGS. 4 and 5 are cross-sectional views of the vertical channel memory device of FIG. 3, taken along section line I-I' of FIG. 2, in accordance with an embodiment of the present invention. In FIG. 4, it can be seen that an inversion layer I is created along the walls, or outer surface, of the vertical pillars PL when a suitable word line voltage is applied to the word line plates WL_PT. It can also be seen that the thickness T1 of the word line plates WL_PT is generally greater than the thickness T2 of the interlayer dielectric layers 210. At the same time, it can be seen that the thickness T2 of the interlayer dielectric layers 210 is greater than the thickness T3 of the capacitor dielectric layer CD. In order for current to flow in a vertical direction of the pillars PL, the inversion layers I generated in the vertical pillars PL and caused by the neighboring word lines plates WL_PT, should overlap. This overlap, or fringing field, has a maximum width W, or amount of vertical extension in the adjacent vertical pillars PL above a level of the top surface of, or below a level of the bottom surface of, the word line plate WL_PT.

Referring to FIG. 5, it can be seen that in each pillar PL, rather than using source/drain diffusion regions for each of the memory cell transistors, a diffusion region effect can be generated by a fringing field FF that is originated by the lower select plate LS_PT, the word line plates WL_PT, or the upper select lines USL. The generation and operation of a fringing field as applied to a conventional planar NAND memory device is disclosed in United States Patent Application Publication Number 2007/0205445, incorporated herein by reference in its entirety. Formation of source/drain regions in the vertical channel of a vertically oriented memory device is challenging. In view of this, the fringing field configuration can be readily applied to the methods and configurations of the embodiments of the present invention.

Figure 6:
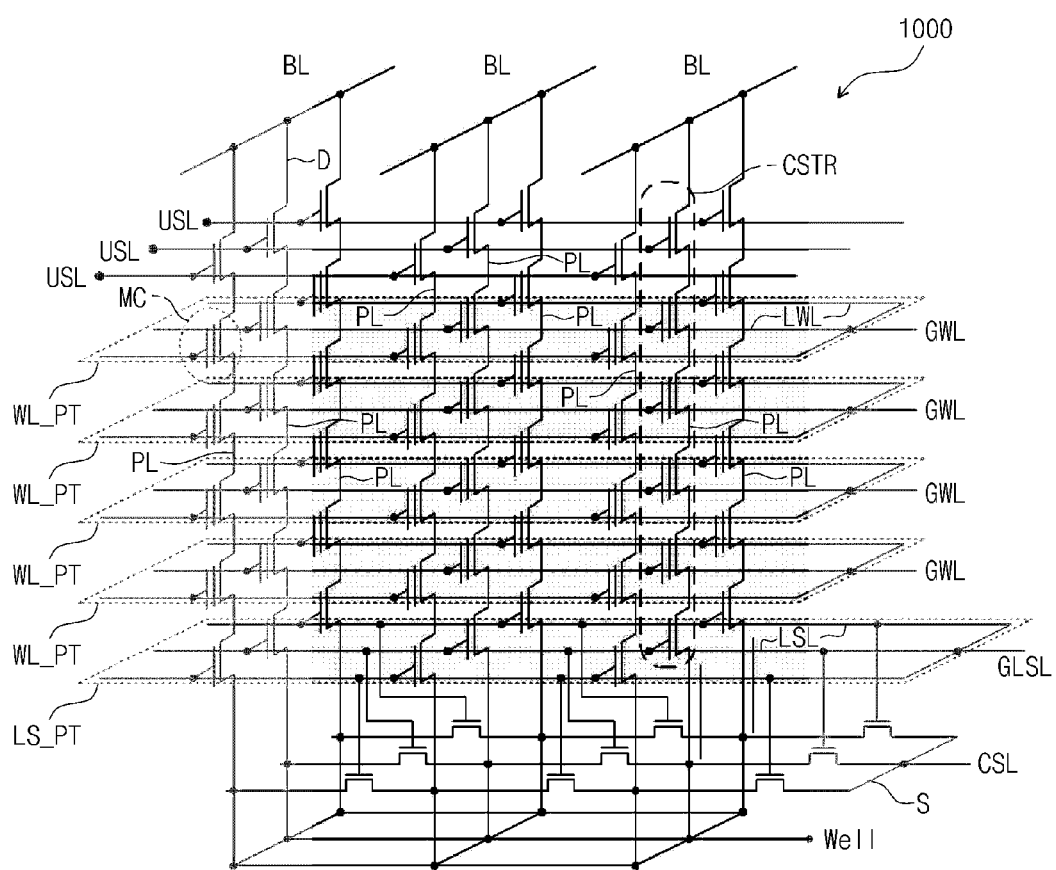
FIG. 6 is a perspective schematic view of a vertical-channel memory device, in accordance with another embodiment of the present invention.
Figure 7A:
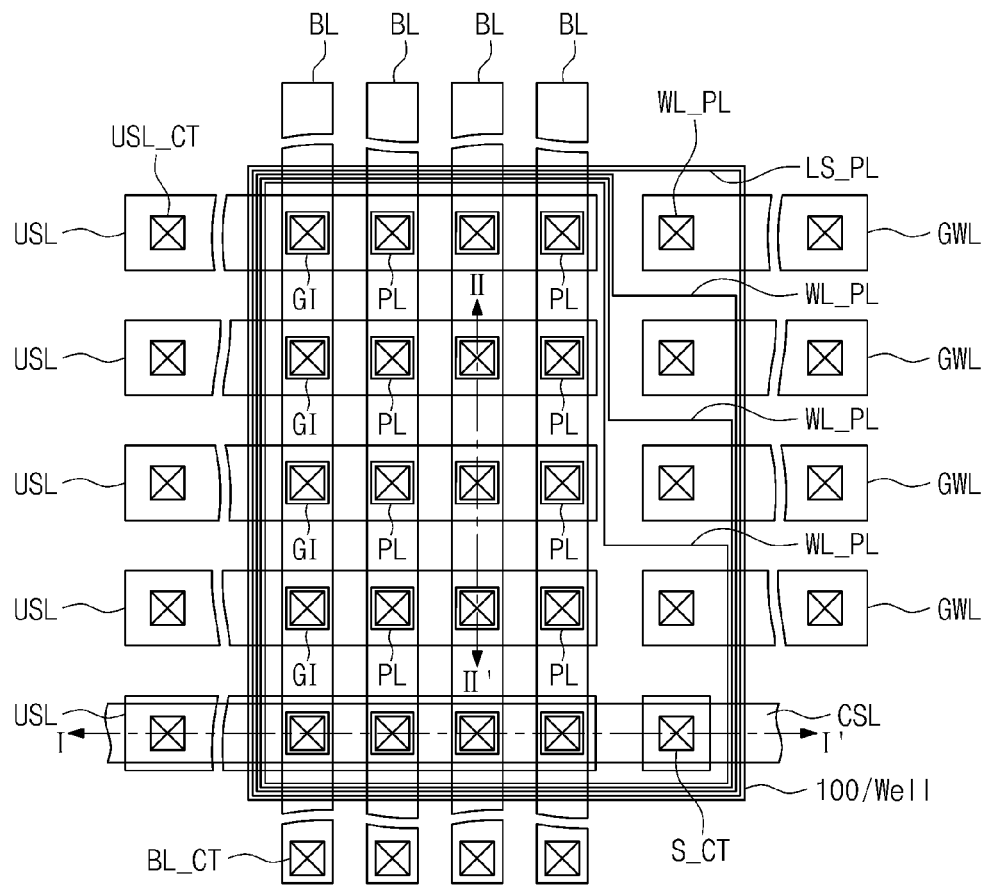
FIG. 7A is top layout view of the vertical-channel memory device of FIG. 6.
Figure 7B:
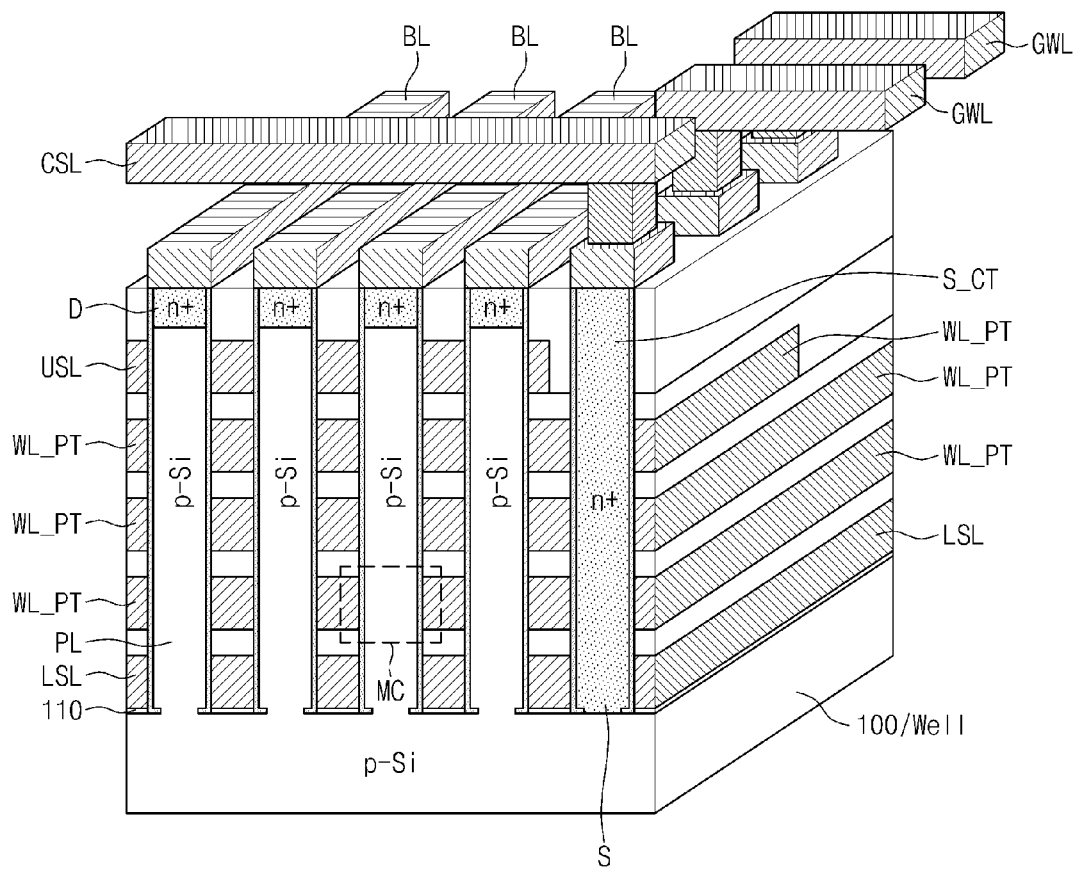
FIG. 7B is a cross-sectional perspective view of the vertical channel memory device of FIG. 6.

FIG. 6 is a perspective schematic view of a vertical-channel memory device, in accordance with another embodiment of the present invention. FIG. 7A is top layout view of the vertical-channel memory device of FIG. 6. FIG. 7B is a cross-sectional perspective view of the vertical channel memory device of FIG. 6. In this embodiment, it can be seen that the source contact plug S_CT can be formed of a material that has a different dopant type than that of the substrate well 100. For example, in the embodiment shown, the well 100 and vertical pillars PL are formed of a semiconducting material having a first p-dopant type p-Si, while the source contact plug S_CT is formed of a semiconducting material having a second, n-dopant type n+.

Figure 8:
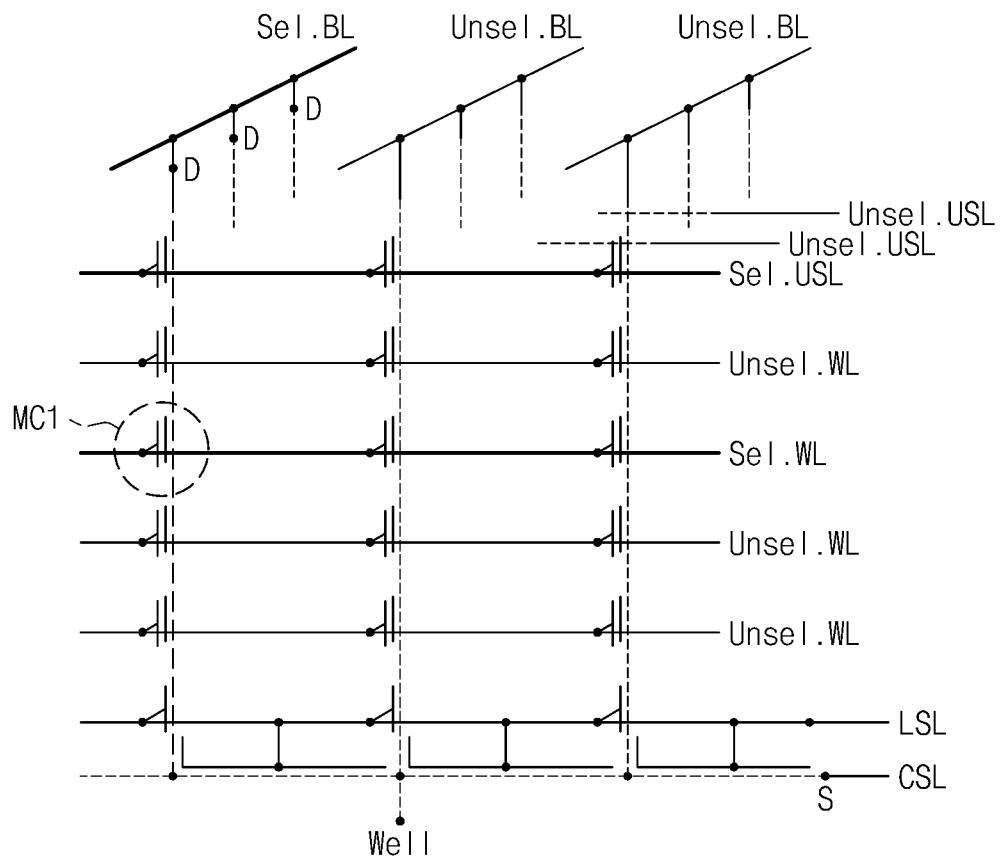
FIG. 8 is a perspective schematic view of a vertical-channel memory device, illustrating the accessing of an individual memory cell, in accordance with an embodiment of the present invention.

FIG. 8 is a perspective schematic view of a vertical-channel memory device, illustrating the accessing of an individual memory cell, in accordance with an embodiment of the present invention. In this embodiment, it can be seen that an individual memory cell MC1 in the three-dimensional array can be accessed for programming and read operations by applying appropriate voltage levels to a selected word line WL, a selected bit line BL a lower select line LSL and a selected upper select line USL.

Figure 9:
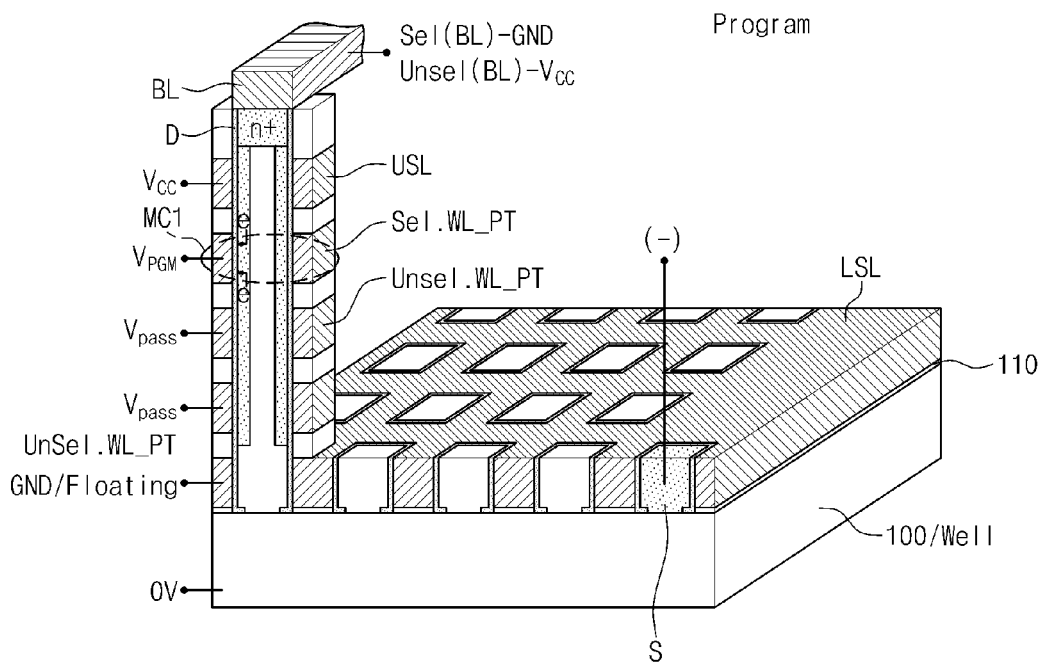
FIG. 9 is a perspective view of a vertical-channel memory device, illustrating access of an individual memory cell during a programming operation, in accordance with an embodiment of the present invention.

FIG. 9 is a perspective view of a vertical-channel memory device, illustrating access of an individual memory cell during a programming operation, in accordance with an embodiment of the present invention. Referring to FIG. 9 and Table 1 below, during a programming operation, a programming voltage $V_{PGM}$ is applied to selected word line plates Sel.WL_PT and a pass voltage VPASS is applied to unselected word line plates Unsel.WL_PT. A ground voltage GND is applied to selected bit lines Sel(BL) and a Vcc voltage is applied to unselected bit lines Unsel(BL). A Vcc voltage is applied to selected upper select lines USL and a GND voltage is applied to unselected upper select lines USL. In addition, a GND voltage is applied to the lower select line LSL, a voltage (−) is applied to the common source line CSL and a GND voltage is applied to the well 100. This operation causes electrons to congregate in the channel of the thus-selected memory cell MC 1, which operates to program the selected cell MC 1. The operation of self-boosting technology, as described for example in U.S. Pat. No. 5,473,563, incorporated herein by reference, can be employed to inhibit programming of unselected pillars. The self-boosting operation prevents current from flowing to unselected pillars.

TABLE 1

|  |  | PRG | ERS | READ |
| --- | --- | --- | --- | --- |
| WL | Sel. | $V_{PGM}$ | GND | 0 V |
|  | Unsel. | $V_{pass}$ | GND | Vread |
| BL | Sel. | GND | F | Vpchg |
|  | Unsel. | Vcc | F | — |
| USL | Sel. | Vcc | F | Vread |
|  | Unsel. | GND/Floating | F | GND |
| LSL | — | GND/Floating | F | Vread |
| CSL | — | — | F | GND |
| Well | — | GND/Floating | Positive $V_{ERS}$ | GND |

Figure 10:
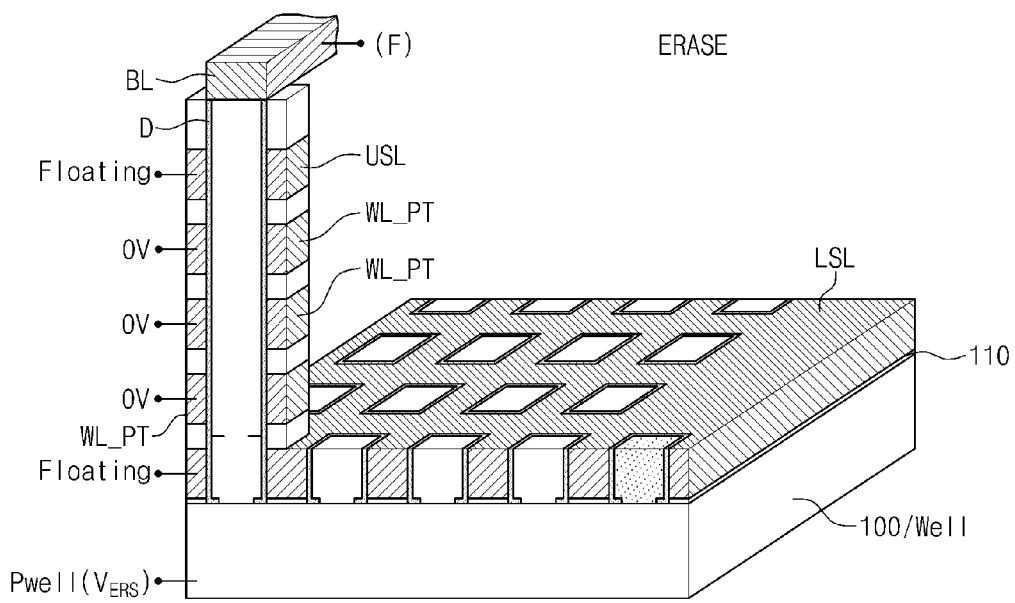
FIG. 10 is a perspective view of a vertical-channel memory device, illustrating an erase operation, in accordance with an embodiment of the present invention.

FIG. 10 is a perspective view of a vertical-channel memory device, illustrating an erase operation, in accordance with an embodiment of the present invention. Referring to FIG. 10 and Table 1 above, during an erase operation, a GND voltage is applied to all word line plates WL_PT within the selected block, and a Floating voltage F is applied to all bit lines BL and all upper select lines USL. In addition, a Floating voltage is applied to the lower select line LSL, and the common source line CSL. A positive erase voltage $V_{ERS}$ is applied to the well 100. This operation causes all electrons to be removed from the channel regions of all memory cells in the array, which operates to erase the memory cells of the array. In this case, since the positive erase voltage VERS is delivered directly to the vertical pillars PL during the erase operation, it is possible to erase the memory cells by applying a ground voltage GND to the word lines WL. Also, since a positive erase voltage can be used, and since a GND voltage can be applied to the word lines WL, there is no need to generate a negative voltage for the erase operation. This simplifies the power supply circuitry required for the device, and makes the resulting device compatible with the power supply configuration of conventional horizontally configured planar NAND memory devices; allowing for easier replacement of such conventional devices by the devices configured in accordance with embodiments of the present invention.

Figure 11:
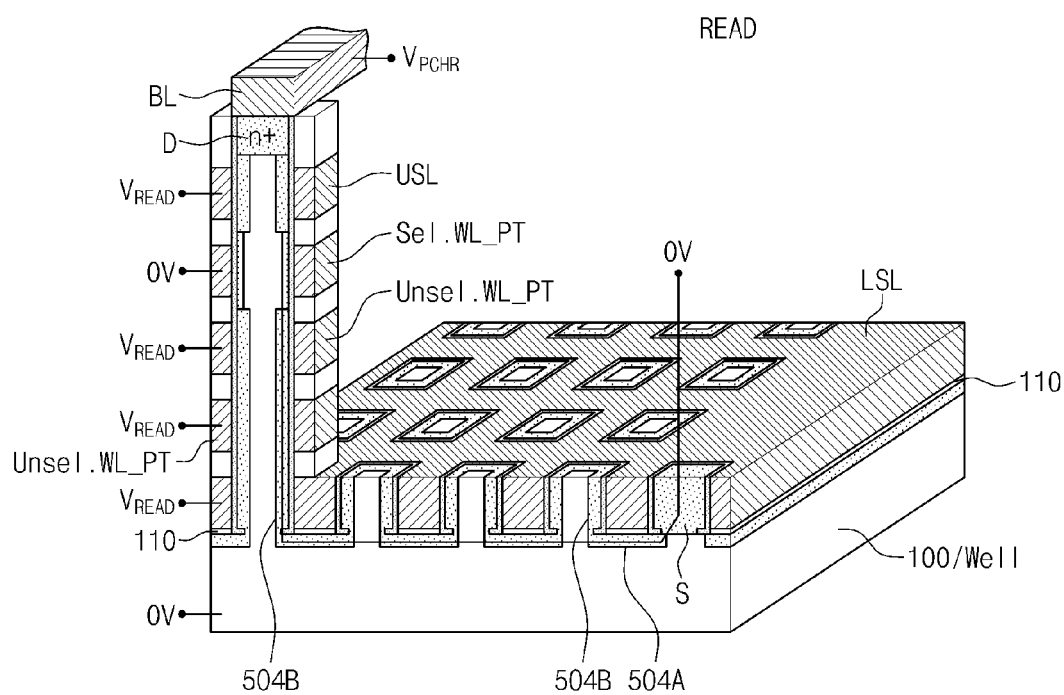
FIG. 11 is a perspective view of a vertical-channel memory device, illustrating access of an individual memory cell during a read operation, in accordance with an embodiment of the present invention.

FIG. 11 is a perspective view of a vertical-channel memory device, illustrating access of an individual memory cell during a read operation, in accordance with an embodiment of the present invention. Referring to FIG. 11 and Table 1 above, during a read operation, a criterion voltage to discriminate '1' and '0', for example ground voltage GND, or 0 V, is applied to selected word line plates Sel.WL_PT and a read voltage $V_{READ}$ is applied to unselected word line plates Unsel.WL_PT. A precharge voltage Vpchg is applied to selected bit lines Sel(BL) to discriminate '1' and '0' and GND voltage is applied to unselected bit lines Unsel(BL). A read voltage $V_{READ}$ is applied to selected upper select lines USL and a GND voltage is applied to unselected upper select lines USL. In addition, a read voltage is applied to the lower select line LSL, a GND voltage is applied to the common source line CSL and a GND voltage is applied to the well 100.

Application of the read voltage $V_{READ}$ to the lower select line LSL causes vertical inversion regions 504B to be formed along the outer walls of lower portions of the vertical pillars PL formed of semiconducting material. Also, since the lower gate insulator 110 between the lower select line and the well 100 is relatively thin, horizontal inversion regions 504A are likewise formed along the top portions of the well formed of semiconducting material, below the lower gate insulator 110. As a result of the presence of the horizontal and vertical inversion regions 504A, 504B formed in the semiconducting material along the upper portion of the well 100 and along the lower and upper side portions of the vertical pillars PL, the source region S and the vertical pillars PL are made to be electrically connected. In this manner, the horizontal and vertical inversion regions 504A, 504B operate to provide a common source line CSL to all the pillars in the array during the read operation.

In FIG. 1 above, the horizontal dashed lines connected to the source S indicate the operation of the horizontal inversion region 504A at the upper portion of the well as a result of the application of the read voltage $V_{READ}$ at the lower select plate LS_PT, and the vertical dashed lines along the pillars PL indicate the operation of the vertical inversion region 504B at sidewalls of the vertical pillars PL as a result of the application of the read voltage VREAD at the lower select plate LS_PT, the word line plates WL_PT and the upper select lines USL.

In FIG. 6 above, the operation of the inversion layer is expressed as a plurality of MOS transistors. By comparison, the lower select plate LS_PT provide the function of a gate, the lower gate insulator layer 110 provides the function of an oxide, and the substrate 100 provides the function of a semi-conductor region. In this manner, the formation of the inversion layer in FIG. 6 is expressed as a plurality of MOS transistors, the gates of which are coupled to the lower select plate LS_PT. Thus, when the read voltage $V_{READ}$ is applied to the lower select plate LS_PT, the horizontal inversion region 504A is activated.

Since the voltages that are applied to the various elements during the programming, erase and read operations according to the embodiments of the present invention, are similar to the voltages that are applied for those same operations for conventional, horizontally disposed planar NAND-based memory devices, the devices of the embodiments of the invention are compatible with the power supplies of conventional NAND-based memory devices, and can therefore more readily serve as replacement devices for systems employing the conventional devices. The configuration and operation of the embodiments of the present specification are in contrast with other configurations recently proposed, including those proposed in the disclosure of United States Patent Application Serial No. 2007/0252201; in the disclosure of H. Tanaka et al., "Bit Cost Scalable Technology with Punch and Plug Process for Ultra High Density Flash Memory, Symposium on VLSI Technology Digest of Technical Papers, pp. 14-15 (2007); and in the disclosure of Fukuzumi et al., "Optimal Integration and Characteristics of Vertical Array Devices for Ultra-High Density, Bit-Cost Scalable Flash Memory, IEDM Technical Digest, pp. 449-452 (2007), the contents of each being incorporated herein by reference. In each of these examples, a common source line is provided in a diffusion layer formed in an upper region of the substrate, as a doped region of the substrate. For this reason, a p-n junction is formed between the common source diffusion layer and the underlying substrate. Therefore, it is difficult to control the potential of the vertical channel through any electrode and it is necessary to apply the negative voltage level on the control gates to erase the memory cells. Such a negative voltage level can require a more complicated device power supply circuit, increasing device cost. Further, application of a negative voltage level is inconsistent with the power arrangement of conventional NAND memory devices, hindering straightforward replacement of conventional NAND devices by the vertically oriented channel memory devices. As described above, to prevent the problems associated with hole depletion in the vertical channels, which are isolated from the common source line, hole injection by a gate-induced-drain-leakage (GIDL) operation has been proposed, in order to maintain the potential of the vertical channels at a suitable level. However, vertical channel potential control through GIDL effect is not straightforward or can be unstable, as compared with direct body biasing, because it can be affected easily by the junction profiles, which can result in the erased Vth distribution degradation. In addition, the GIDL effect is likely to incorporate hot hole injection into the lower select transistor or edge cell in the vertical channel strings, which can deteriorate endurance reliability characteristics of the resulting device.

FIGS. 12A-21A are cross-sectional views taken along section line I-I' of FIG. 2, and FIGS. 12B-21B are cross-sectional views taken along section line II-II' of FIG. 2, of a method of forming a vertical-channel memory device, in accordance with an embodiment of the present invention.

Figure 12A:
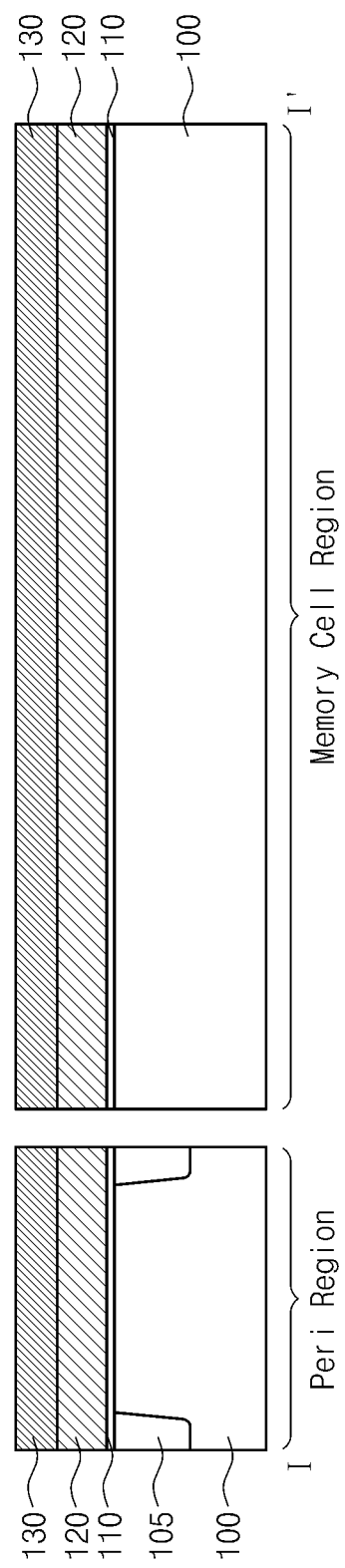
FIGS. 12A-21A are cross-sectional views taken along section line I-I' of FIG. 2, and FIGS. 12B-21B are cross-sectional views taken along section line II-II' of FIG. 2, of a method of forming a vertical-channel memory device, in accordance with an embodiment of the present invention.
Figure 12B:

Referring to FIGS. 12A and 12B, a substrate 100 is prepared. In one embodiment, the substrate 100 comprises a single-crystal semiconductor material substrate that provides a seed layer for later formation of single-crystal vertical pillars PL. In other embodiments, the substrate 100 can comprise a polycrystalline semiconductor material. Isolation regions 105 are formed at predetermined regions of the substrate, according to conventional techniques. A lower-most interlayer dielectric layer 110, also referred to herein as a lower gate insulator 110, is provided on the substrate. A first lower gate layer 120 is formed on the lower-most interlayer dielectric layer 110, and a second lower gate layer 130 is formed on the first lower gate layer 120. The lower gate layer 120, 130 may optionally be formed as a single gate layer or as multiple gate layers as shown. In a case where the lower gate layer 110 comprises multiple gate layers, the first lower gate layer 120 can comprise a polysilicon layer and the second lower gate layer 130 can comprise a metal layer. In certain embodiments of the present invention, the lower-most interlayer dielectric layer 110 is sufficiently thin so that an inversion layer 504A, 504B (see FIG. 11, above) can be created in the underlying semiconductor material of the substrate 100 when a suitable voltage is applied to the gate layer 120, 130.

Figure 13A:
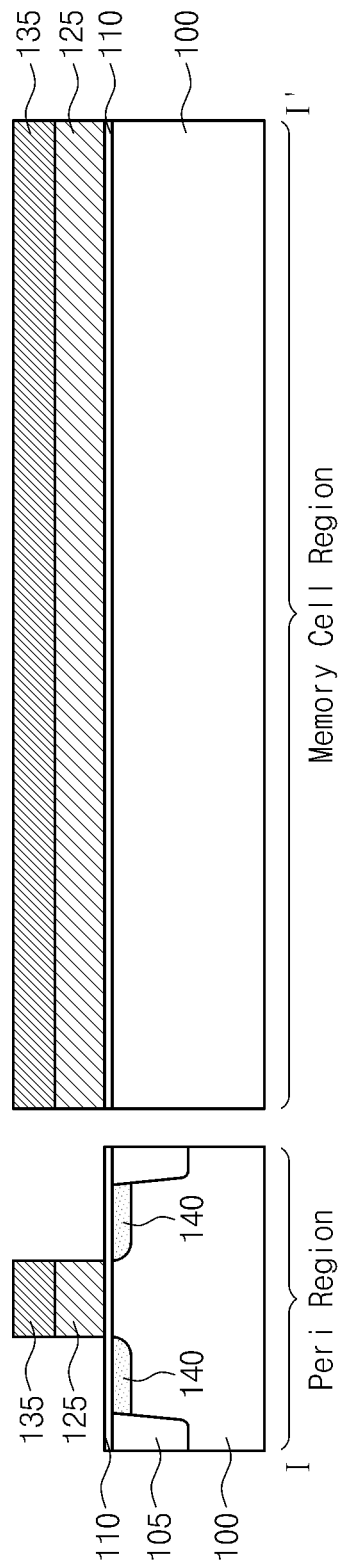
Figure 13B:

Referring to FIGS. 13A and 13B, the first and second lower gate layers 120, 130 are patterned in the peripheral region to form a lower gate pattern 125, 135. Source and drain regions 140 can be formed in the peripheral region using the lower gate pattern 125, 135 as an ion implantation mask, according to conventional fabrication techniques.

Figure 14A:
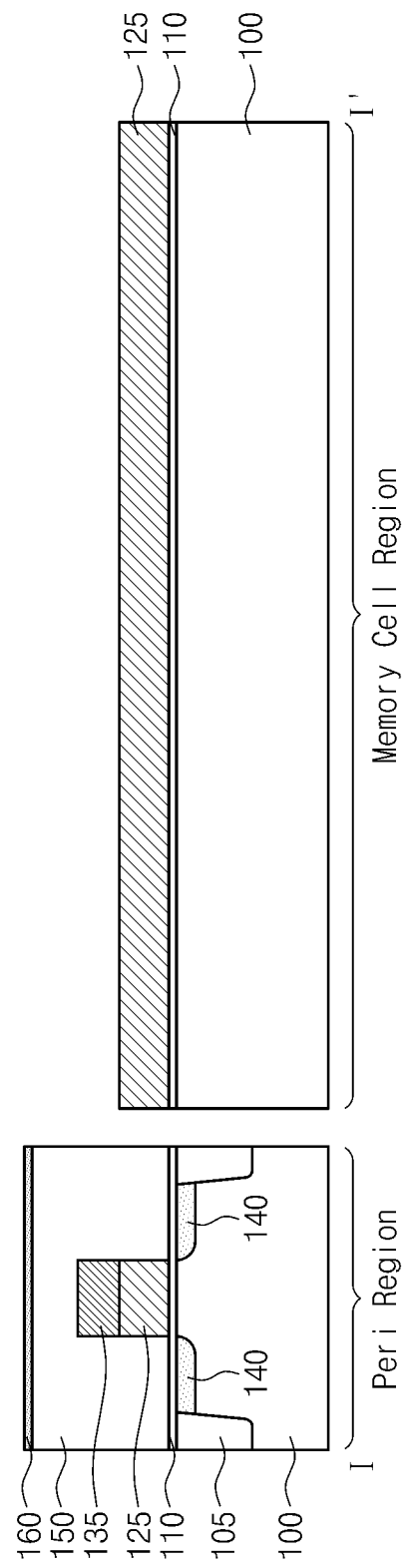
Figure 14B:
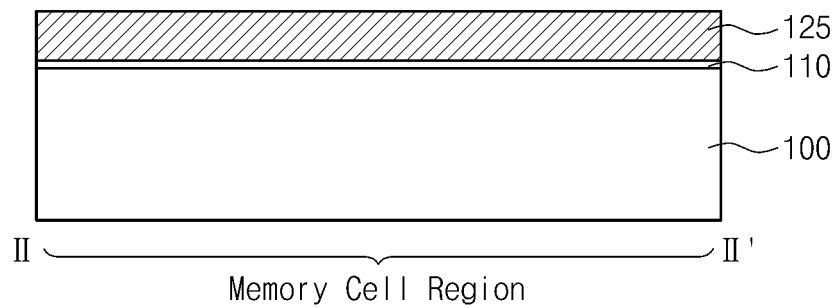

Referring to FIGS. 14A and 14B, and interlayer dielectric layer 150 and etch stop layer 160 are sequentially formed in the peripheral region. The second lower gate pattern 135 is then removed in the memory cell region using the etch stop layer 160 as an etch mask.

Figure 15A:
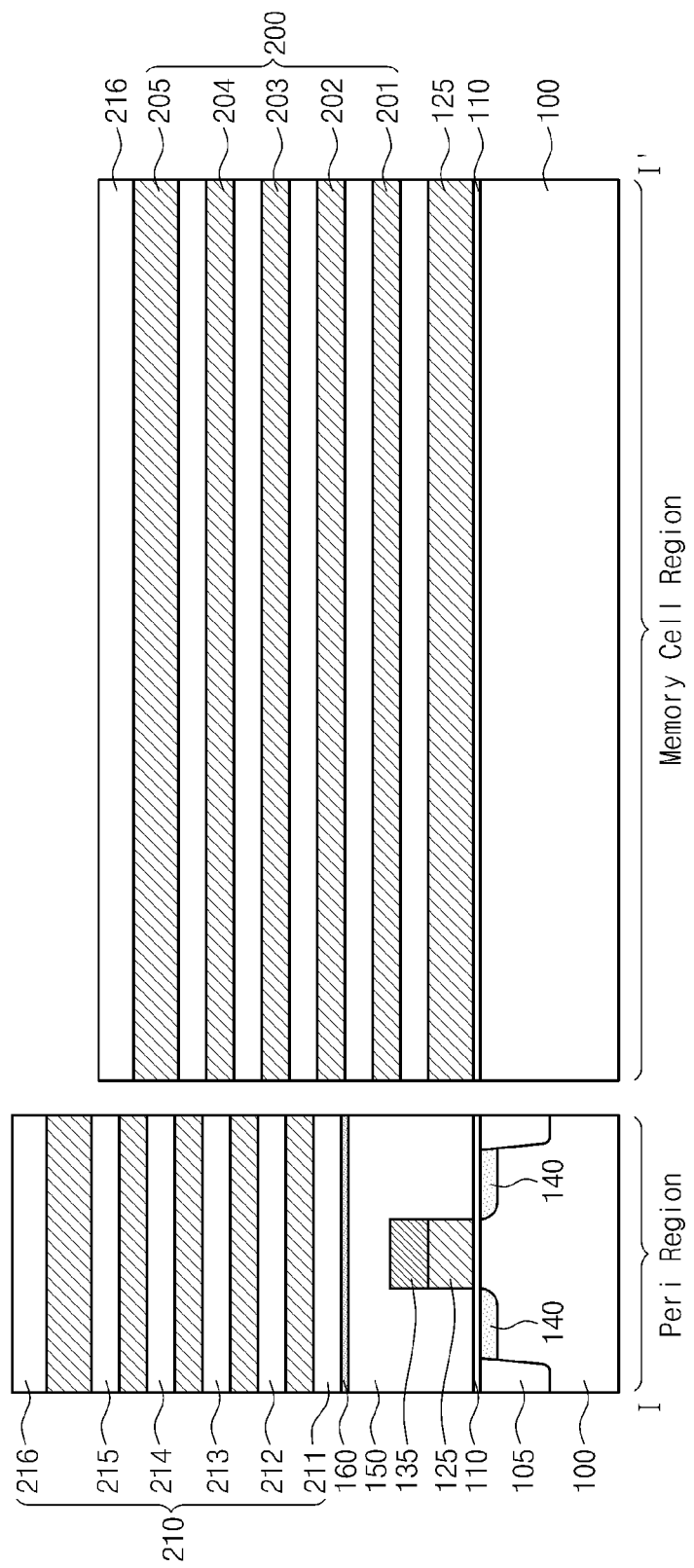
Figure 15B:
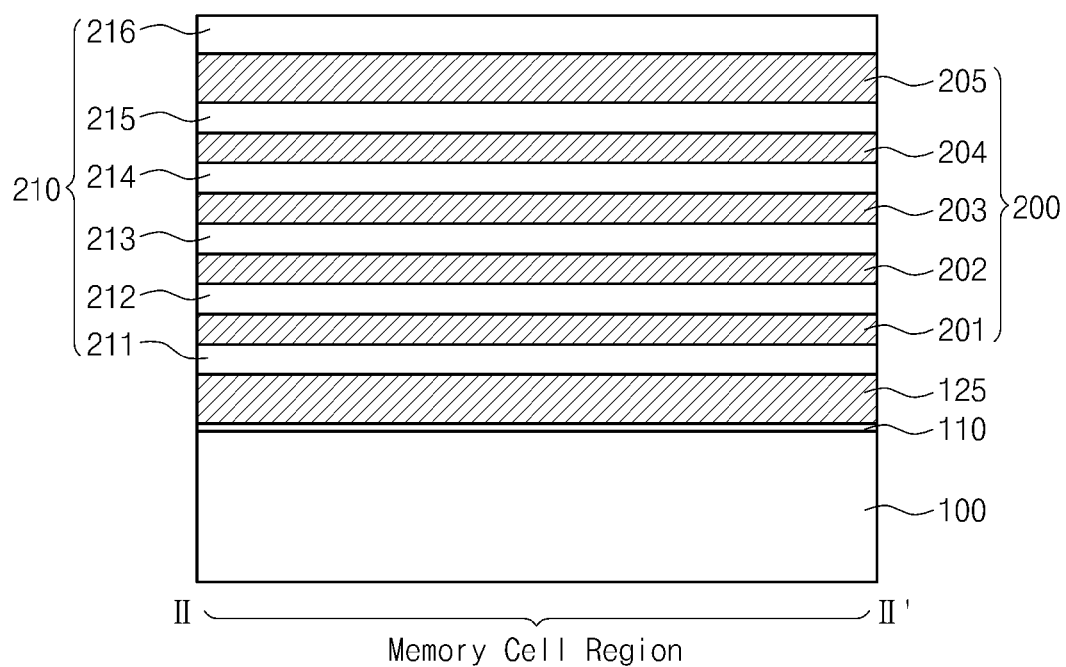

Referring to FIGS. 15A and 15B, multiple alternating interlayer dielectric layers 210, including in this example, layers 211, 212, 213, 214, 215, and 216 and conductive gate layers 200, including in this example, layers 201, 202, 203, 204, and 205 are formed on the first lower gate pattern 125 on the resulting structure. In various embodiments, the interlayer dielectric layers 210 can comprise a material selected from the group consisting of oxide, HDP oxide, CVD oxide, PVD oxide, BPSG, SOG, mixtures thereof, and other suitable materials. The gate layers 200 can comprise a material selected from the group consisting of poly-Silicon, W, TaN, TiN, metal silicide, mixtures thereof, and other suitable materials.

Figure 16A:
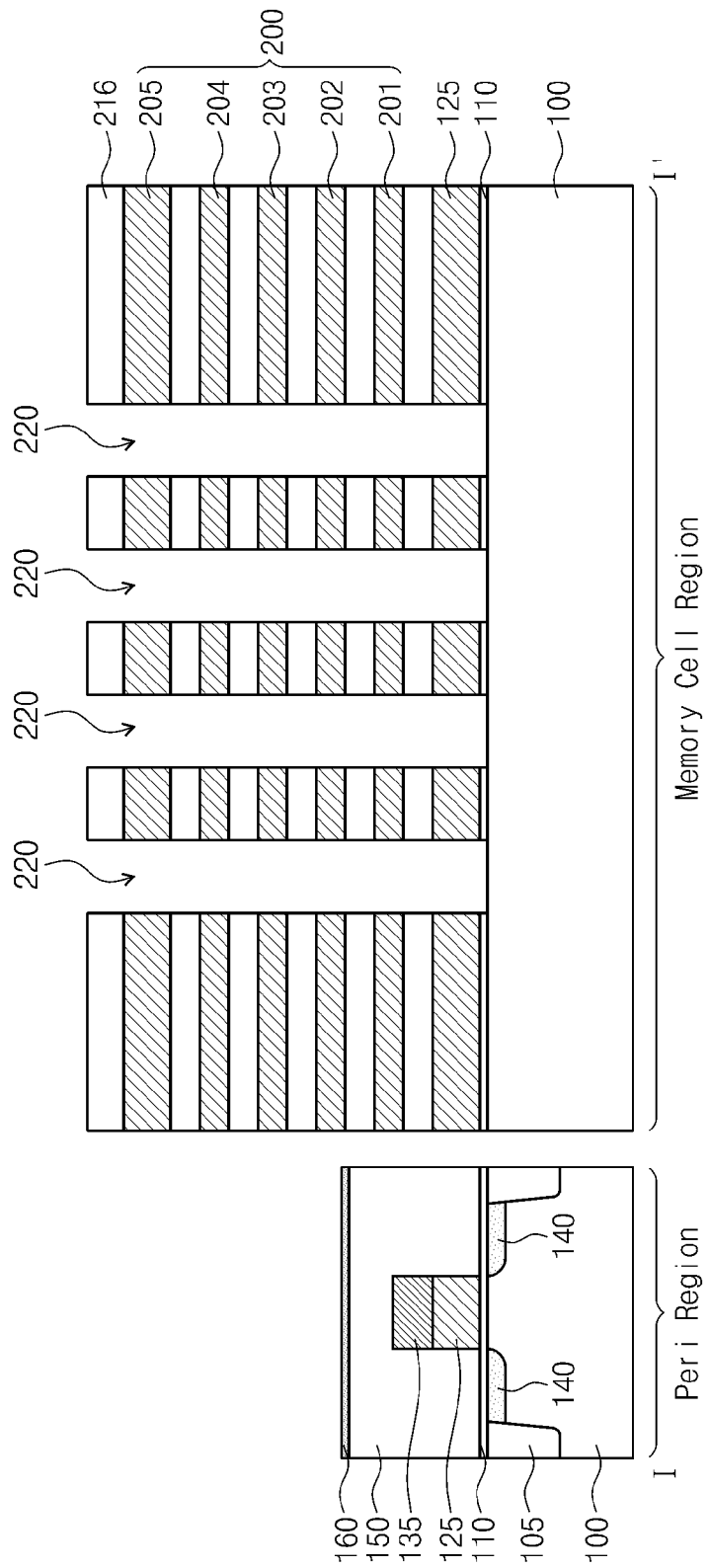
Figure 16B:
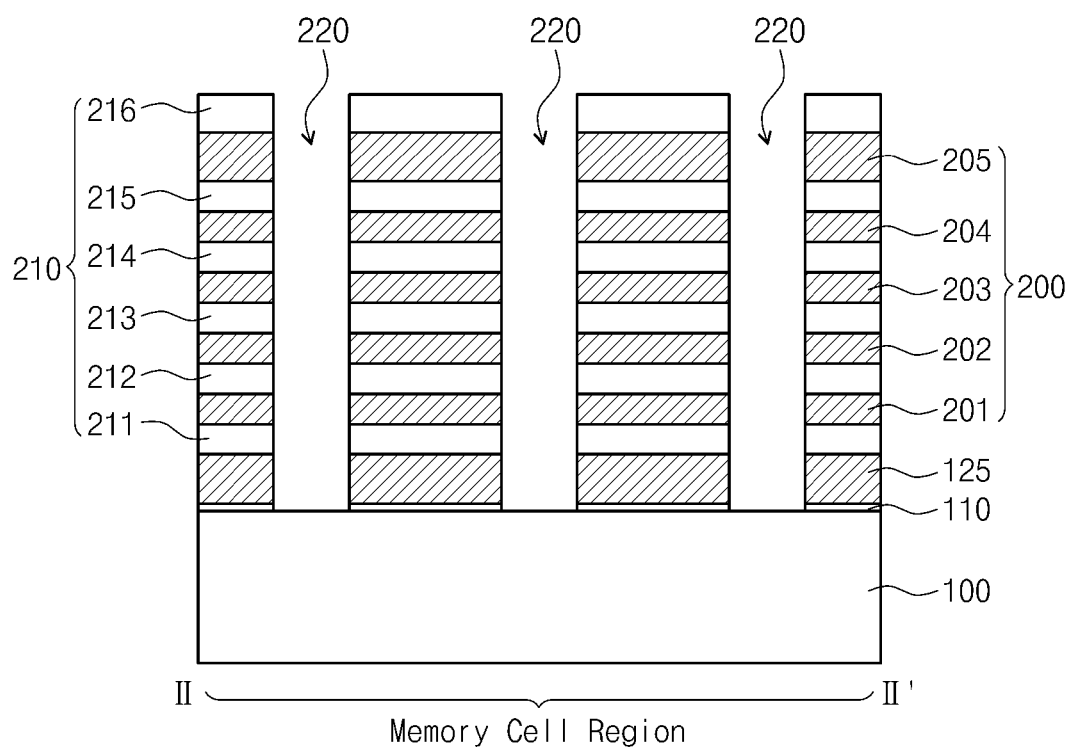

Referring to FIGS. 16A and 16B, the interlayer dielectric layers 210 and the conductive gate layers 200 are patterned to form vertical openings 220 in the memory cell region. In the peripheral region, the interlayer dielectric layers 210 and the conductive gate layers 200 are removed. The lower-most interlayer dielectric layer 110 is also removed at a bottom of the vertical openings 220, exposing a top portion of the substrate 100 in each opening 220.

Figure 17A:
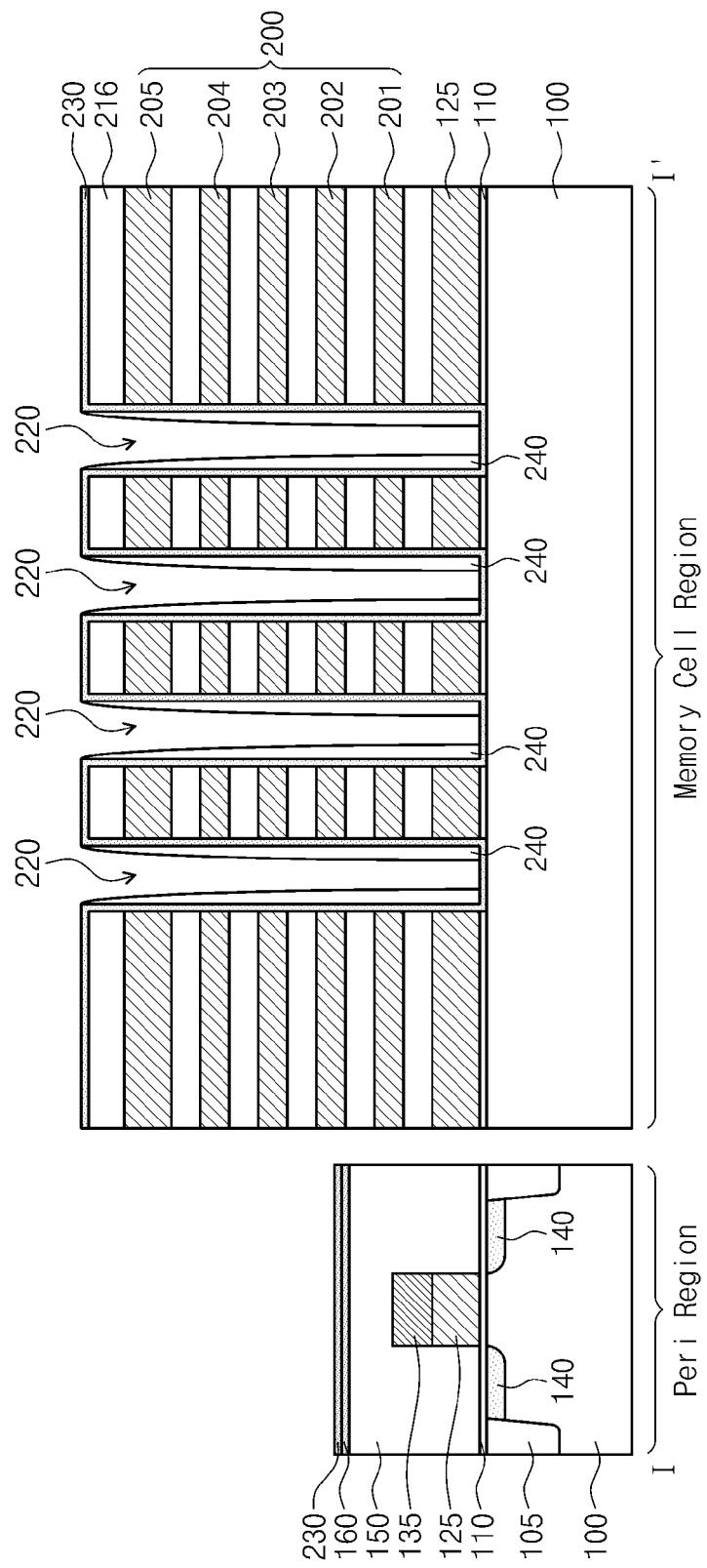
Figure 17B:
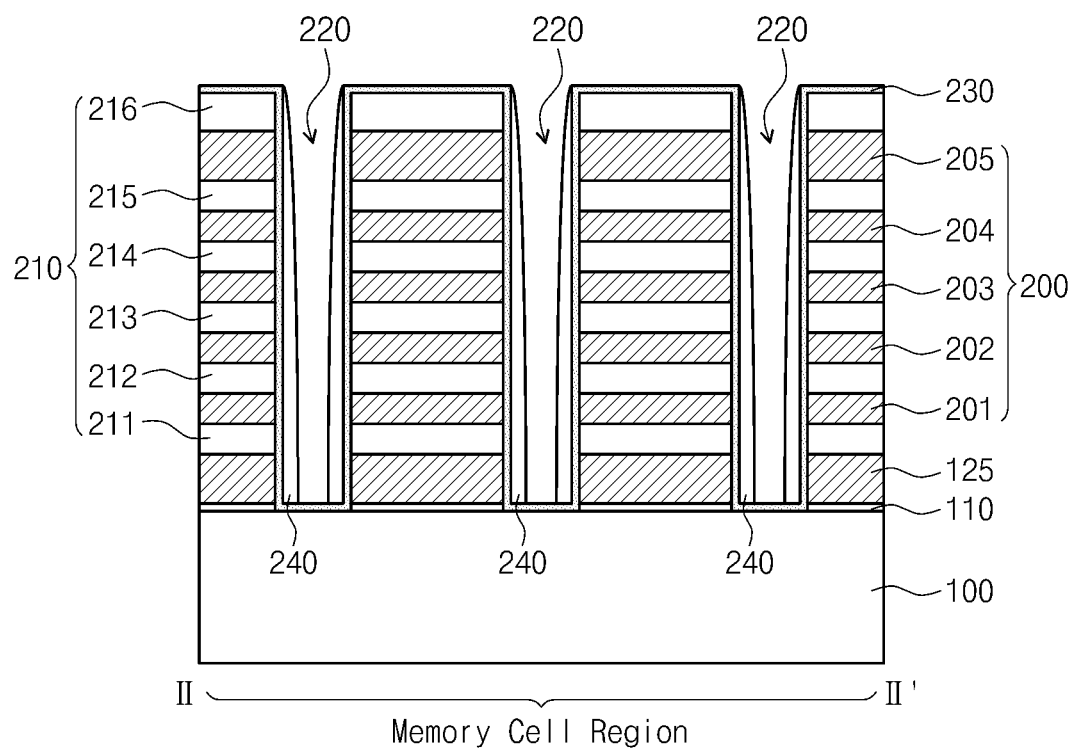

Referring to FIGS. 17A and 17B, a gate insulating layer 230 is provided on the resulting structure. The gate insulating layer 230 covers a bottom and interior sidewalls of the vertical openings 220, and a top of the uppermost interlayer dielectric layer 216 in the memory cell region, and optionally covers the etch stop layer 160 in the peripheral region.

Figure 22:
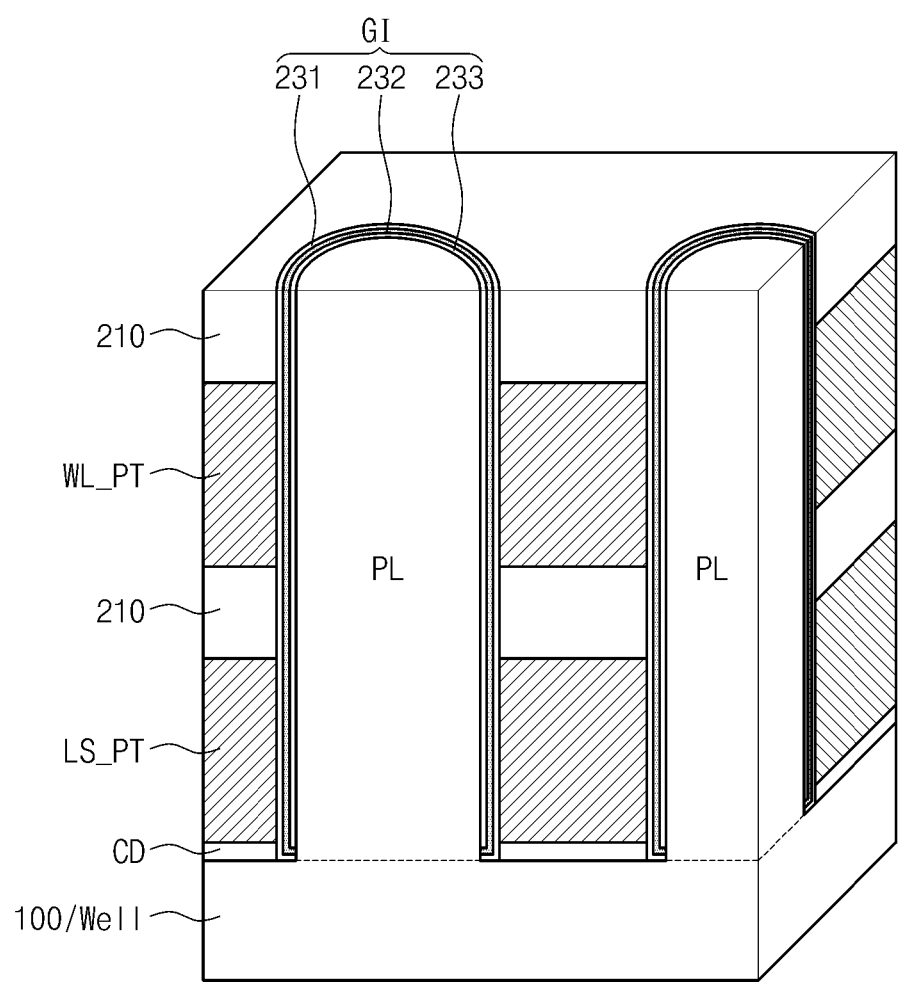
FIGS. 22 and 23 are close-up perspective views of embodiments of the gate insulating layer and pillar in the vertical openings, in accordance with embodiments of the present invention.
Figure 23:
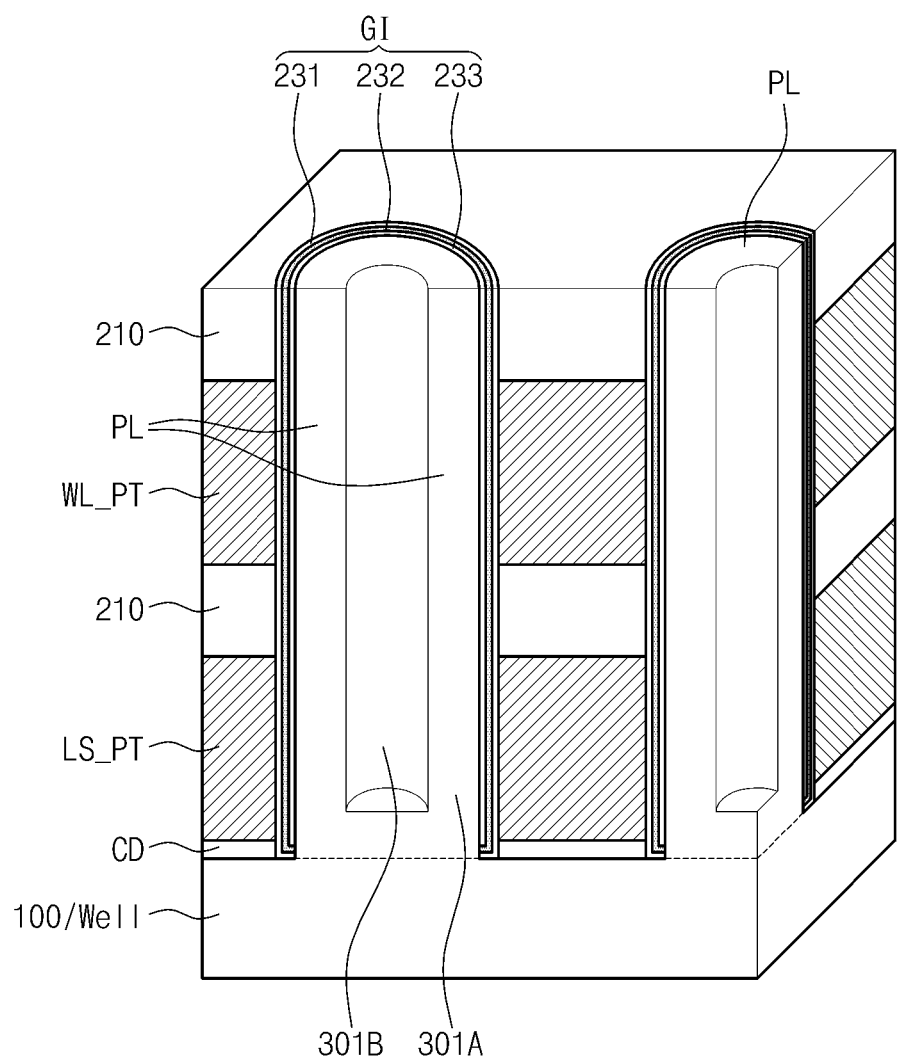

FIGS. 22 and 23 are close-up perspective views of embodiments of the gate insulating layer and pillar in the vertical openings 230. In one embodiment, the gate insulating layer 230 comprises a charge storage layer so that the device can operate as a non-volatile memory device. In the example of FIGS. 22 and 23, the gate insulating layer 230 comprises a sequentially formed blocking insulating layer 231, a charge storage layer 232, and a tunnel insulating layer 233. Gate insulating layers 230 formed according to this configuration are described in U.S. Pat. Nos. 6,858,906 and 7,253,467 and in United States Patent Application Publication No. 2006/0180851, the contents of each being incorporated herein by reference. In certain embodiments, the charge storage layer 230 can comprise a charge trapping layer. In various embodiment, the charge trapping layer can comprise SiN. Other suitable materials for the charge trapping layer can be employed, for example, $Al_2O_3$, HfAlOx, HfAlON, HfSiOx, HfSiON and multiple layers thereof. In another embodiment, the charge storage layer 230 can comprise a floating gate layer, comprising a conducting or semiconducting material Returning to FIGS. 17A and 17B, a spacer layer 240 is formed in the vertical openings 220, on the gate insulating layer 230. The spacer layer 240 is anisotropically etched to expose a middle portion of the underlying gate insulating layer 230 at the bottom of the openings 220. The spacer layer 240 operates to protect the gate insulating layer 230 along the sidewalls of the openings 220 during subsequent exposure of the underlying substrate 100 during pillar formation, allowing for direct contact between the pillar PL and the substrate 100. The spacer layer 240 is preferably formed of semiconductor material such as poly-silicon, amorphous silicon, or single-crystal silicon, so that the material is consistent with the subsequently formed pillar PL. In this manner, the spacer layer 240 does not need to be removed prior to formation of the pillar PL, but rather can remain to form a portion of the body of the pillar PL.

Figure 18A:
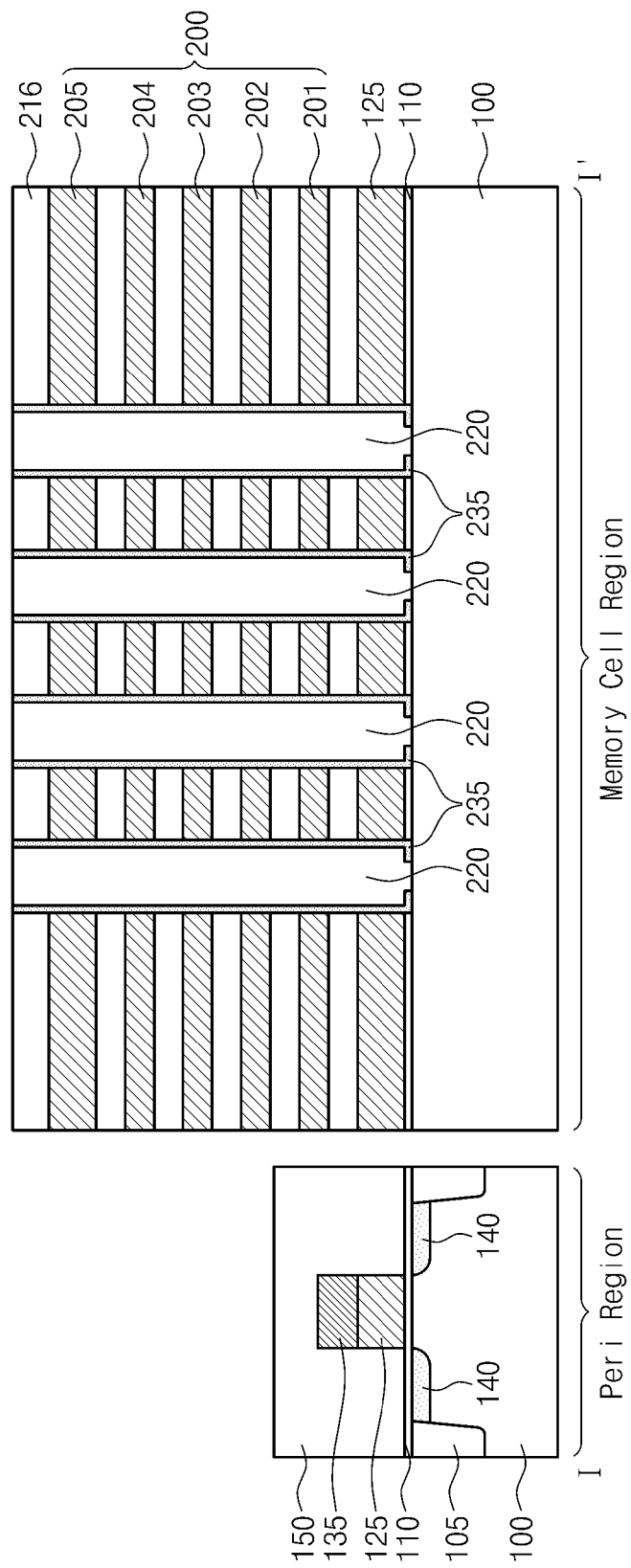
Figure 18B:
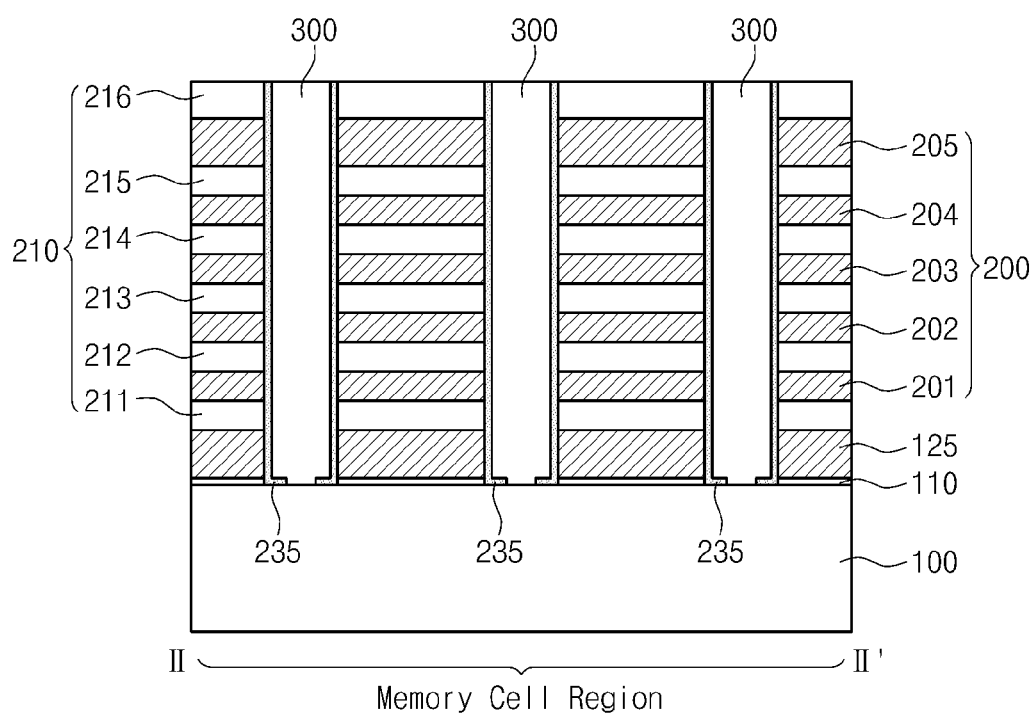

Referring to FIGS. 18A and 18B, the exposed middle portion of the underlying gate insulating layer 230 at the bottom of the openings 220 is removed using the spacer layer 240 as an etch mask, exposing the underlying substrate 100. Pillars 300 are then formed in the openings 220. The pillars 300 can be formed of a semiconductor material such as poly-silicon, amorphous silicon, or single-crystal silicon.

In one embodiment for forming the pillars 300, a polysilicon layer or first amorphous silicon layer is formed in the openings 220, in contact with the exposed upper portions of the substrate 100. In one embodiment, the poly-silicon layer or amorphous silicon layer can be formed by a chemical-vapor deposition (CVD) process; however, other suitable processes for forming the poly-silicon layer or amorphous silicon layer may be applied. In one embodiment, the poly-silicon layer or amorphous silicon layer can be doped with impurities at this stage, for example, doped with n-type impurities, so that the resulting pillar 300 has a suitable doping characteristic. A heat treatment can then be applied to the poly-silicon layer or amorphous silicon layer to convert the layer to a single-crystal silicon material. In one example embodiment, the heat-treatment can take the form of a laser-induced epitaxial growth (LEG) process to obtain the single-crystal silicon material, as is known in the art. In an alternative embodiment, single-crystal silicon pillars 300 can be grown in the openings 220 from the exposed upper surface of the substrate 100 using a selective epitaxial growth (SEG) process.

In one embodiment, the material used for forming the pillars 300 can be a same material as that used for forming the spacer layers 240. In other embodiments, the spacer layers 240 can be removed prior to formation of the pillars 300. In addition, the pillars 300 may be of a same dopant type as that of the substrate 100.

Referring again to FIGS. 22 and 23, the pillars PL may be formed to completely fill the openings 220 so that the pillars PL are solid, as shown in the embodiment of FIG. 22. Alternatively, the pillars PL may be formed as "macaroni-type" pillars, whereby the pillars are hollow in shape, as shown in the embodiment of FIG. 23, having a bottom and sidewalls 301A, with a hollow central region 301B, or, alternatively, a central region 301B that is formed of an insulative material. The sidewalls can be cylindrical or rectangular in shape, and can fully surround the central region 301B, or can be spaced apart and lie at opposed sides of the central region 301B.

The resulting pillars 220 formed of a semiconducting material are in direct contact with the underlying substrate/well region 100 in a region of contact. The contact region includes a lower portion of the pillar 220 and an upper portion of the substrate 100. Since they are in direct contact, a diode-type junction is not formed between the pillar 220 and the substrate 100. This allows for the horizontal and vertical inversion regions 504A, 504B to be present during a read operation, as shown in FIG. 11 above, so that individual memory cells can be accessed.

Figure 19A:
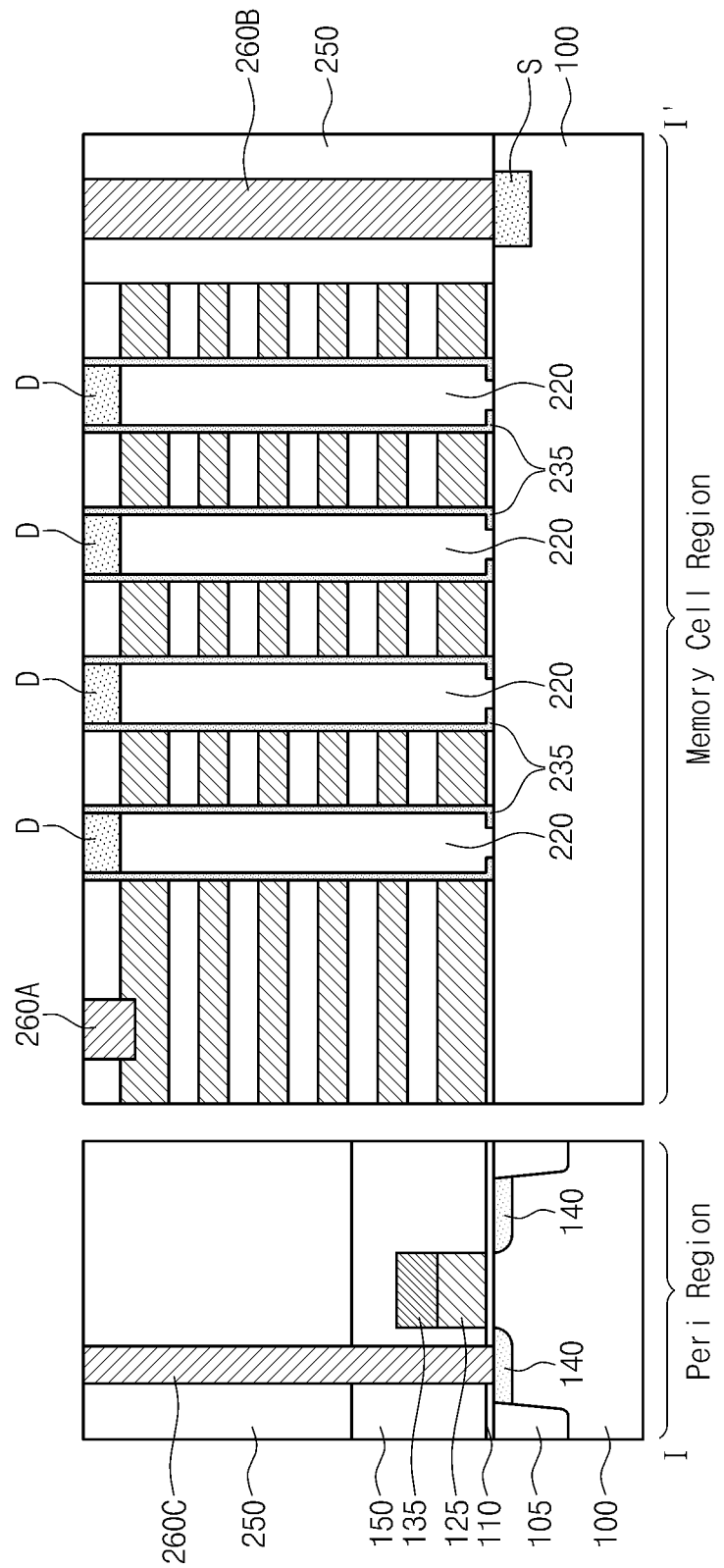
Figure 19B:
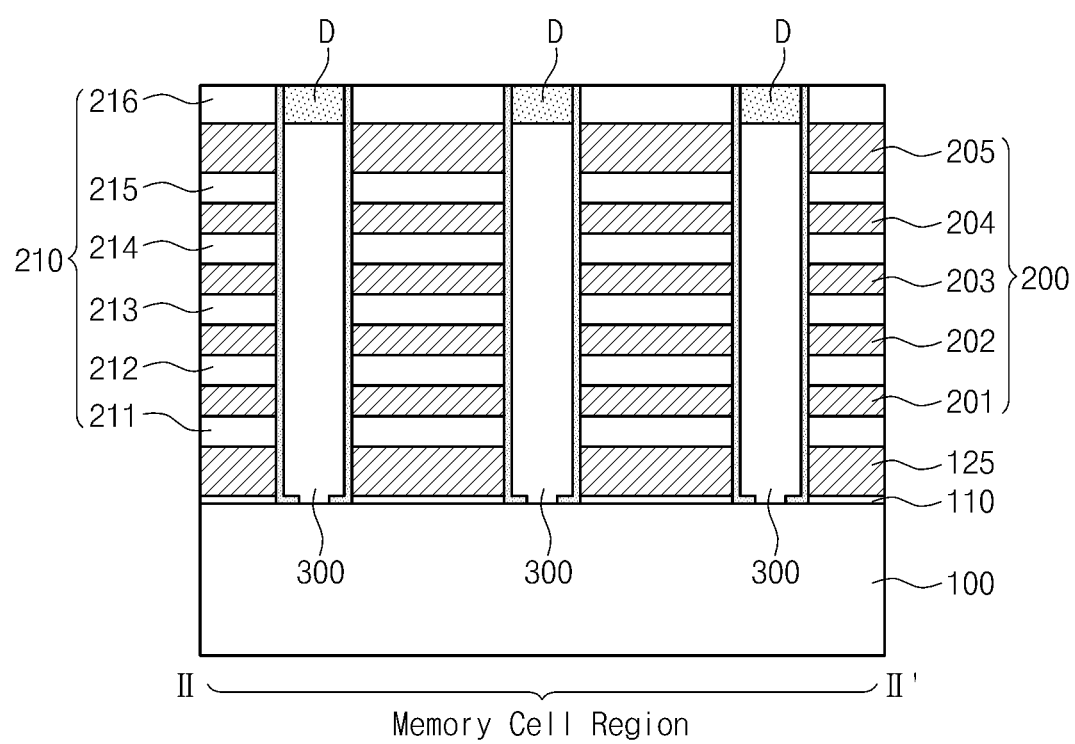

Referring to FIGS. 19A and 19B, additional patterning is performed to so that the conductive gate layers 200, including gate layers 201, 202, 203, 204, and 205 are patterned to form first through fourth word line plates WL_PT and the upper select line USL. The gate layers 200 are patterned in a stair-type pattern as shown in FIG. 3, to provide vertical access to the plurality of gate layers 200. The upper select line USL patterns 205 are each accessed by a contact plug 260A. Also, in this embodiment, at an edge region of the device, a vertical opening is formed to expose the underlying substrate 100 by removing portions of the upper select line plate USL, the word line plates WL_PT and the lower select line plate LS_PT. A source region S is then formed at the top surface of the exposed substrate, as shown. The contact plug 260B in connection with the underlying source region S is then formed with conductive material to fill the opening. Contact plugs 260C are similarly formed in the peripheral region of the device to provide connectivity to source/drain regions 140 of the peripheral transistors. Drain regions D are formed at the tops of the pillars 300 using standard doping techniques. This process results in the formation of the source contact plug S_CT of the type shown in the configuration of FIGS. 2 and 3 above.

Alternatively, the source contact plug S_CT can be formed at the same time as the vertical pillars, for example, during the steps shown in FIGS. 18A and 18B above, which describe formation of pillars 300. In this alternative embodiment, it is not necessary to remove corner portions of the upper select line plate USL, the word line plates WL_PT and the lower select line plate LS_PT, since the pillar for forming the source contact S_CT is formed through the plates, in the same manner as the vertical pillars 300. As a result, the source contact plug S_CT of the type shown in the configuration of FIGS. 7A and 7B is formed.

Figure 20A:
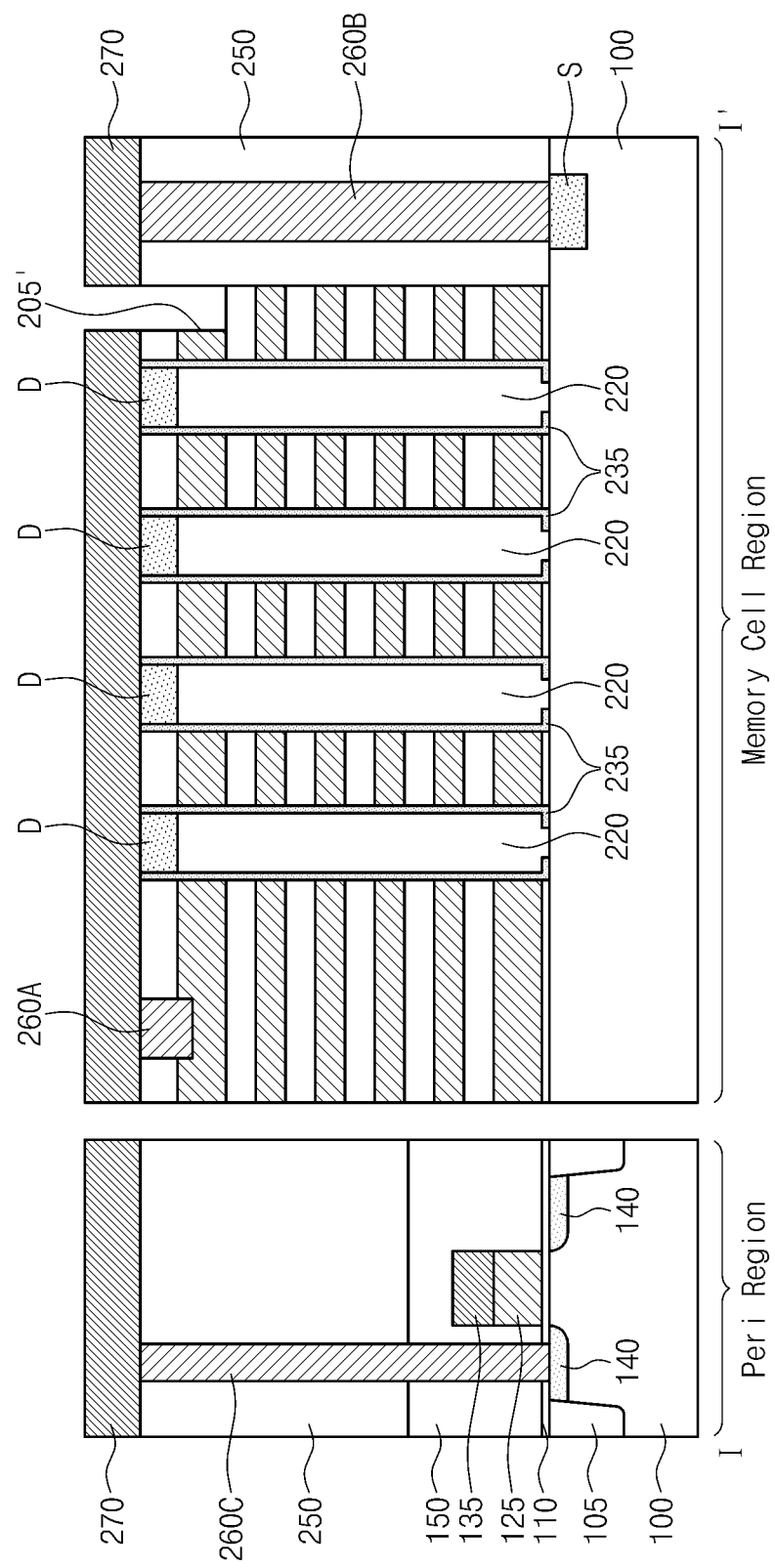
Figure 20B:
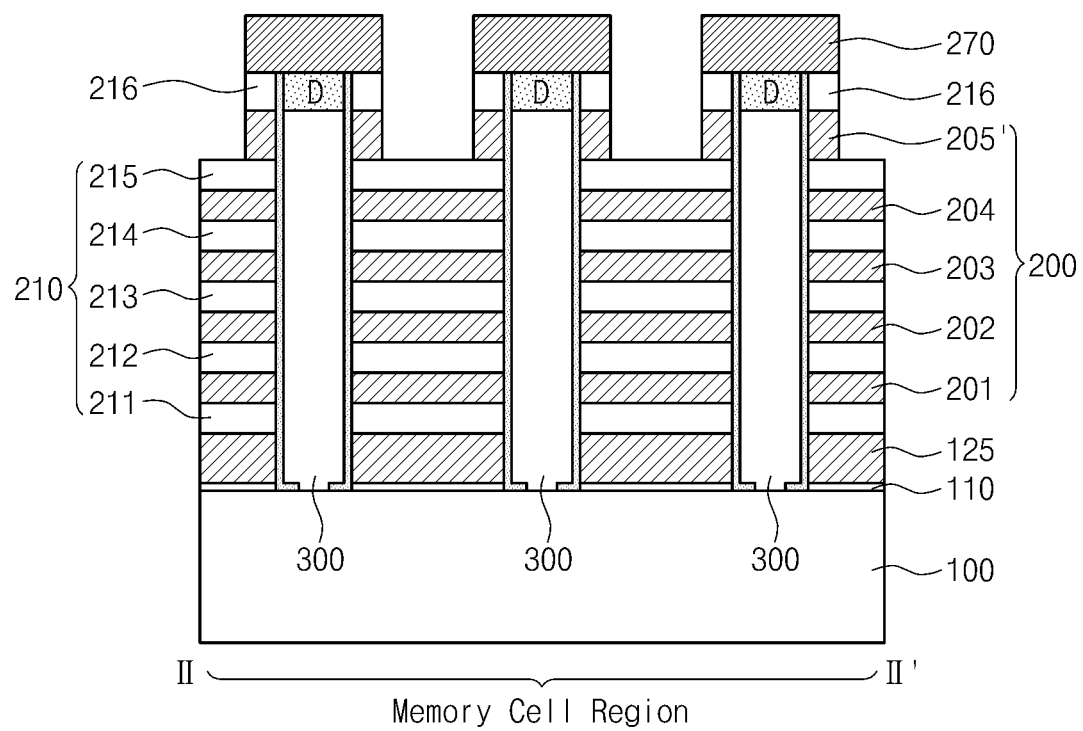

Referring to FIGS. 20A and 20B, a first conductive layer 270 is formed on, and in contact with, the drain regions D of the pillars 300. The first conductive layer 270, the uppermost interlayer dielectric layer 216 and the uppermost conductive gate layer 205 are then patterned to form upper select line USL patterns 205' that extend in the second horizontal direction.

Figure 21A:
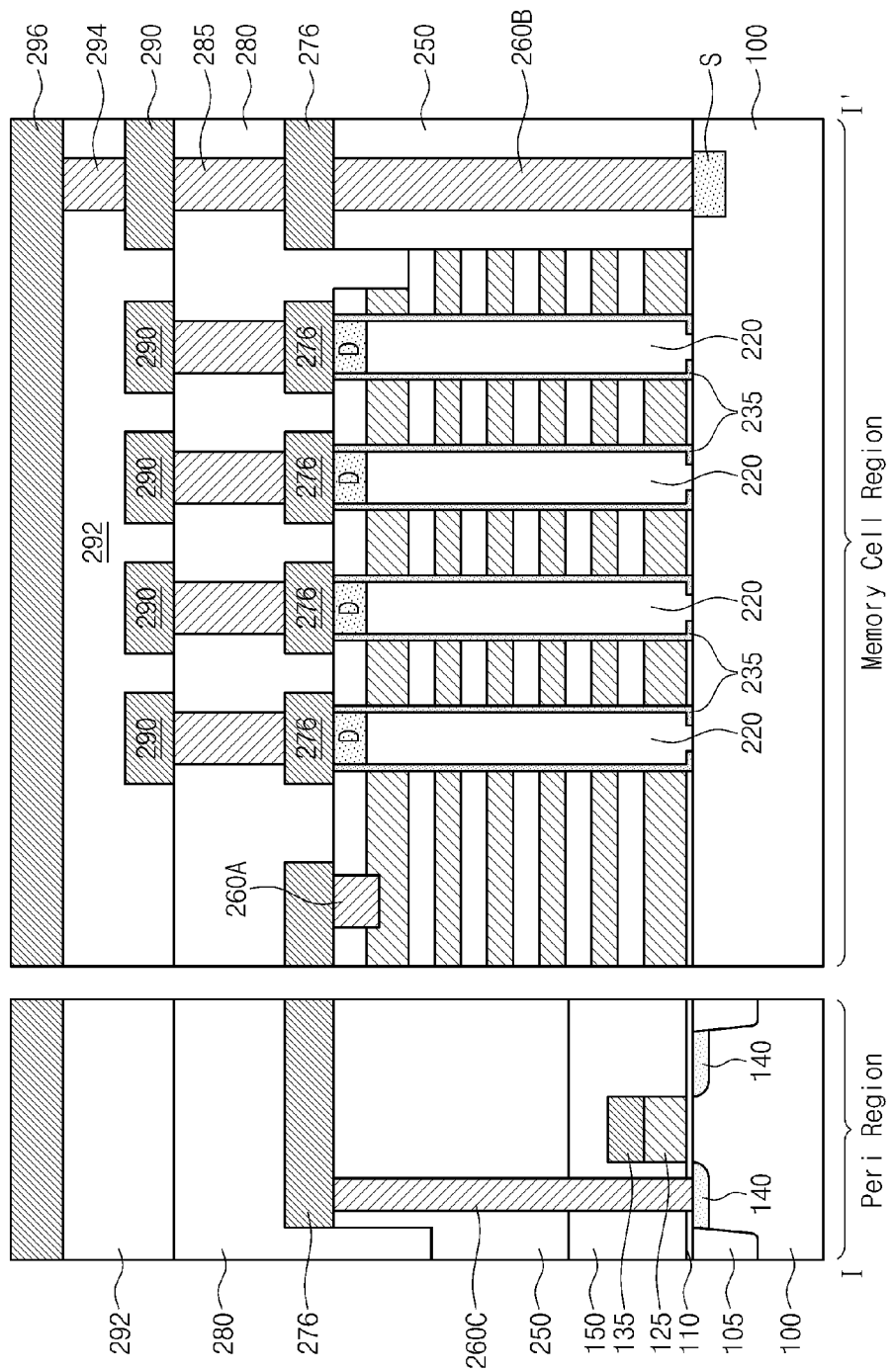
Figure 21B:
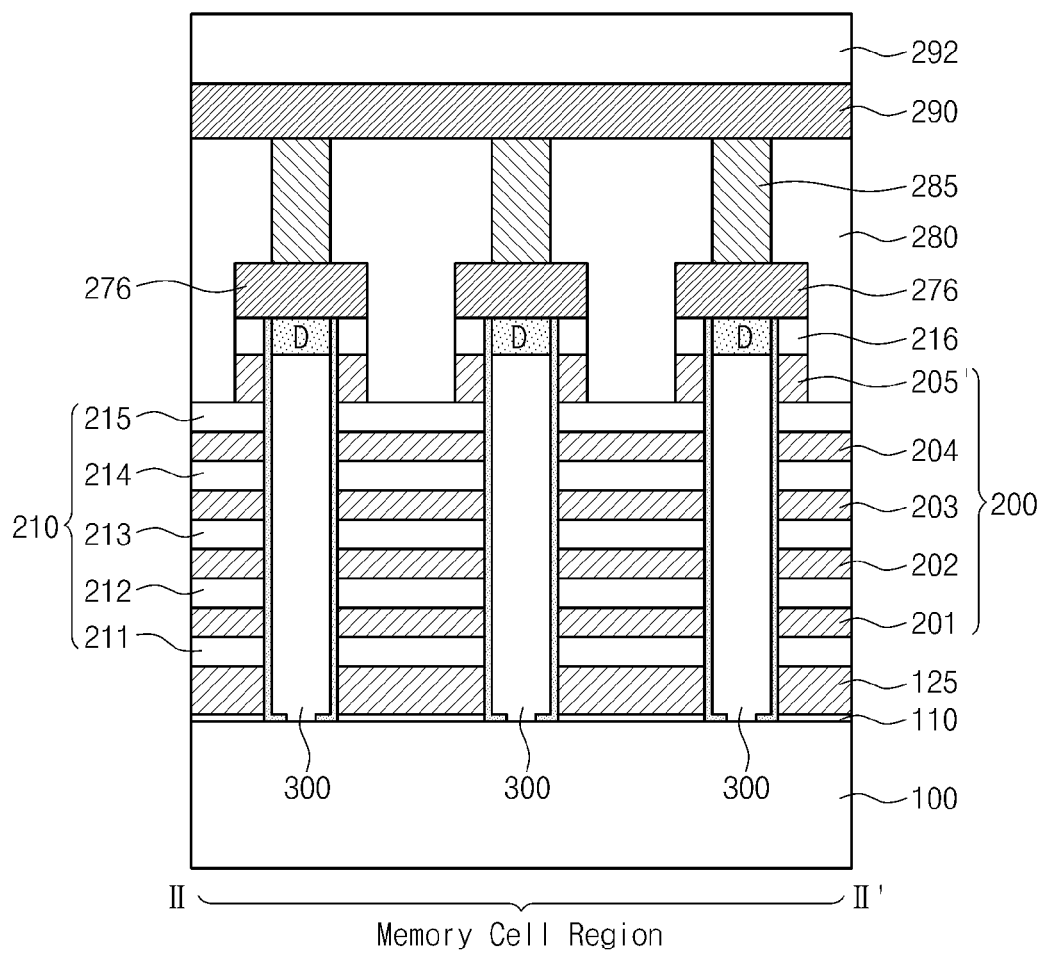

Referring to FIGS. 21A and 21B, the first conductive layer 270 is further patterned to provide pads 276 on the drains of the pillars 300. In this example, contact plug 260A in the memory cell region is connected to the contact plug 260C in the peripheral region, to connect the upper select line USL to an associated source/drain region 140 of the peripheral transistor in the peripheral region. A first upper interlayer dielectric layer 280 is then formed on the resulting structure, and contact plugs 285 are formed to make contact with the underlying conductive components, in this case, pads 276 formed of the first conductive layer 270. A second conductive layer is formed and patterned on the first upper interlayer dielectric layer 280 to form conductive lines 290 and features in contact with the underlying contact plugs 285. In the memory cell area, conductive lines that connect to the drain regions D of vertical pillars that are arranged in the first horizontal direction provide bit lines BL of the device, as shown in FIG. 3. A second upper interlayer dielectric layer 292 is then formed on the resulting structure, and contact plugs 294 formed to make contact with the underlying conductive components, in this case, contact with the rightmost feature 290 in turn in contact with the source contact plug 260B in connection with the underlying source region S. A third conductive layer is formed and patterned on the second upper interlayer dielectric layer 292 to form conductive line 296 in contact with the underlying source contact plug 260B.

In the above embodiment, the gate insulator 110 of the transistors in the peripheral region and the gate insulator 110 of the memory cell region are of the same thickness, as they are formed at the same time. Simultaneous formation of the gate insulator 110 provides for a more efficient fabrication process, thereby reducing fabrication costs.

In the above embodiment, the source/drain region 140 of the peripheral region transistors and the source region S of the memory cell region of the device are formed at different times in the process. For example, the source/drain region 140 of the peripheral region transistors are formed in connection with the process steps illustrated at FIGS. 13A and 13B, while the source region of the memory cell region of the device is formed just prior to the time of the formation of the source contact plug 260B, in connection with the process steps illustrated at FIGS. 19A and 19B.

Figure 24:
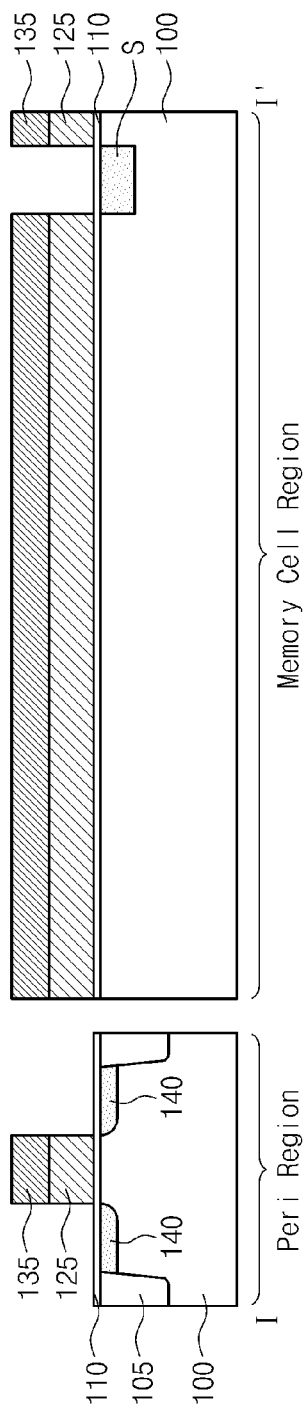
FIGS. 24 and 25 are cross-sectional views of a method of forming a vertical-channel memory device, in accordance with another embodiment of the present invention.

Referring to FIG. 24, in another embodiment, the common source region S of the memory cell region of the device can be formed at the same time as the source/drain region 140 of the peripheral region transistors. For example at the time of patterning the gate pattern 125, 135 of the peripheral transistor, the gate layers can also be patterned in the source region of the memory cell region, so that a source region S can be formed in the memory cell region using the lower gate pattern 125, 135 in the memory cell region as an ion implantation mask, according to conventional fabrication techniques.

Also in the above embodiment, the thickness of the lower-most interlayer dielectric layer 110 in the memory cell region, that is the dielectric layer between the lowermost gate pattern 125 forming the lower select plate LS_PT and the substrate, and the thickness of the lower gate insulator 110 in the peripheral region, that is the insulative layer between the gate pattern 125, 135 and the substrate 100 in the peripheral region, are the same, since the layer 110 is initially formed to cover the substrate 100 in both the peripheral and memory cell regions of the device.

Figure 25:
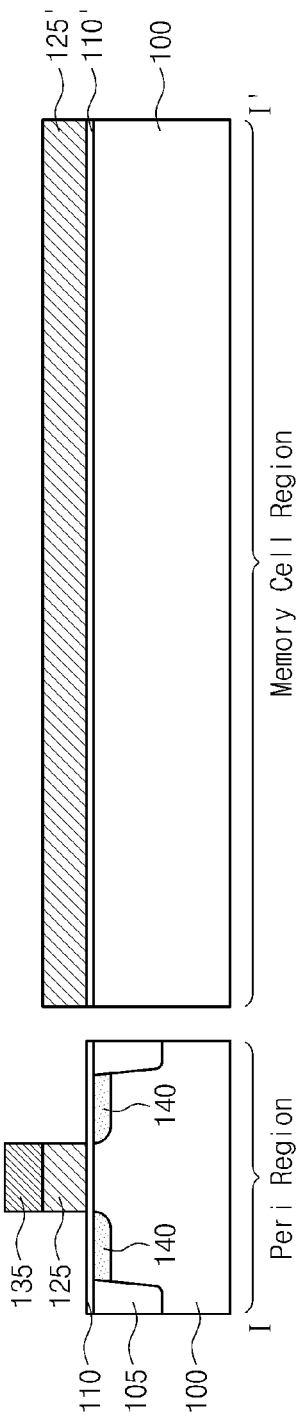

Referring to FIG. 25, in another embodiment, the thickness of the lower-most interlayer dielectric layer 110' in the memory cell region, that is the dielectric layer between the lowermost gate pattern 125 forming the lower select plate LS_PT and the substrate, and the thickness of the lower gate insulator 110 in the peripheral region, that is the insulative layer between the gate pattern 125, 135 and the substrate 100 in the peripheral region, can be different. In this case, the layers 110', 110 can be formed at different times, prior to formation of the first and second lower gate layer patterns 125, 125 and 125'. Also, where desired, the layers 110', 110 can be formed of different materials.

FIGS. 26-39 are perspective views of a method of forming a vertical-channel memory device, in accordance with another embodiment of the present invention.

Figure 26:
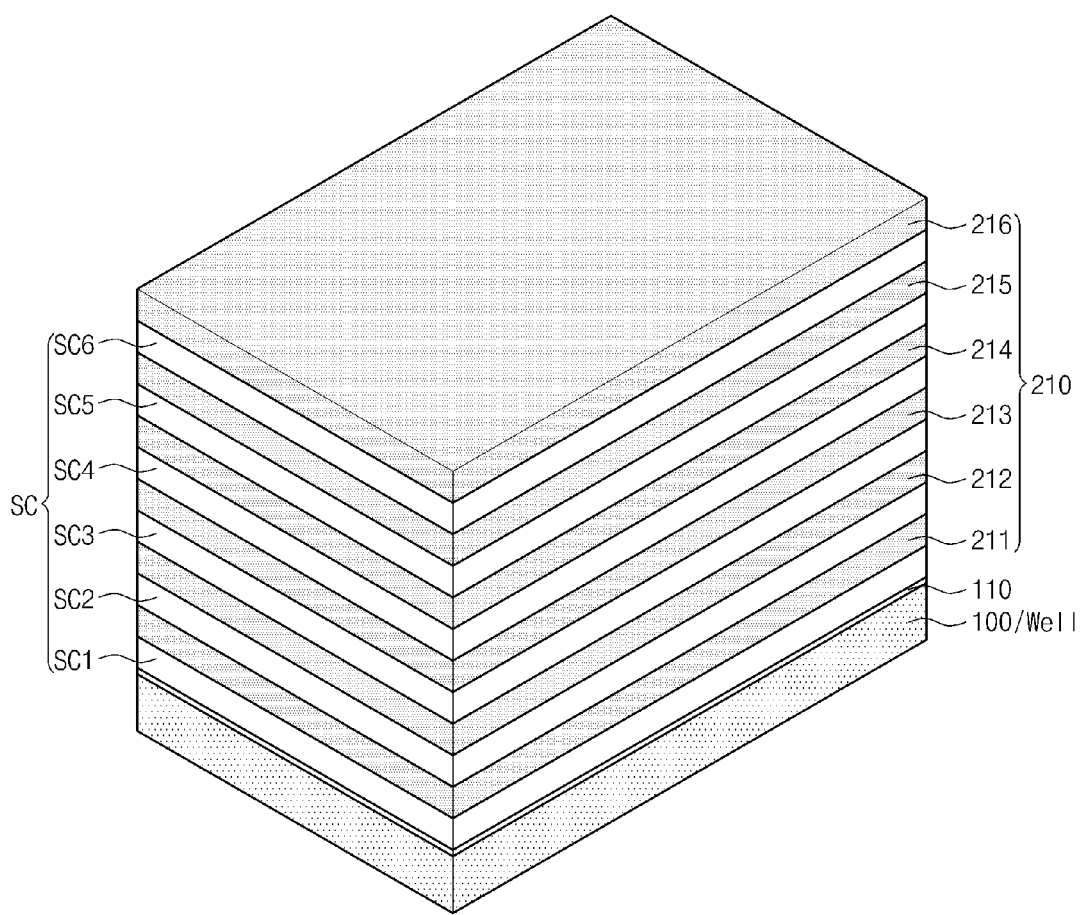
FIGS. 26-39 are perspective views of a method of forming a vertical-channel memory device, in accordance with another embodiment of the present invention.

Referring to FIG. 26, a substrate 100 is prepared. In one embodiment, the substrate 100 comprises a single-crystal semiconductor material substrate that provides a seed layer for later formation of the single-crystal vertical pillars PL. In other embodiments the substrate comprises a polycrystalline semiconductor material. A lower-most interlayer dielectric layer 110 is provided on the substrate. In certain embodiments of the present invention, the lower-most interlayer dielectric layer 110 is sufficiently thin so that an inversion layer can be created in the underlying semiconductor material of the substrate 100 when a suitable voltage is applied to a resulting lowermost gate layer LS_PT (see FIG. 39, below). Multiple alternating interlayer dielectric layers 210, including in this example, layers 211, 212, 213, 214, 215, and 216 and multiple sacrificial layers SC, including in this case, layers SC1, SC2, SC3, SC4, SC5, and SC6 are formed on the lower-most interlayer dielectric layer 110. In one embodiment, the interlayer dielectric layers 210 and the sacrificial layers SC have etch selectivity with respect to each other. For example, the interlayer dielectric layers 210 can comprise silicon nitride and the sacrificial layers SC can comprise silicon oxide. In one embodiment, the sacrificial layers SC are formed of a material that can readily be removed by a wet etching process.

Figure 27:
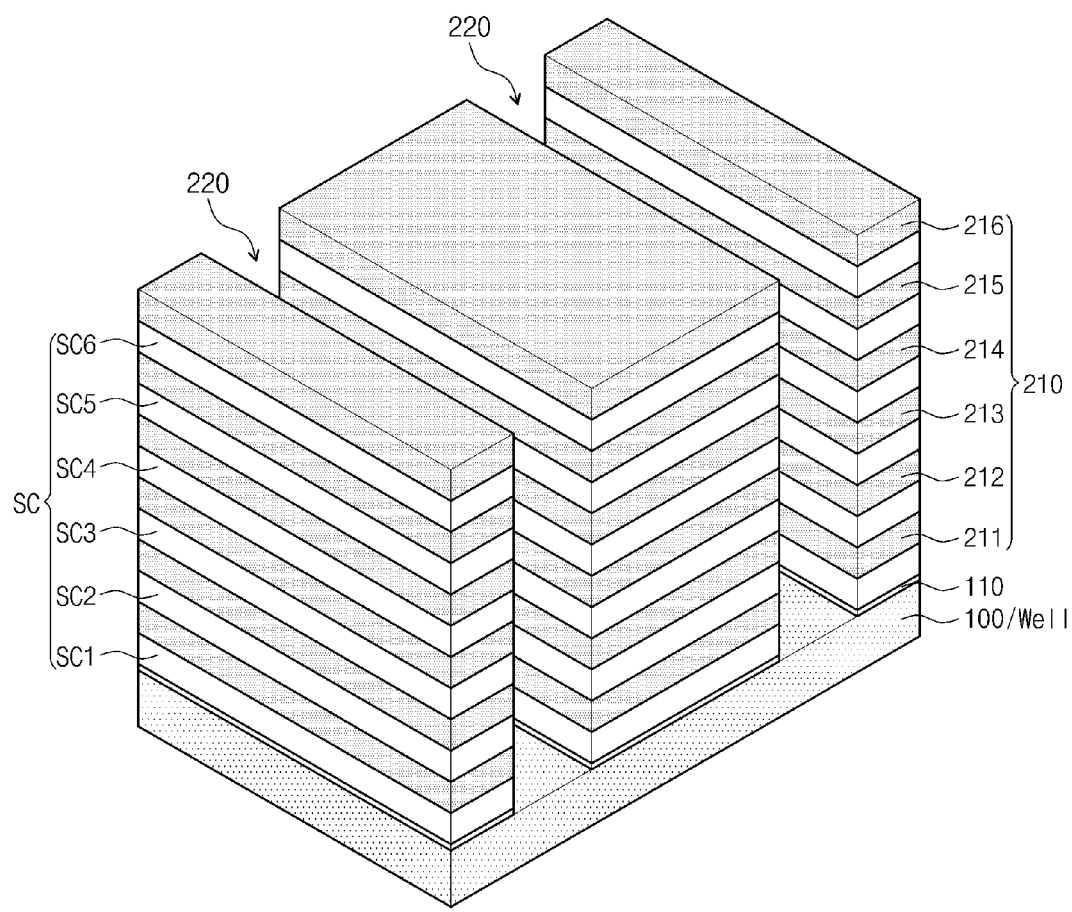

Referring to FIG. 27, first line-type openings 220 are formed through the interlayer dielectric layers 210, the sacrificial layers SC, and the lower-most interlayer dielectric layer 110 in a vertical direction, and spaced apart in a horizontal direction, as shown. The first openings 220 expose upper portions of the underlying substrate 100 and extend in a first direction of horizontal extension.

Figure 28:
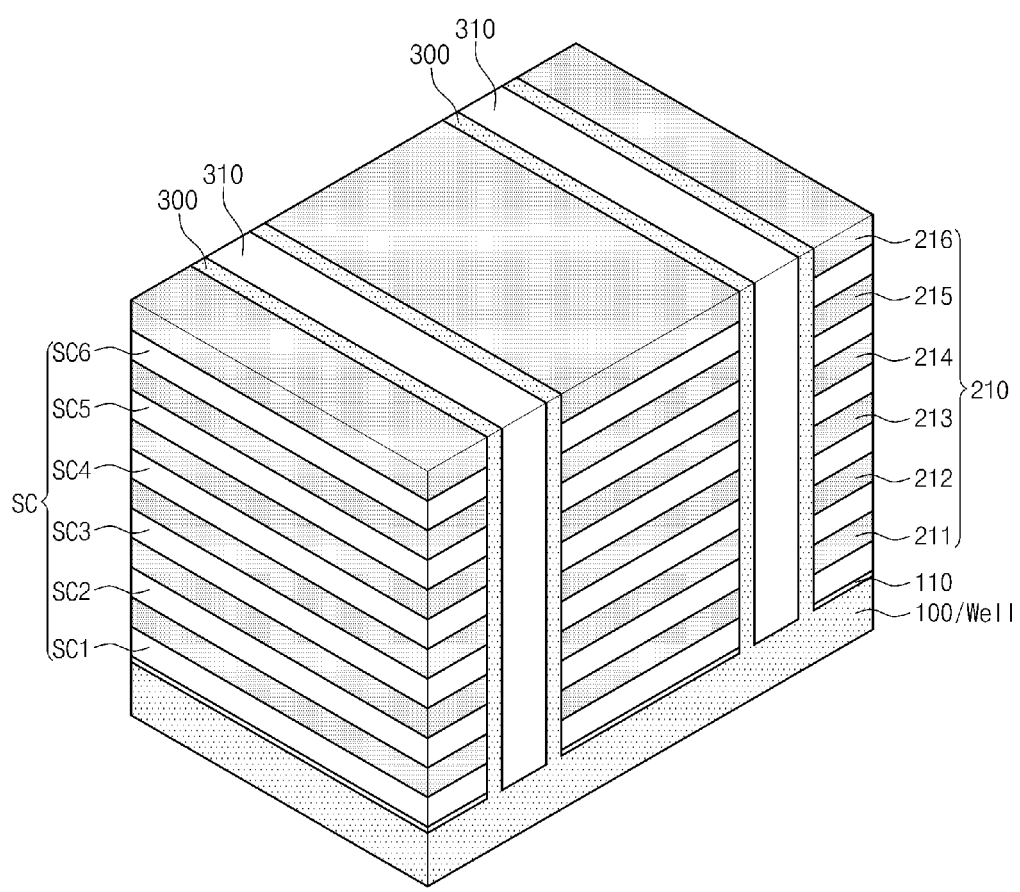
Figure 29:
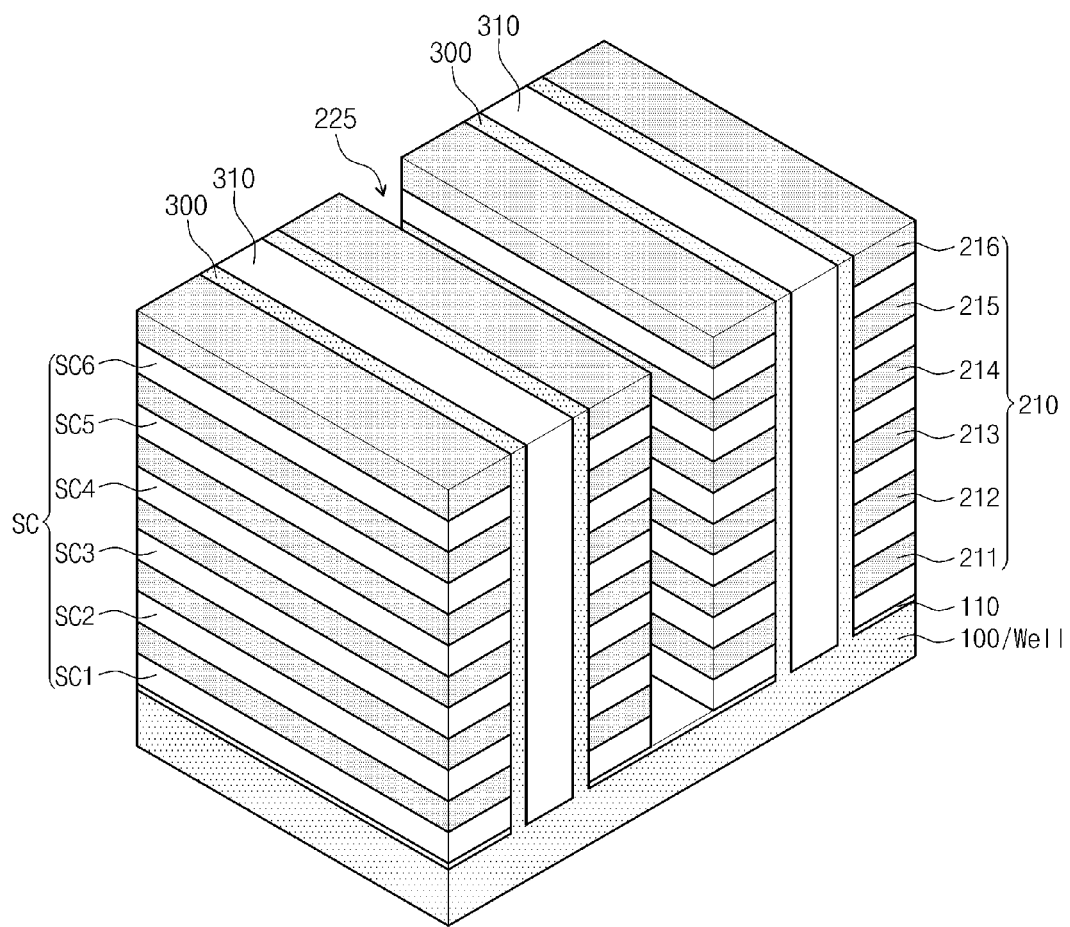

Referring to FIG. 28, a semiconductor liner layer 300 is formed on sidewalls and on a bottom of the first openings 220. An insulating layer 310 is then provided to fill the remainder of the first openings 220. The semiconductor liner layer will form the vertical pillars PL for the resulting device, and can be formed, for example, in the manner described above in connection with FIGS. 18A and 18B. In the present example, a "macaroni"-type pillar is shown. Referring to the close-up view of FIG. 23 described above, the "macaroni"-type pillar PL includes a cylindrical shell or walls of semiconductor material 301A surrounding an insulative, or hollow, core 301B Referring to FIG. 29, a plurality of second openings 225 extending in the first horizontal direction are formed between neighboring semiconductor liners 300. In one embodiment, the second openings 120 expose the lower-most interlayer dielectric layer 110. This procedure permits access to a region where the control gates and floating gates of the resulting gate insulating layer 230 (see FIG. 31 below) of the memory device will be formed along sidewalls of the resulting semiconductor liner layers 300, eventually comprising the vertical pillars of the device.

Figure 30:
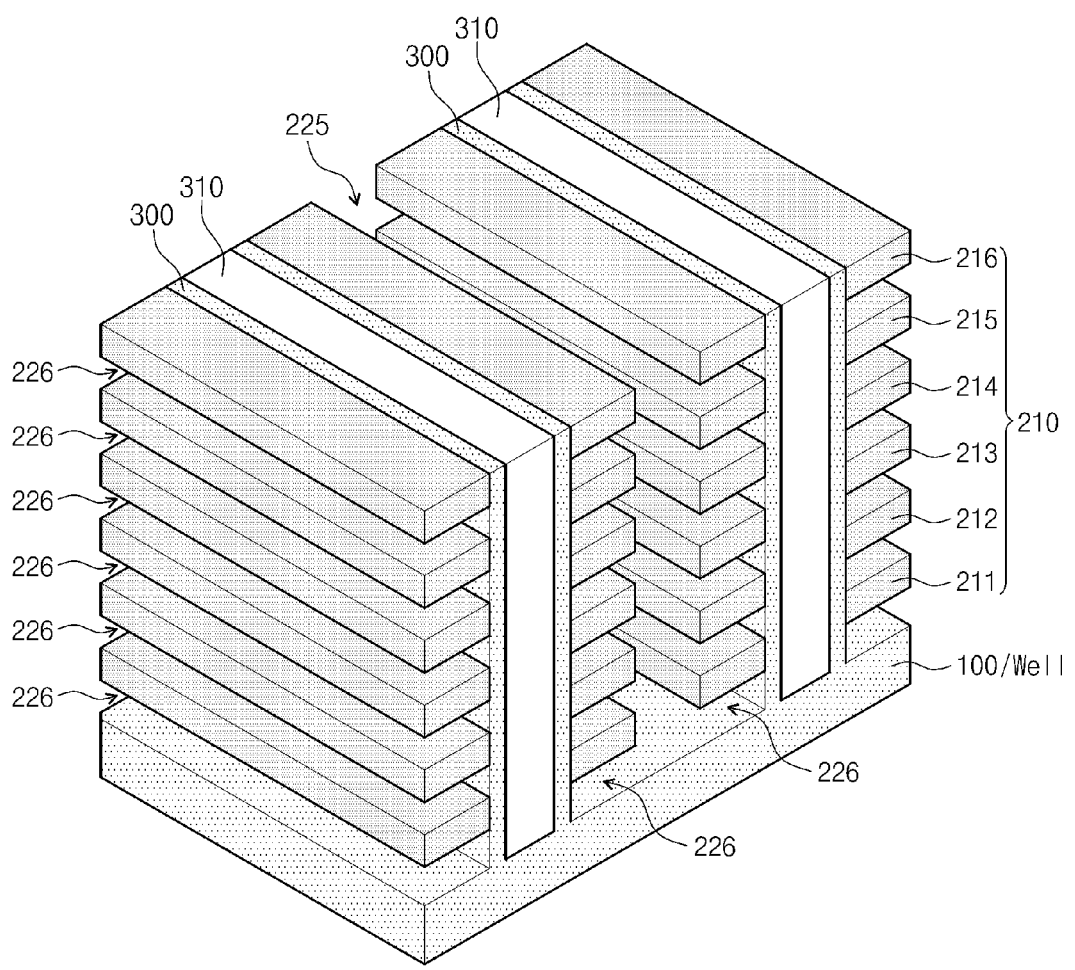

Referring to FIG. 30, the sacrificial layer patterns SC including, for example, SC1, SC2, SC3, SC4, SC5, and SC6 are removed by a wet etching process. In a case where the lower-most interlayer dielectric layer 110 is formed of a same material as the sacrificial layer patterns SC, exposed portions of the lower-most interlayer dielectric layer 110 are likewise removed. In an example where the sacrificial layer patterns SC are formed of silicon nitride, the etchant of the wet etching process can comprise an HF solution. Resulting concave openings 226 extend from the second opening 225 in the second horizontal direction of extension and lie adjacent the walls of the silicon semiconductor liners 300 to expose outer sidewalls thereof.

Figure 31:
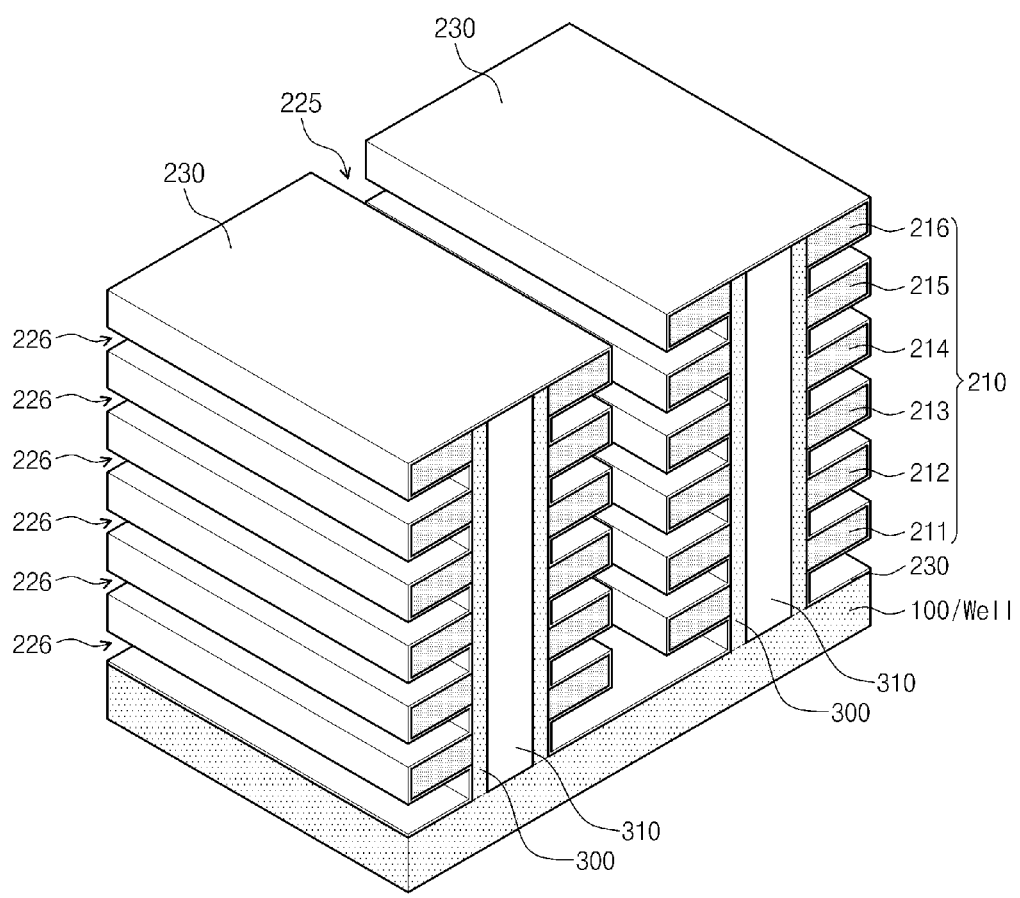

Referring to FIG. 31, a gate insulating layer 230 is provided on the resulting structure. The gate insulating layer 230 covers interior walls of the concave openings 226, including covering the exposed outer sidewalls of the semiconductor liners 300. As described above in connection with FIG. 17 and FIGS. 22 and 23, in certain embodiments, the gate insulating layer 230 can comprise a charge storage layer so that the device can operate as a non-volatile memory device. In some embodiments, the gate insulating layer 230 comprises a tunnel oxide layer 231, a charge trapping layer 232 and a blocking insulating layer 233 that are sequentially formed in the second opening 225 and on lower, side, and upper walls of the concave openings 226. In one embodiment, the tunnel oxide layer 231 can be formed using a thermal oxidation process, which makes it more resistant to degradation over time, leading to improved device reliability and endurance.

In various embodiments, the charge trapping layer 232 can be a floating-gate structure, for example, comprising a polysilicon material, or can comprise an ONO (oxide-nitride-oxide) structure. A floating-gate charge trapping layer 232 is possible in accordance with the present embodiment, since access is gained at the concave openings 226. The blocking oxide layer 233 can comprise, for example, silicon oxide, or other suitable high-k oxide layer.

Figure 32:
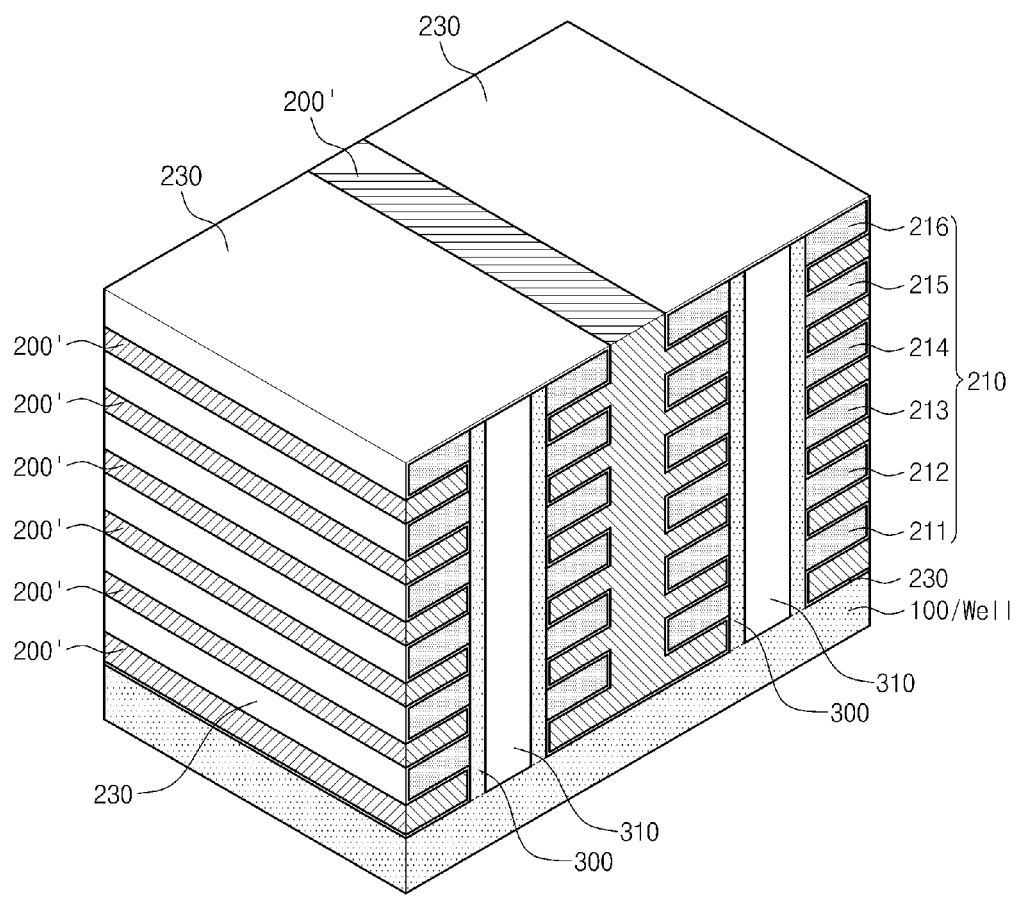

Referring to FIG. 32, a gate conductive layer 200' formed of a conductive material is provided to fill the second openings 225, including the concave openings 226. In one embodiment, the conductive material comprises tungsten silicide.

Figure 33:
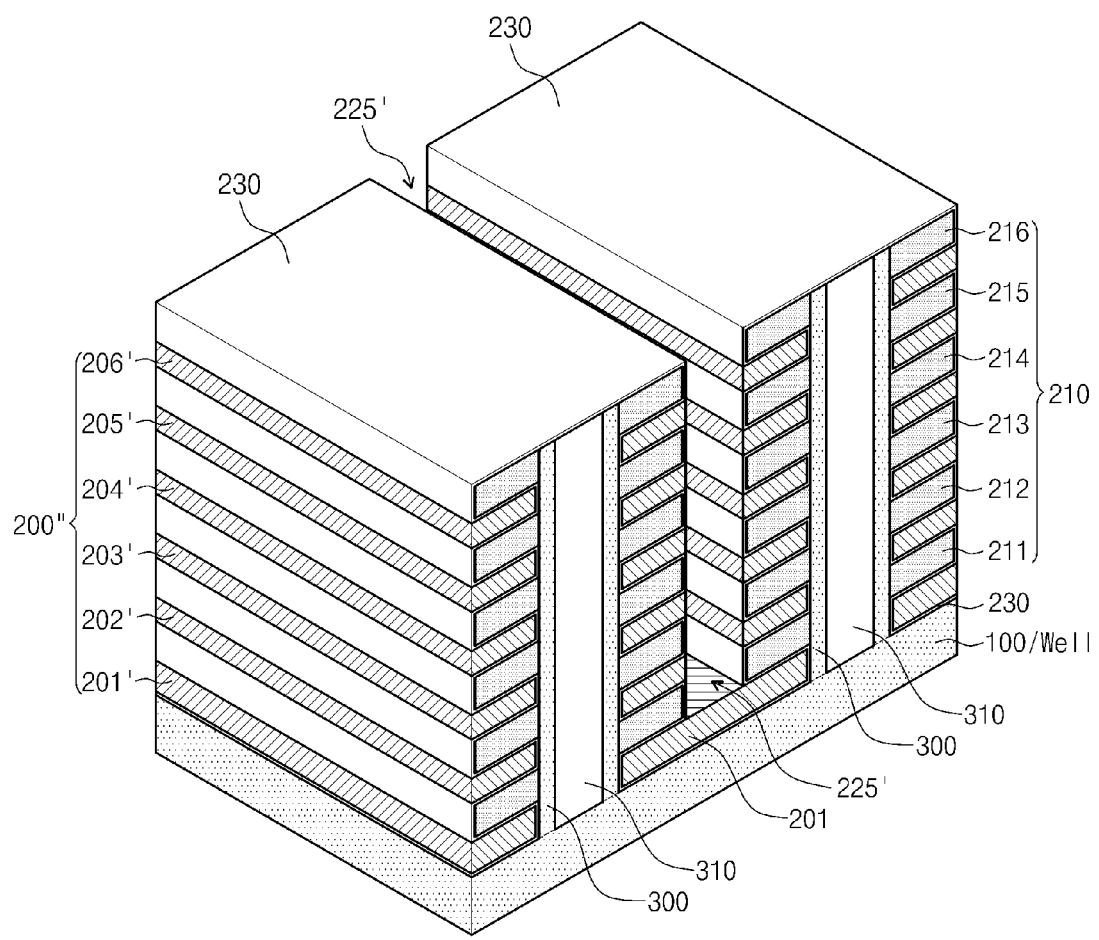

Referring to FIG. 33, the central portions of the gate conductive layer 200' are etched, forming third openings 225' that separate portions of the gate conductive layer 200' into gate patterns 200", including gate patterns 201', 202', 203', 204', 205' and 206'. Lower-most gate pattern 201' will become a lower select plate LS_PT for the device, while gate patterns 202', 203', 204', and 205' will become word line plates WL_PT for the device. The upper-most gate pattern 206' will become an upper select gate for the device. As a result of this processing step, lower-most gate pattern 201' can remain intact, or partially etched, as shown, in a case where the lower select plate LS_PT operates as a select plate for all vertical pillars in the array. In an embodiment where the gate insulating layer 230 includes a charge trapping layer, this processing step also operates to separate the charge trapping layer into individual charge trapping layer patterns.

Figure 34:
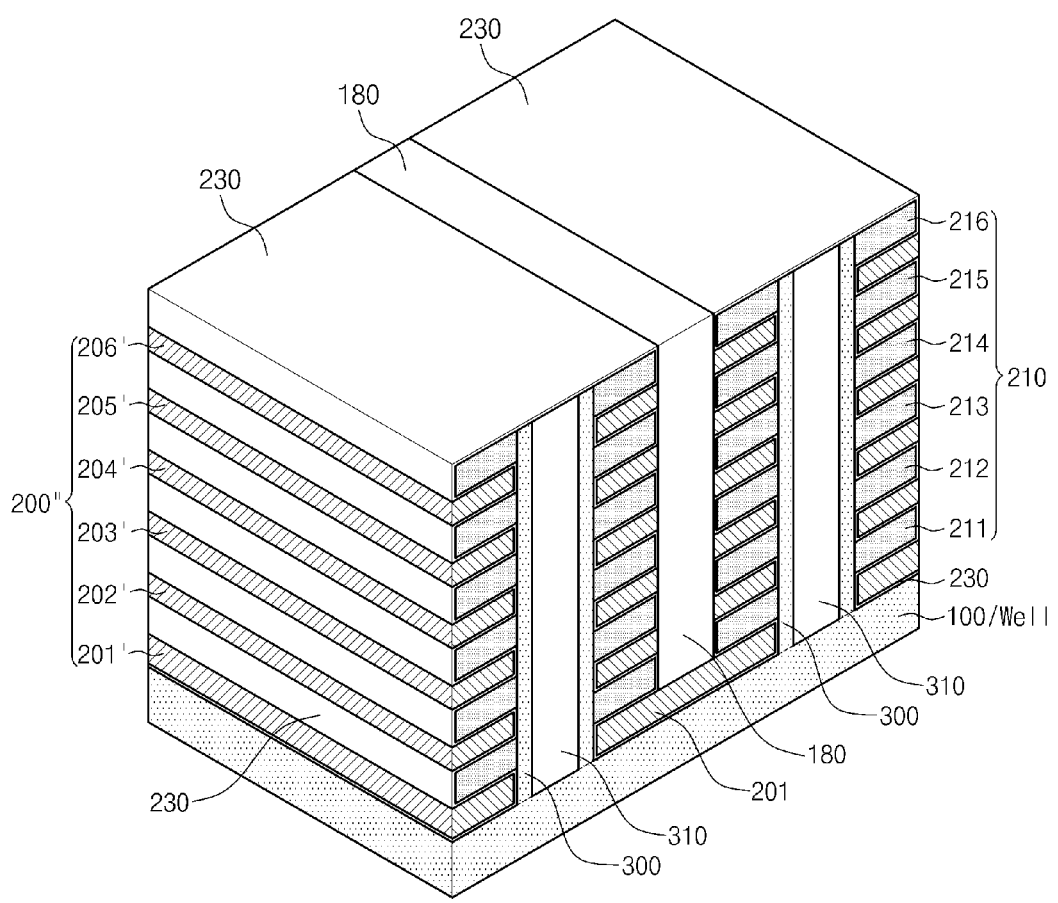

Referring to FIG. 34, the third openings 225' are filled with an insulative material to form an insulation pattern 180.

Figure 35:
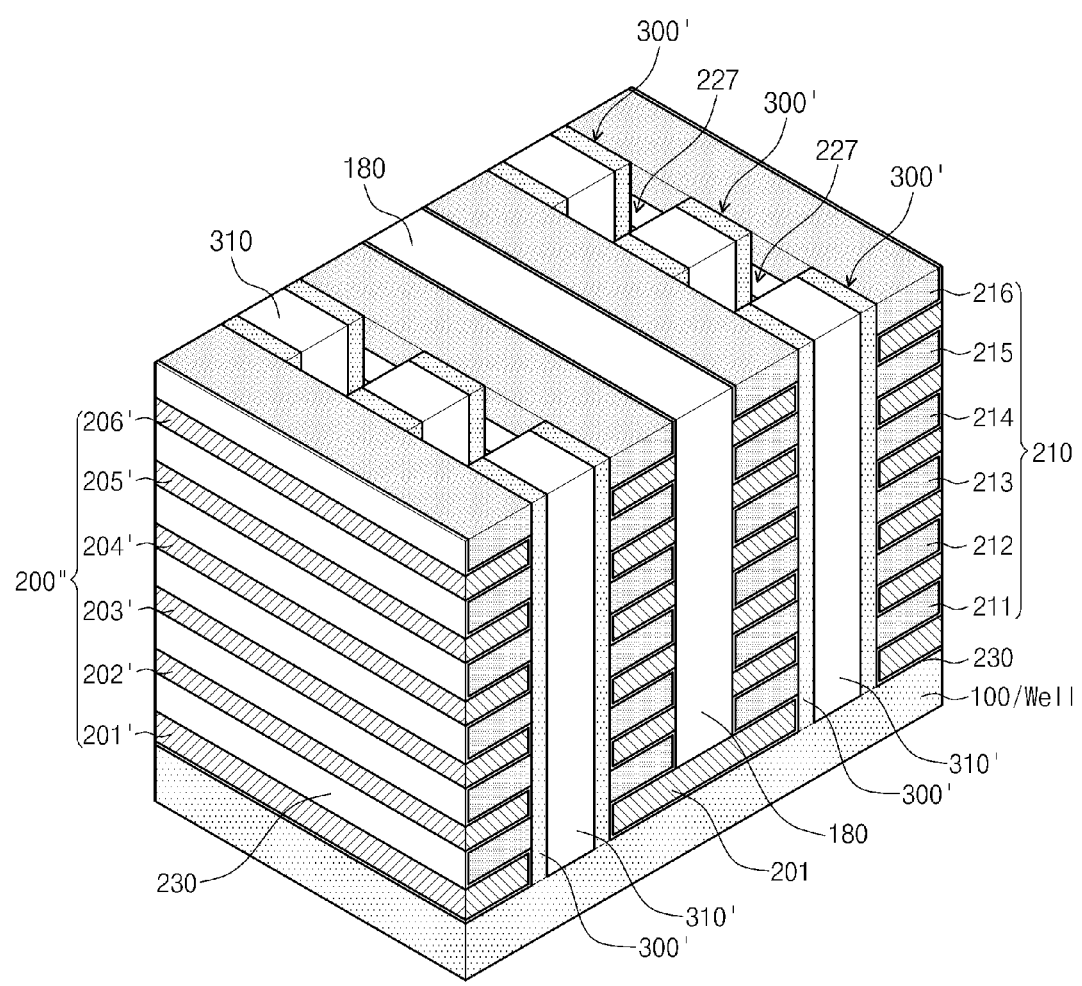

Referring to FIG. 35, the semiconductor liners 300 and associated insulating layers 310 are pattered and etched to form fourth openings 227 that separate the liners 300 in the first horizontal direction into independent vertical pillars 300'. The fourth openings 227 are then filled with an insulating material to electrically insulate the vertical pillars 300' in the first horizontal direction.

Figure 36:
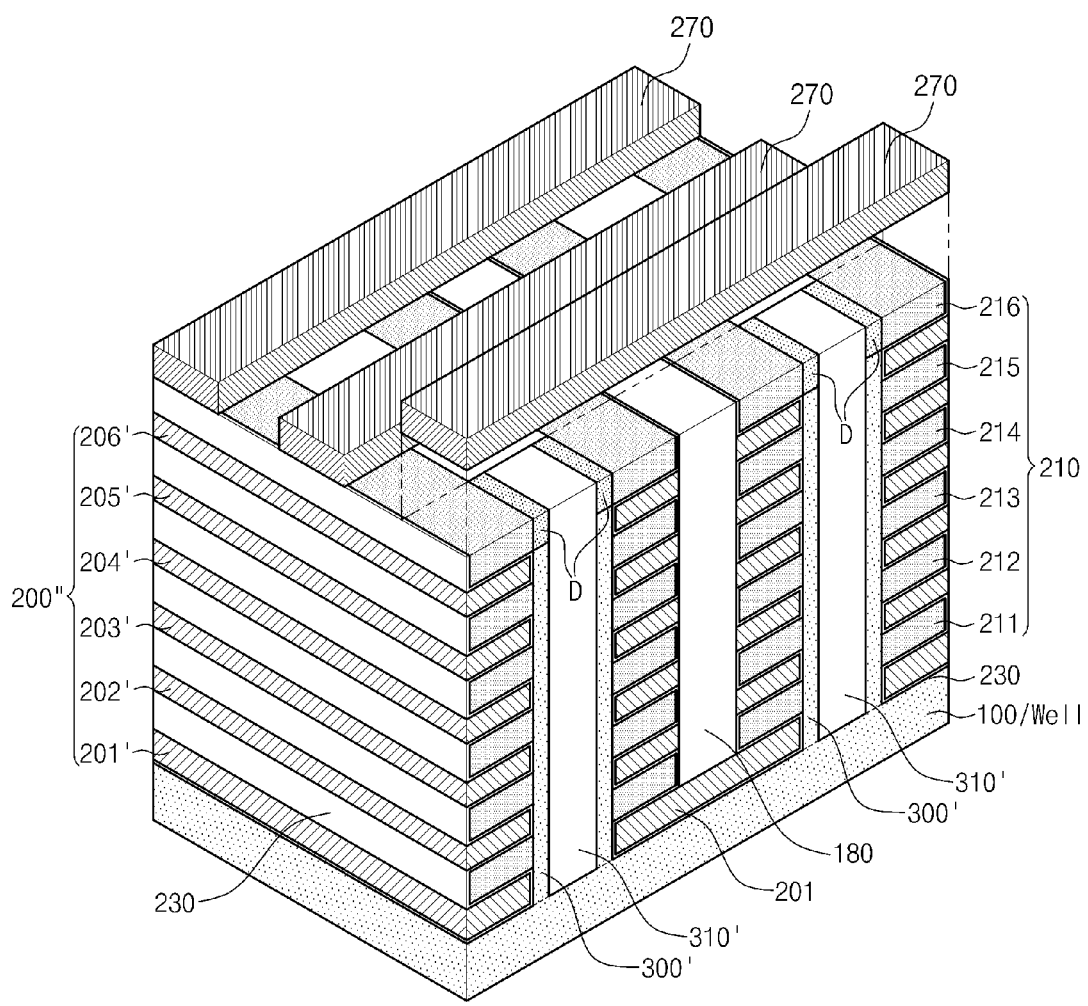
Figure 37:
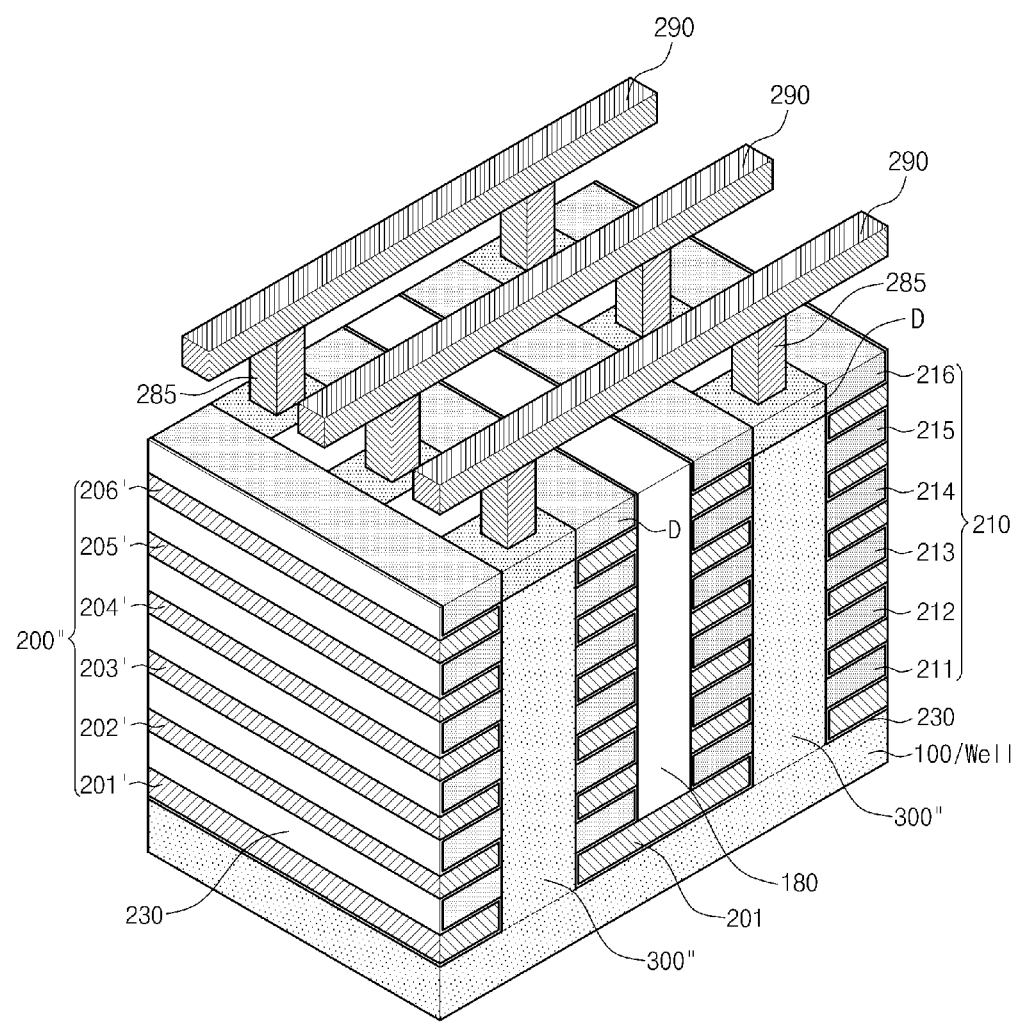

Referring to FIG. 36, drain regions D are formed at the tops of the pillars 300' using standard doping techniques. First conductive patterns 270 can then be formed and patterned to make electrical contact with the drain regions D of the tops of pillars 300' arranged in a second horizontal direction of extension of the device. Referring to FIG. 37, an alternative embodiment is shown. In this embodiment, the pillars 300'' are solid semiconductor pillars PL, rather than the shell-type macaroni pillars 300' of FIG. 36. Also, in this embodiment, vertical contact plugs 285 make contact, in a vertical direction, with drain regions D at the tops of the pillars 300''. The vertical contact plugs 285 are formed through an interlayer dielectric layer (not shown). First conductive patterns 290 are then formed and patterned to make electrical contact with the drain regions D of the tops of pillars 300' arranged in the second horizontal direction of extension of the device.

Figure 38:
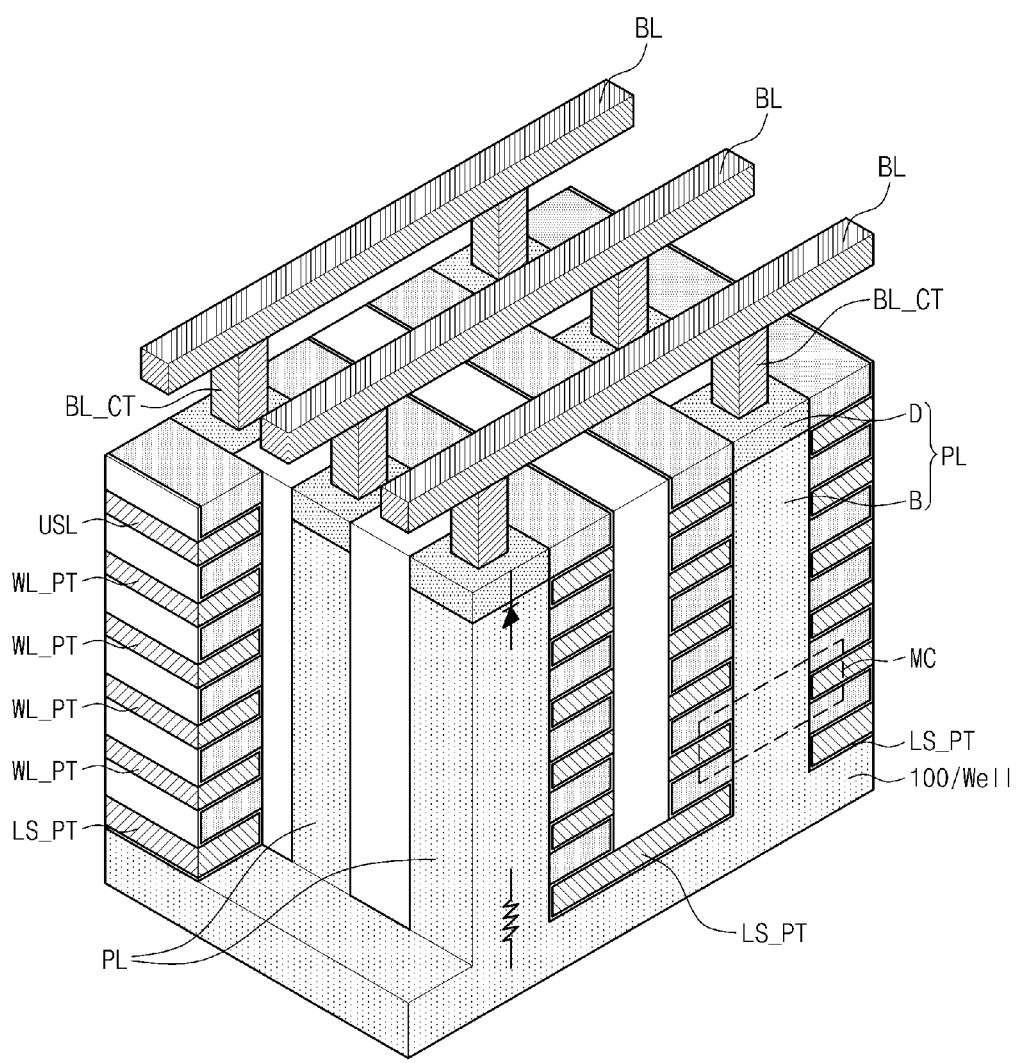
Figure 39:
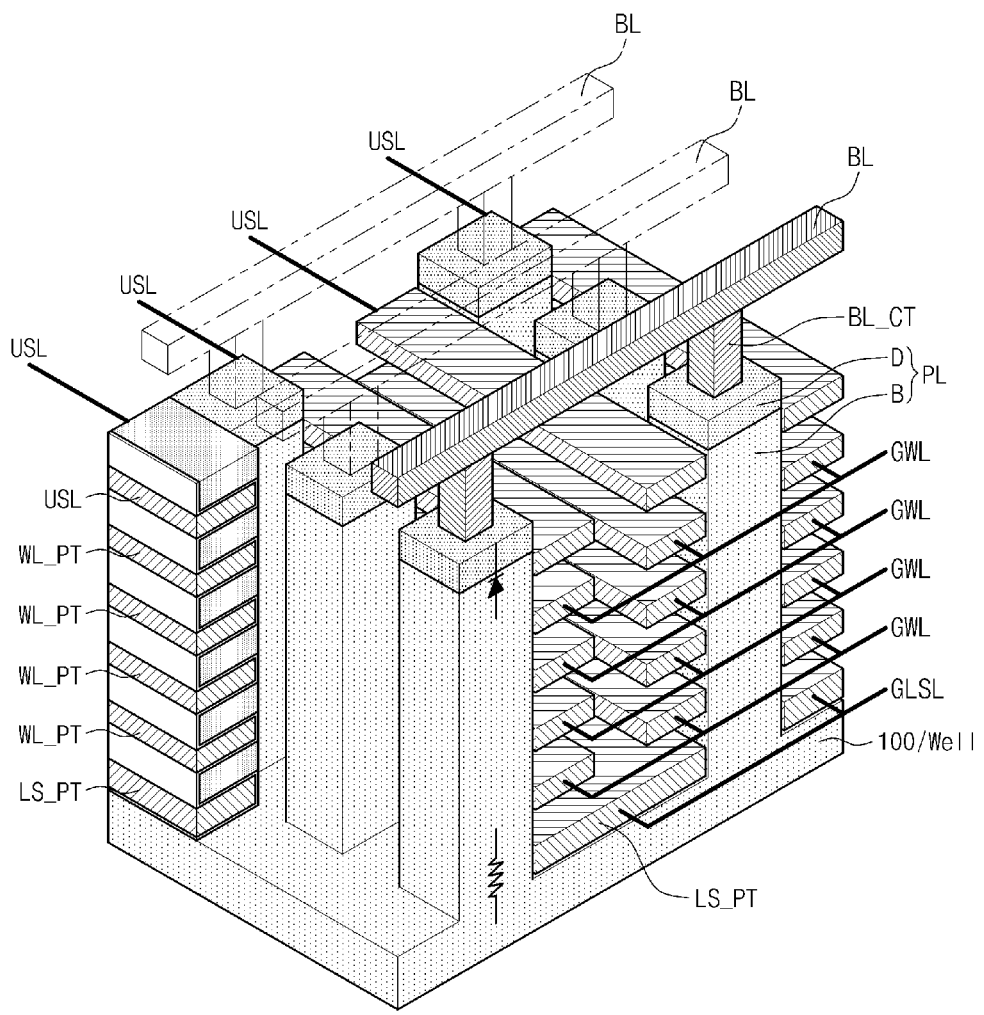

Referring to FIGS. 38 and 39, it can be seen that lower-most gate pattern 201' provides a lower select plate LS_PT for the resulting device, while gate patterns 202', 203', 204', and 205' provide word line plates WL_PT that are connected to global word lines GWL for the device. The word line plates WL_PT extend in the first direction of horizontal extension of the device. The upper-most gate patterns 206' provide a plurality of upper select gates each select gate being connected to an independent upper select line USL for the device. The conductive patterns 270, 290 extending in the second direction of horizontal extension of the device provide bit lines BL for the resulting device, each bit line connected to the drain regions of corresponding vertical pillars PL by bit line contacts BL_CT.

In the view of FIG. 39 it can be seen that the vertical pillars PL each include a body region B along most of its length and a drain region D at the top portion. The junction between the semiconducting body region B and the doped drain region D behaves as a diode junction. It can also be seen in this view that bottom portions of the pillars PL are directly connected to the underlying substrate or well 100. Therefore, the bottom portions of the pillars PL at their intersection with the substrate do not behave as a diode junction, but rather as a direct, resistive, contact. Memory cells MC are positioned along the vertical pillars, each memory cell MC being accessed by an associated word lines plate WL_PT coupled to an associated global word line WL and associated bit line BL.

FIGS. 40A-42A are cross-sectional views taken along section line I-I' of FIG. 2, and FIGS. 40B-42B are cross-sectional views taken along section line II-II' of FIG. 2, of a method of forming a vertical-channel memory device, in accordance with another embodiment of the present invention.

Figure 40A:
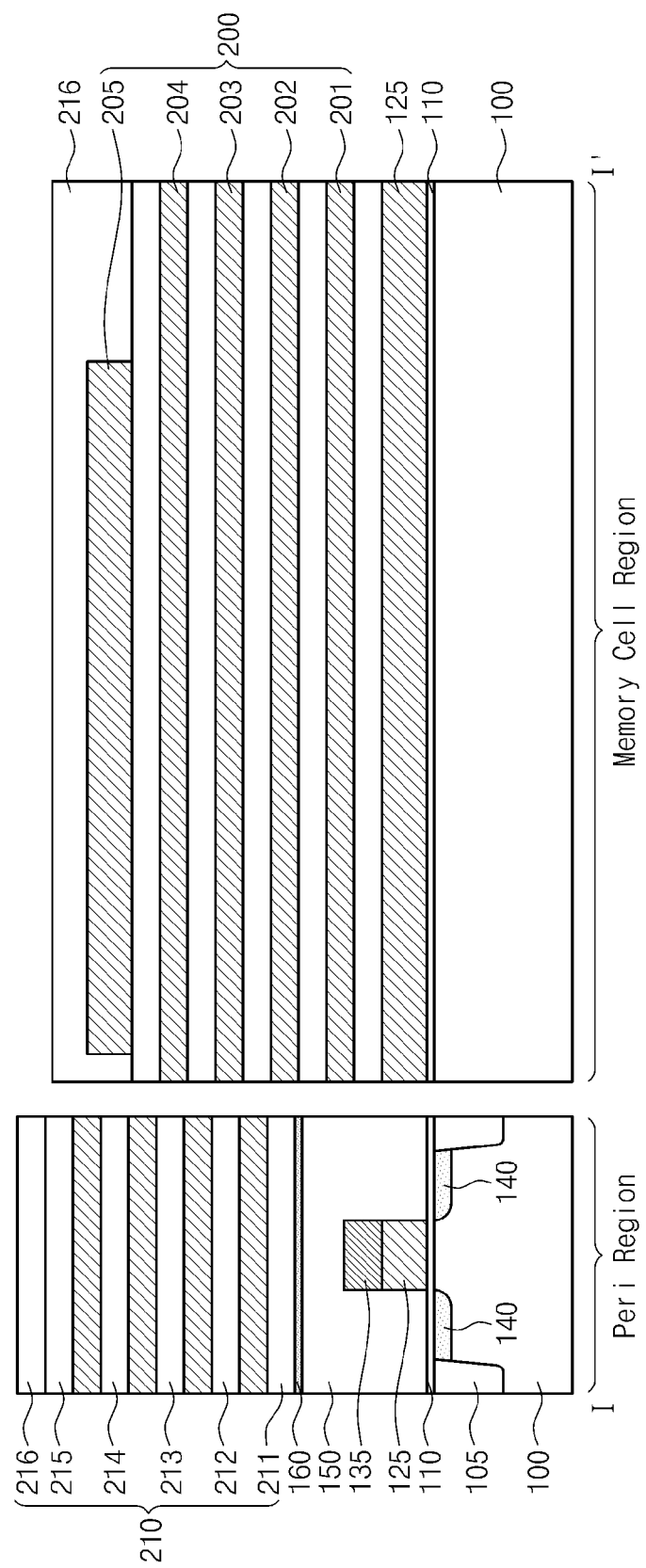
FIGS. 40A-42A are cross-sectional views taken along section line I-I' of FIG. 2, and FIGS. 40B-42B are cross-sectional views taken along section line II-II' of FIG. 2, of a method of forming a vertical-channel memory device, in accordance with another embodiment of the present invention.
Figure 40B:
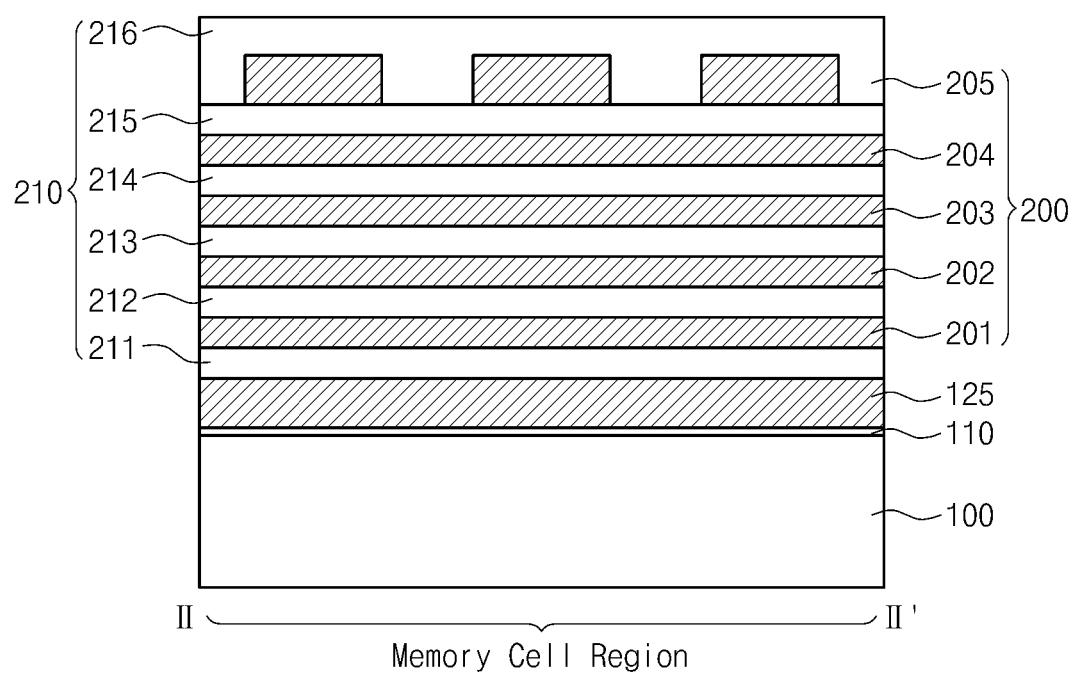

Referring to FIGS. 40A and 40B, in the present embodiment, the upper select line USL, rather than being initially formed as a continuous plate (see, for example, uppermost gate layer 205 of FIGS. 15A and 15B) that is later patterned during the processing steps shown and described in connection with FIGS. 20A and 20B, can instead be initially patterned to form individual lines 205 that extend in the second horizontal direction of extension, as shown in FIGS. 40A and 40B.

Figure 41A:
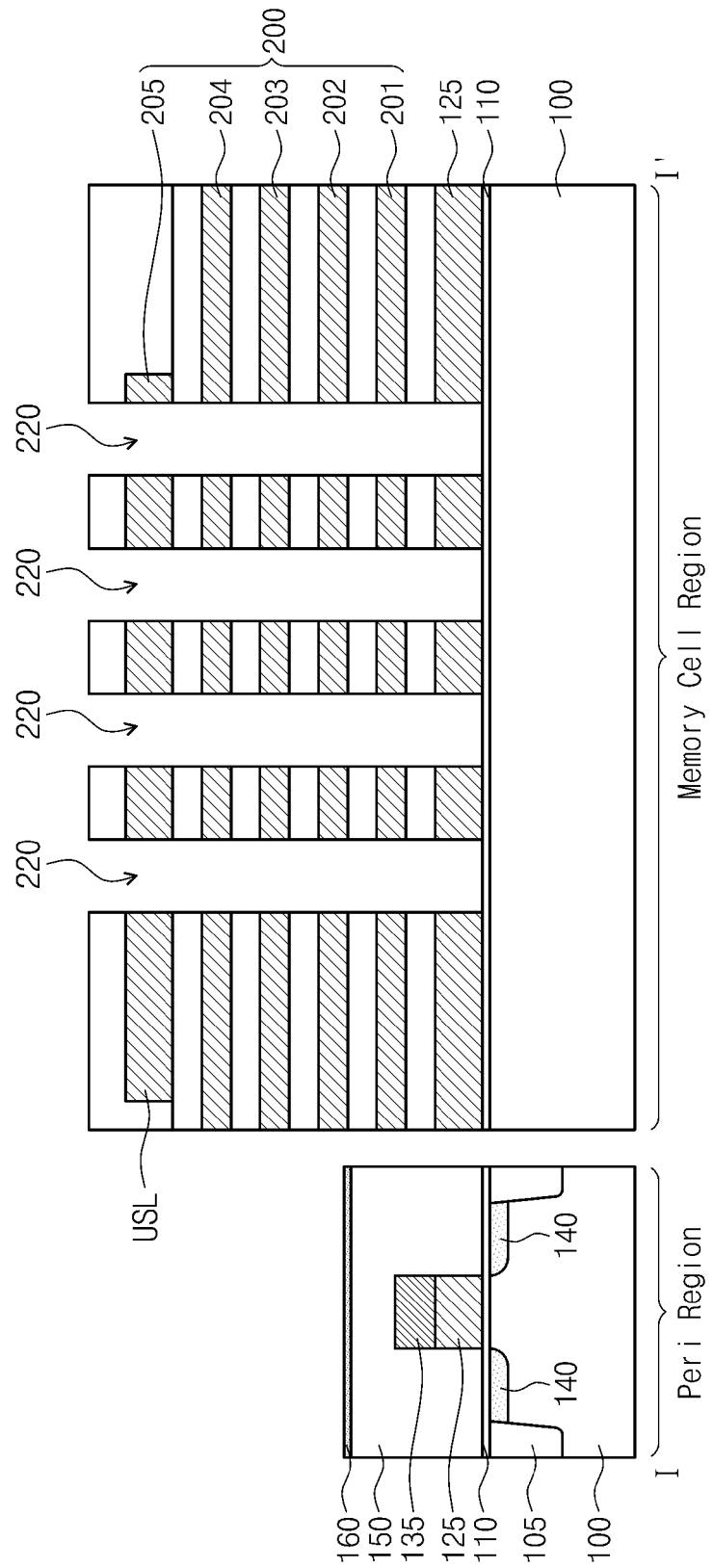
Figure 41B:
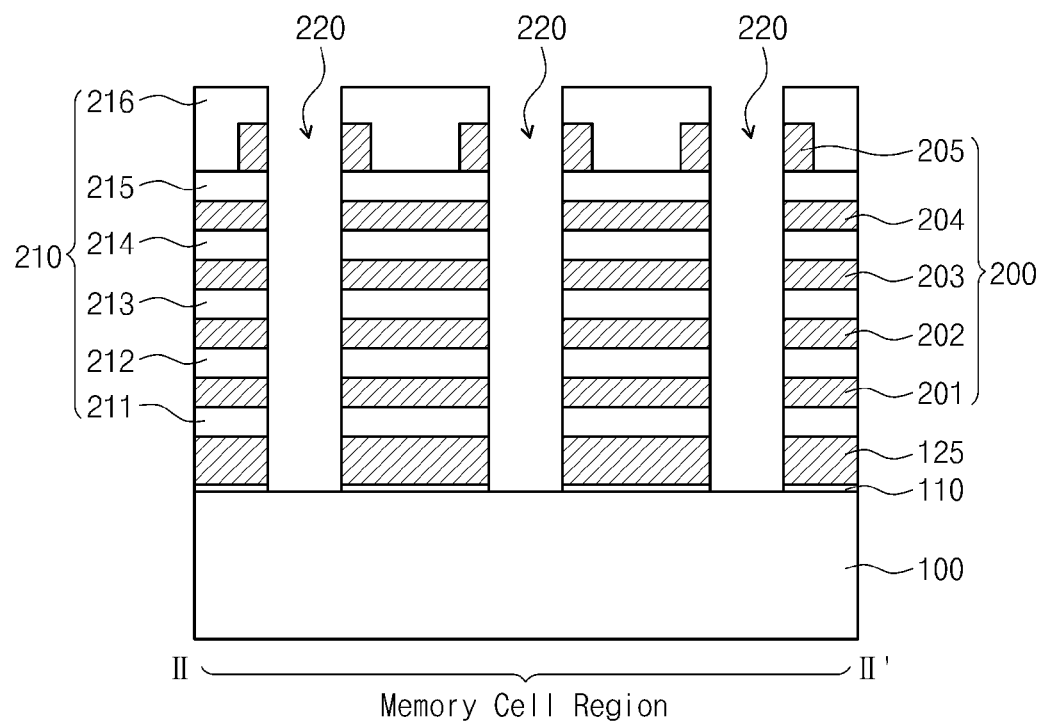

Referring to FIGS. 41A and 41B, the vertical openings 220 can then formed as shown to pass through the central portions of the lines 205, according to the processing steps described above in connection with FIGS. 16A and 16B.

Figure 42A:
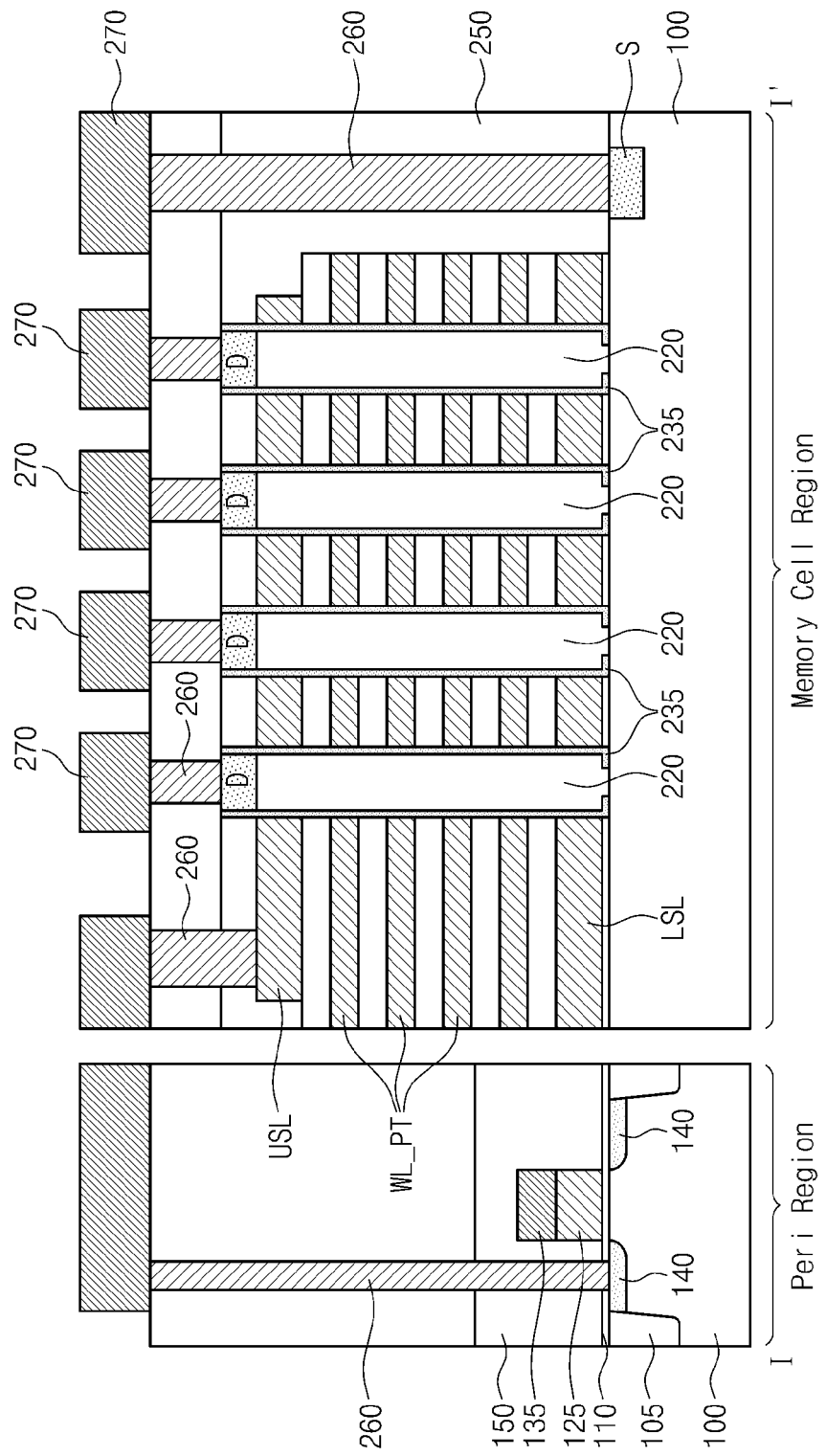
Figure 42B:
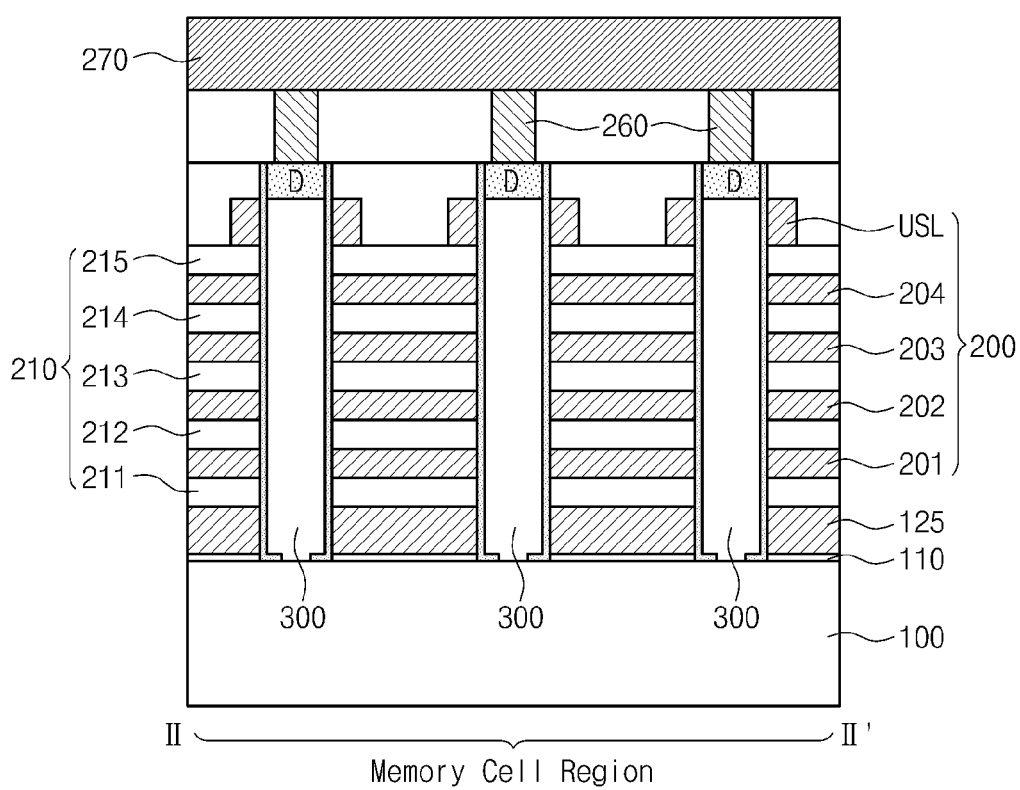

Referring to FIGS. 42A and 42B, processing steps can be performed to complete the resulting device, for example, according to the manner described above in connection with FIGS. 17A, B-21A, B.

Figure 43:
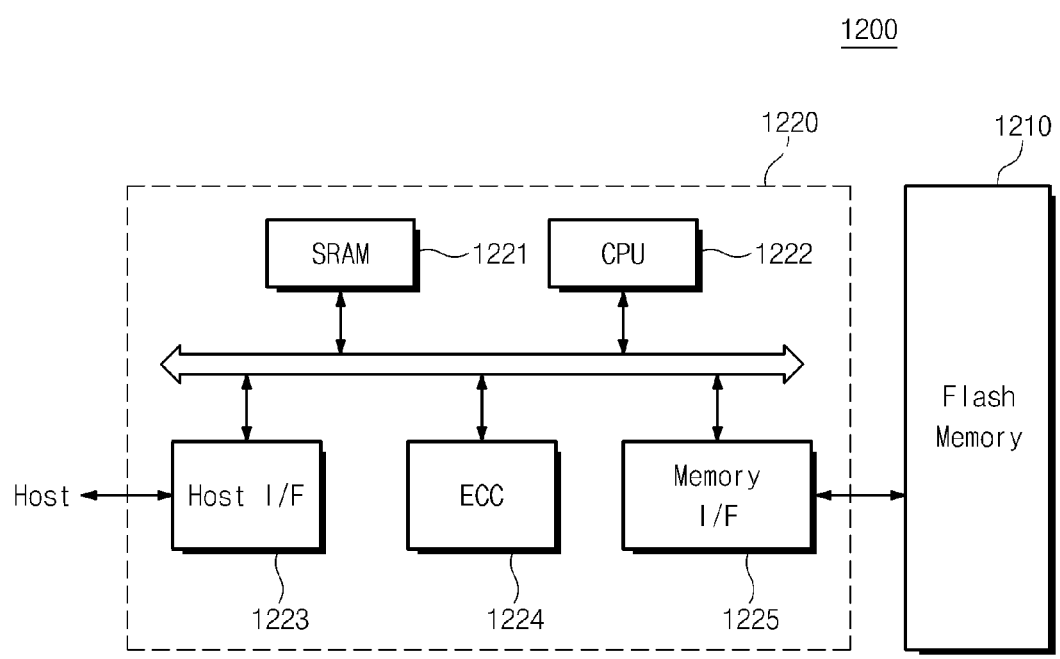
FIG. 43 is a block diagram of a memory card that includes a semiconductor device in accordance with the embodiments of the present invention.

FIG. 43 is a block diagram of a memory card that includes a semiconductor device in accordance with the embodiments of the present invention. The memory card 1200 includes a memory controller 1220 that generates command and address signals C/A and a memory module 1210 for example, flash memory 1210 that includes one or a plurality of flash memory devices. The memory controller 1220 includes a host interface 1223 that transmits and receives command and address signals to and from a host, a controller 1224, and a memory interface 1225 that in turn transmits and receives the command and address signals to and from the memory module 1210. The host interface 1223, the controller 1224 and memory interface 1225 communicate with controller memory 1221 and processor 1222 via a common bus.

The memory module 1210 receives the command and address signals C/A from the memory controller 1220, and, in response, stores and retrieves data DATA I/O to and from at least one of the memory devices on the memory module 1210. Each memory device includes a plurality of addressable memory cells and a decoder that receives the receives the command and address signals, and that generates a row signal and a column signal for accessing at least one of the addressable memory cells during programming and read operations.

Each of the components of the memory card 1200, including the memory controller 1220, electronics 1221, 1222, 1223, 1224, and 1225 included on the memory controller 1220 and the memory module 1210 can employ vertically oriented memory devices of the type disclosed herein.

Figure 44:
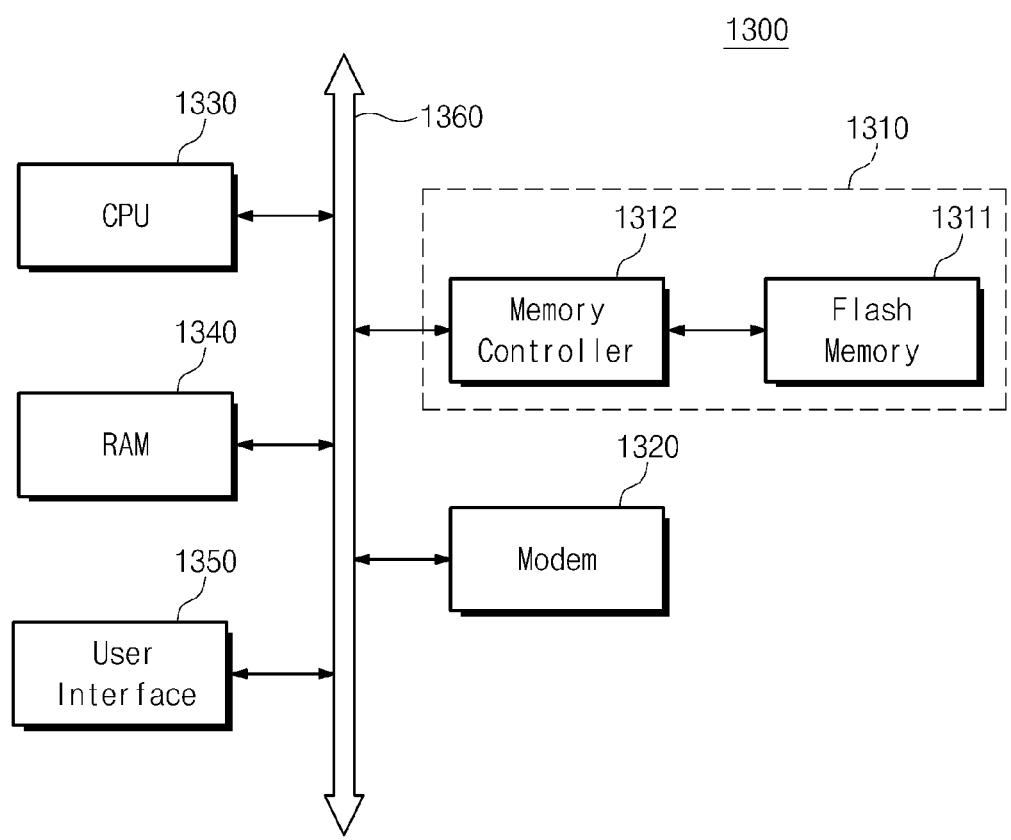
FIG. 44 is a block diagram of a memory system that employs a memory module, for example, of the type described herein, in accordance with the embodiments of the present invention.

FIG. 44 is a block diagram of a memory system 1300 that employs a memory module 1310, for example, of the type described herein. The memory system 1300 includes a processor 1330, random access memory 1340, user interface 1350 and modem 1320 that communicate via a common bus 1360. The devices on the bus 1360 transmit signals to and receive signals from the memory card 1310 via the bus 1360. Each of the components of the memory system 1300, including the processor 1330, random access memory 1340, user interface 1350 and modem 1320 along with the memory card 1310 can employ vertically oriented memory devices of the type disclosed herein. The memory system 1300 can find application in any of a number of electronic applications, for example, those found in consumer electronic devices such as solid state disks (SSD), camera image sensors (CIS) and computer application chip sets.

The memory systems and devices disclosed herein can be packaged in any of a number of device package types, including, but not limited to, ball grid arrays (BGA), chip scale packages (CSP), plastic leaded chip carrier (PLCC) plastic dual in-line package (PDIP), multi-chip package (MCP), wafer-level fabricated package (WFP), and wafer-level processed stock package (WSP).

Although the above examples illustrate only four memory cell transistors MC in each vertical channel for purposes of clear illustration of the embodiments of the present invention, embodiments of the present invention are not thus limited, and can include as few as one memory cell transistor in each vertical channel, and as many memory cell transistors in vertical channel as desired for the application, for example, two, four, eight, sixteen, or thirty-two memory cell transistors in each vertical channel.

While embodiments of the invention have been particularly shown and described with references to preferred embodiments thereof, it will be understood by those skilled in the art that various changes in form and details may be made herein without departing from the spirit and scope of the invention as defined by the appended claims.

What is claimed is:

1. A method of fabricating a semiconductor device comprising:
   providing a substrate of semiconductor material extending in a horizontal direction;
   providing a plurality of interlayer dielectric layers on the substrate;
   providing a plurality of gate patterns, each gate pattern between a neighboring lower interlayer dielectric layer and a neighboring upper interlayer dielectric layer;
   providing a vertical channel of semiconductor material extending in a vertical direction through the plurality of interlayer dielectric layers and the plurality of gate patterns; and
   providing a gate insulating layer between the plurality of gate patterns and the vertical channel,
   wherein the vertical channel is in contact with the substrate at a contact region that comprises a semiconducting region.

2. The method of claim 1 wherein the contact region comprises an upper surface of the substrate and a lower portion of the vertical channel, and wherein the upper surface of the substrate and at least sidewalls of the lower portion of the vertical channel comprise a semiconducting region.

3. The method of claim 1 wherein the contact region is conductive upon the application of a voltage that creates an inversion region in the contact region.

4. The method of claim 1 wherein the semiconductor device comprises a semiconductor memory device and wherein:
   an upper-most gate pattern of the plurality of gate patterns comprises an upper select gate of an upper select transistor;
   a lower-most gate pattern of the plurality of gate patterns comprises a lower select gate of a lower select transistor;
   remaining gate patterns of the plurality of gate patterns between the upper select gate and the lower select gate comprise control gates of memory cell transistors of a common string of the semiconductor device;
   and further comprising:
     providing a lower-most interlayer dielectric layer of the plurality of interlayer dielectric layers between the lower select gate and the substrate, the lower-most interlayer dielectric layer being of a first thickness and wherein the interlayer dielectric layers between the control gates are of a second thickness,
     wherein the first thickness is less than the second thickness; and
   wherein the first thickness is selected so that a voltage applied to the lower select gate creates an inversion layer in the contact region that causes the contact region to conduct.

5. The method of claim 1 wherein the gate insulating layer includes a charge storage layer and wherein the semiconductor device comprises a non-volatile memory device.

6. The method of claim 1, wherein the substrate and the vertical channel are
   formed of a semiconductor material having a same dopant type.

7. The method of claim 1 further comprising providing a source region in the
   substrate to be spaced apart from the vertical channel.

8. The method of claim 7, wherein the source region is formed of a material
   that has a different dopant type from that of the substrate, and the vertical channel is formed of semiconductor material having a same dopant type as the substrate.

9. The method of claim 1 further comprising providing a source contact plug penetrating the plurality of gate patterns to contact the top surface of the substrate, wherein the source contact plug is spaced apart from the vertical channel and is insulated from the plurality of gate patterns.

10. The method of claim 9, wherein the source contact plug is formed of a material that has a different dopant type from that of the substrate.

11. A method of fabricating a semiconductor device comprising:
    providing a substrate having a first dopant type;
    vertically stacking a plurality of gate patterns on the substrate;
    forming a vertical channel penetrating the plurality of gate patterns to be connected with the substrate, the vertical channel having the first dopant type;
    forming a data storage layer between the gate patterns and the vertical channel; and
    forming a source region in the substrate to be spaced apart from the vertical channel,
    wherein the source region has a second dopant type different from the first dopant type.

12. The method of claim 11, wherein forming the source region is performed after forming the vertical channel.

13. A method of fabricating a semiconductor device, comprising:
    providing a semiconductor substrate extending in a horizontal direction;
    providing a plurality of gate patterns and a plurality of insulating patterns alternately and vertically stacked on the substrate;
    providing a first vertical channel of semiconductor material penetrating the gate patterns and the insulating patterns;
    providing a gate insulating layer disposed between the plurality of gate patterns and the first vertical channel; and
    providing a horizontal channel connected to an end of the first vertical channel.

14. The method of claim 13,
    wherein the plurality of gate patterns comprise a lowermost gate pattern nearer to the surface of the semiconductor substrate than the remaining ones of the plurality of gate patterns,
    wherein the method further comprises applying a voltage to the lowermost gate pattern to create an inversion layer at the horizontal channel and at the first vertical channel.

15. The method of claim 13, wherein the first vertical channel comprises a first semiconductor pillar.

16. The method of claim 15, wherein the semiconductor pillar is polycrystalline semiconductor.

17. The method of claim 15, wherein the semiconductor pillar is a single crystal semiconductor.

18. The method of claim 13, wherein further comprising a second vertical channel of semiconductor material penetrating the gate patterns and the insulating patterns, the second vertical channel having an end adjacent the top surface of the semiconductor substrate.

19. The method of claim 18, wherein the second vertical channel penetrates a lower most gate pattern.

20. The method of claim 18, wherein the horizontal channel is formed between the first vertical channel and to the second vertical channel.

21. The method of claim 20, wherein the horizontal channel is located below the top surface of the semiconductor substrate.

22. The method of claim 21, wherein the horizontal channel is formed from the semiconductor substrate.

23. The method of claim 18, wherein the first vertical channel, the second vertical channel and the horizontal channel are formed of a semiconductor material having the same type of dopant.

24. The method of claim 23, wherein the first vertical channel, the second vertical channel and the horizontal channel are doped with a p-type dopant.

25. The method of claim 18, wherein the plurality of gate patterns comprise a lowermost gate pattern nearer to the surface of the semiconductor substrate than the remaining ones of the plurality of gate patterns, and
wherein the lowermost gate pattern is a conductive plate having a plurality of vias formed therethrough.

26. The method of claim 25, wherein the plurality of vias have a corresponding vertical channel formed therethrough to connect to the horizontal channel.

27. The method of claim 26, wherein each of the vertical channels has a resistive contact to the horizontal channel.

28. The method of claim 27, wherein each of the vertical channels comprises a solid semiconductor pillar.

29. The method of claim 27, wherein each of the vertical channels comprises a tubular semiconductor pillar.

30. The method of claim 25 wherein the lowermost gate pattern forms a gate of one or more select transistors and is connected to a lower select line.

31. A method of fabricating a semiconductor device, comprising:
providing a semiconductor substrate extending in a horizontal direction;
providing a horizontal channel formed of semiconductor material extending in the horizontal direction;
providing a plurality of NAND cell strings, each of the plurality of NAND cell strings comprising a semiconductor pillar extending in a vertical direction connected to the horizontal channel;
providing a vertical stack of a plurality of gate patterns and a plurality of insulating patterns alternately stacked on the substrate, each semiconductor pillars extending through the vertical stack of gate patterns and insulating patterns,
wherein a lowermost gate pattern of the plurality of gate patterns is positioned adjacent the horizontal channel to activate the horizontal channel.

32. The method of claim 31, wherein the method further comprises applying a voltage to the lowermost gate pattern to create an inversion layer at the horizontal channel.

33. The method of claim 32, wherein applying a voltage to the lowermost gate pattern acts to create an inversion layer in each of the plurality of semiconductor pillars.

34. The method of claim 33, wherein the semiconductor pillars are polycrystalline semiconductor.

35. The method of claim 33, wherein the semiconductor pillars are each formed of a single crystal semiconductor.

36. The method of claim 33, wherein the semiconductor pillars are solid pillars.

37. The method of claim 33, wherein the semiconductor pillars are tubular.

38. The method of claim 33, wherein the horizontal channel is located below the top surface of the semiconductor substrate.

39. The method of claim 33, wherein the horizontal channel is formed in the semiconductor substrate.

40. The method of claim 33, wherein the semiconductor pillars and the semiconductor material of the horizontal channel have the same type of dopant.

41. The method of claim 33, wherein the semiconductor pillars and the semiconductor material of the horizontal channel are doped with a p-type dopant.

42. The method of claim 33,
wherein the lowermost gate pattern is a conductive plate having a plurality of openings formed therein.

43. The method of claim 42, wherein the plurality of openings have a corresponding semiconductor pillar formed therethrough to connect to the horizontal channel.

44. The method of claim 43, wherein each of the semiconductor pillars has a resistive contact to the horizontal channel.

45. The method of claim 44, wherein each of the semiconductor pillars forms a vertical channel.

46. The method of claim 33, wherein each of the semiconductor pillars has a resistive contact to the horizontal channel.

47. The method of claim 33, wherein the lowermost gate pattern forms a gate of one or more select transistors and is connected to a lower select line.

48. The method of claim 33, wherein the NAND cell strings comprise a series connection of memory cell transistors, each of the memory cell transistors comprising a gate formed of a corresponding one of the plurality of gate patterns.

49. The method of claim 31, wherein each of the NAND strings comprises a first end with a drain region formed at the first end.

50. The method of claim 49, further comprising providing a plurality of bit lines extending in a first horizontal direction over the semiconductor pillars, each of the bit lines connected to a corresponding group of the semiconductor pillars at a corresponding drain region.

51. The method of claim 50, wherein an uppermost gate pattern of the plurality of gate patterns comprises plural upper select lines below the bit lines extending in a second horizontal direction, each of the upper select lines comprising a gate adjacent the one or more drain regions at the corresponding first end.

52. The method of claim 50, further comprising providing a common source located below the bit lines and connected a second end of the NAND strings.

53. The method of claim 52, wherein each first end of the NAND string is at a top of the corresponding NAND string and each second end of the NAND string is at the bottom of the corresponding NAND string.

54. The method of claim 53, wherein the common source is formed in the semiconductor substrate.

55. A method of fabricating a semiconductor device, the method comprising:
providing a semiconductor substrate extending in a horizontal direction;
providing a lowermost gate pattern on the semiconductor substrate;

providing a plurality of gate patterns and a plurality of insulating patterns alternately and vertically stacked on the lowermost gate pattern, the lowermost gate pattern being nearer to the surface of the semiconductor substrate than the plurality of gate patterns;

providing a first vertical channel penetrating the gate patterns and the insulating patterns;

providing a gate insulating layer disposed between the plurality of gate patterns and the first vertical channel; and providing a horizontal channel connected to an end of the first vertical channel.

56. The method of claim 55 further comprising applying a voltage to the lowermost gate pattern to create an inversion layer at the horizontal channel and at the first vertical channel.

57. A method of fabricating a three-dimensional non-volatile memory device, the method comprising:

providing a first select gate on a semiconductor substrate;

providing a second select gate on the semiconductor substrate;

providing a vertical channel extending in a vertical direction on the substrate; and providing a plurality of memory cells between the first select gate and the second select gate, the plurality of memory cells coupled in series by the vertical channel, wherein the first select gate is configured to generate a horizontal channel when receiving a voltage.

58. The method of claim 57, wherein the first select gate is connected to a lower select line.

59. The method of claim 57, wherein the second select gate is connected to an upper select line.

* * * * *